United States Patent
Maruyama et al.

(10) Patent No.: US 6,323,943 B1
(45) Date of Patent: Nov. 27, 2001

(54) VIBRATION MEASUREMENT METHOD AND APPARATUS

(75) Inventors: Tetsuro Maruyama; Akiyoshi Ohno, both of Shizuoka (JP)

(73) Assignee: Suzuki Motor Corporation, Hamamatsu (JP)

( * ) Notice: Subject to any disclaimer, the term of this patent is extended or adjusted under 35 U.S.C. 154(b) by 0 days.

(21) Appl. No.: 09/397,966

(22) Filed: Sep. 17, 1999

(30) Foreign Application Priority Data

Sep. 24, 1998 (JP) ................................. 10-307756
Oct. 30, 1998 (JP) ................................. 10-309624
Oct. 30, 1998 (JP) ................................. 10-311132

(51) Int. Cl.$^7$ ............................................... G01P 3/86
(52) U.S. Cl. ...................... 356/28.5; 73/1.41; 73/655; 73/657; 356/358
(58) Field of Search .................... 73/655, 656, 657, 73/1.41; 356/28.5, 358

(56) References Cited

U.S. PATENT DOCUMENTS 4,633,715 * 1/1987 Monchalin ............................. 73/657
5,680,212 * 10/1997 Blouin et al. ........................... 73/656
5,827,971 * 10/1998 Hale et al. ............................. 73/657

FOREIGN PATENT DOCUMENTS 10-9943   1/1998  (JP) .

\* cited by examiner

*Primary Examiner*—Stephen C. Buczinski
(74) *Attorney, Agent, or Firm*—McGinn & Gibb, PLLC

(57) ABSTRACT

The present invention provides a vibration measurement method and apparatus utilizing a self-mixing type laser Doppler vibrator meter. The vibration measurement method includes steps of: oscillating a laser beam of a predetermined wavelength and applying the laser beam to an object to be measured; mixing the reflected laser beam from the object and the oscillated laser beam for outputting a beat wave; calculating ratio of a beat wave amplitude for the turning point of the vibrating object, with respect to a predetermined reference amplitude; and calculating a displacement amount for the turning point of the vibrating object, according to the calculated ratio. This enables to detect the vibration of the object to be measured, with a high accuracy.

43 Claims, 48 Drawing Sheets

10kHz VIBRATION

FIG. 2(A)
FG VOLTAGE APPLIED 3V

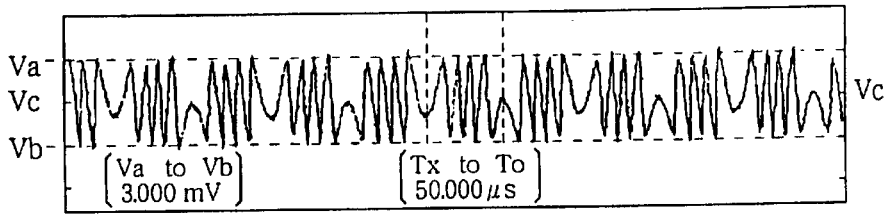
$\begin{bmatrix} V_a \text{ to } V_b \\ 3.000 \text{ mV} \end{bmatrix}$ $\begin{bmatrix} T_x \text{ to } T_o \\ 50.000 \mu s \end{bmatrix}$

FIG. 2(B)
FG VOLTAGE APPLIED 900 mV

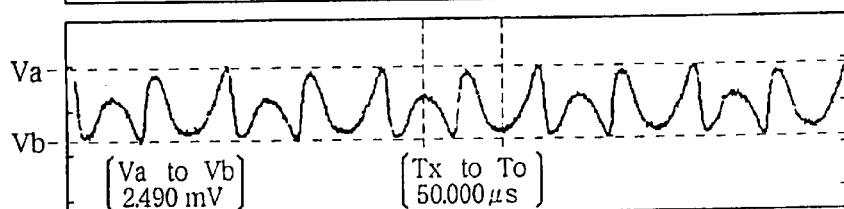
$\begin{bmatrix} V_a \text{ to } V_b \\ 2.490 \text{ mV} \end{bmatrix}$ $\begin{bmatrix} T_x \text{ to } T_o \\ 50.000 \mu s \end{bmatrix}$

FIG. 2(C)
FG VOLTAGE APPLIED 100 mV

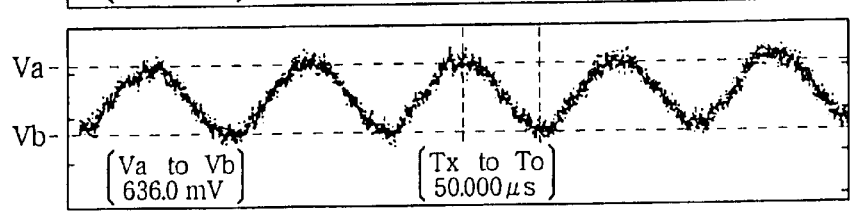
$\begin{bmatrix} V_a \text{ to } V_b \\ 636.0 \text{ mV} \end{bmatrix}$ $\begin{bmatrix} T_x \text{ to } T_o \\ 50.000 \mu s \end{bmatrix}$

FIG. 2(D)
FG VOLTAGE APPLIED 80 mV

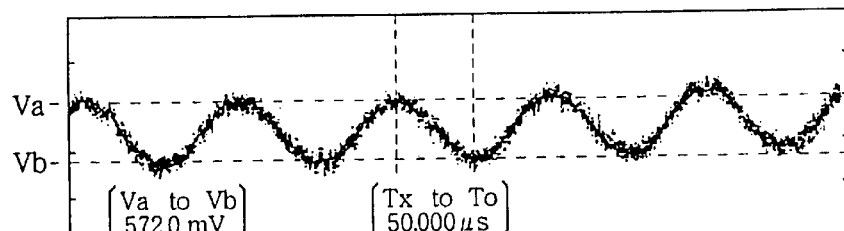
$\begin{bmatrix} V_a \text{ to } V_b \\ 572.0 \text{ mV} \end{bmatrix}$ $\begin{bmatrix} T_x \text{ to } T_o \\ 50.000 \mu s \end{bmatrix}$

FIG. 2(E)
FG VOLTAGE APPLIED 60 mV

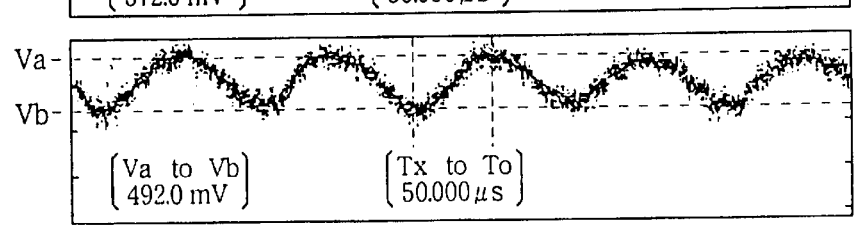
$\begin{bmatrix} V_a \text{ to } V_b \\ 492.0 \text{ mV} \end{bmatrix}$ $\begin{bmatrix} T_x \text{ to } T_o \\ 50.000 \mu s \end{bmatrix}$

FIG. 2(F)
FG VOLTAGE APPLIED 40 mV

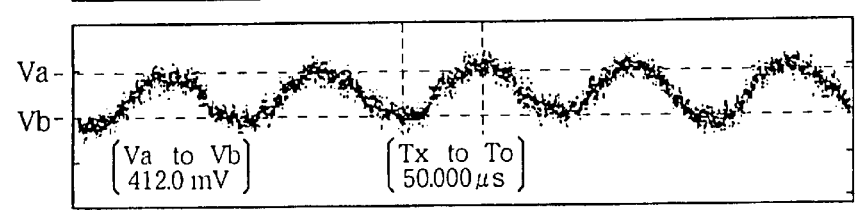
$\begin{bmatrix} V_a \text{ to } V_b \\ 412.0 \text{ mV} \end{bmatrix}$ $\begin{bmatrix} T_x \text{ to } T_o \\ 50.000 \mu s \end{bmatrix}$

FIG. 2(G)
FG VOLTAGE APPLIED 20 mV

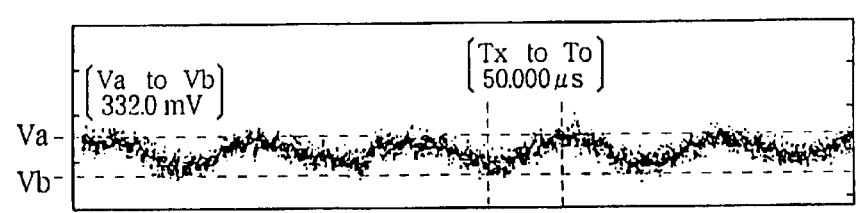
$\begin{bmatrix} V_a \text{ to } V_b \\ 332.0 \text{ mV} \end{bmatrix}$ $\begin{bmatrix} T_x \text{ to } T_o \\ 50.000 \mu s \end{bmatrix}$

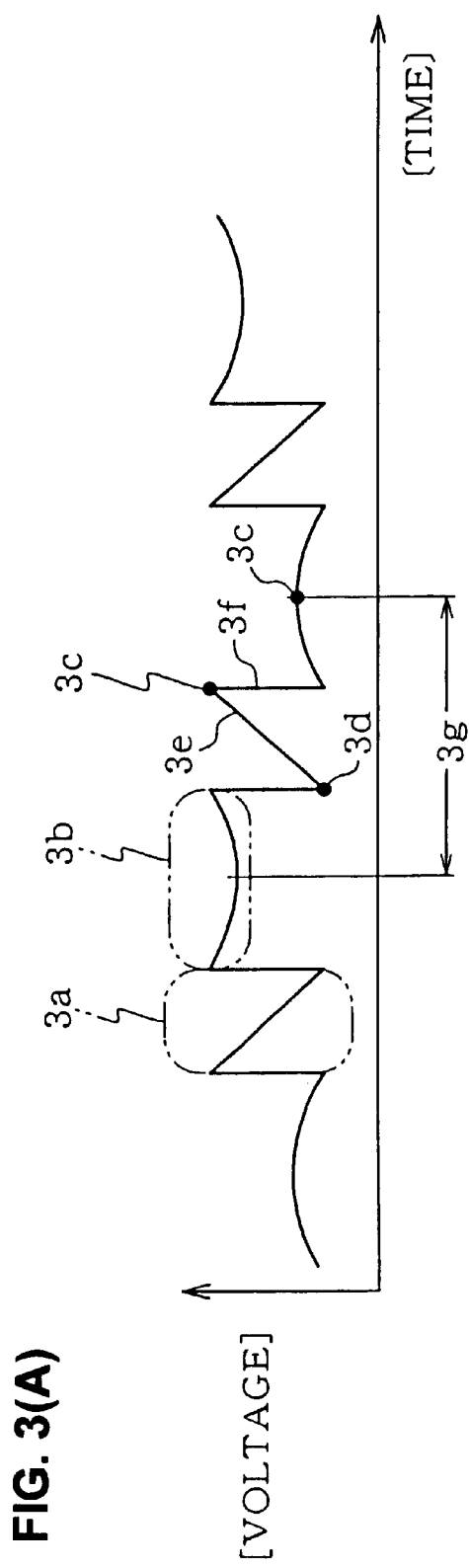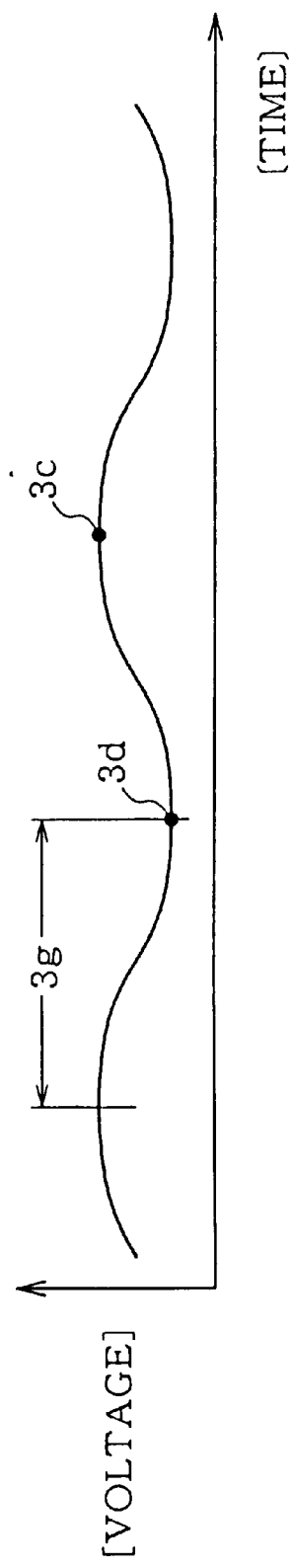
FIG. 3(A) FIRST M-SHAPED STATE
FIG. 3(B) S-SHAPED STATE

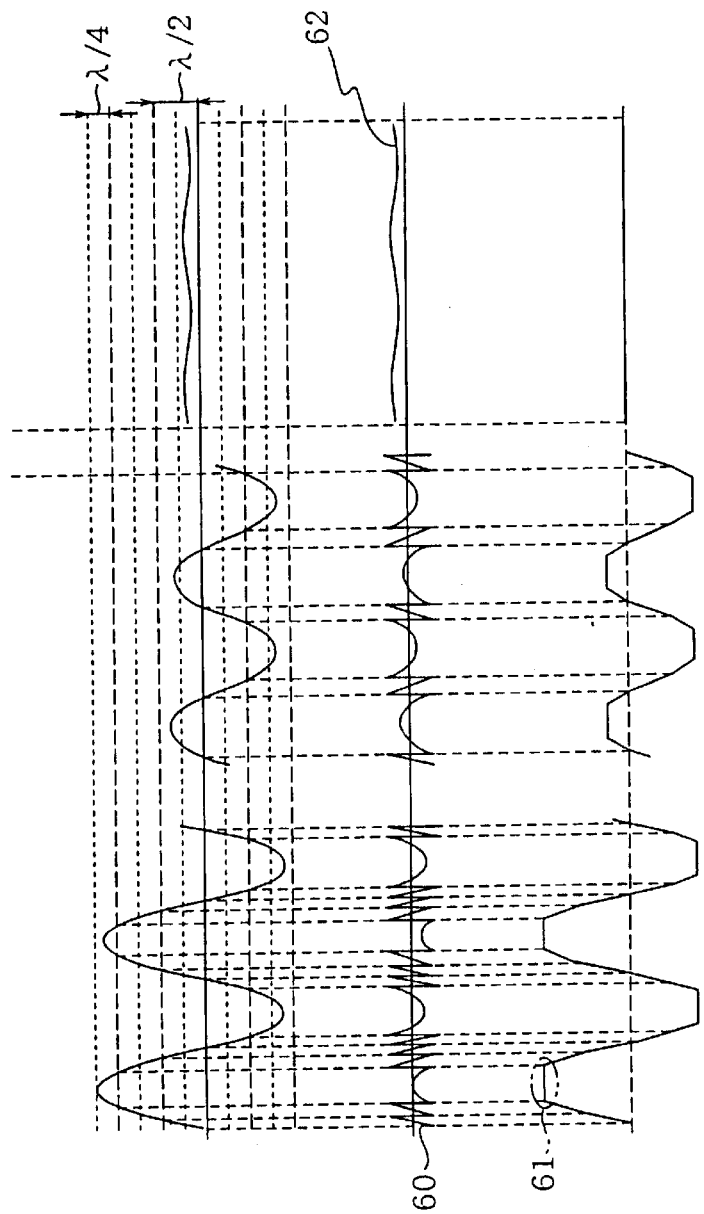
FIG. 7(A) VIBRATION DISPLACEMENT
FIG. 7(B) BEAT WAVE
FIG. 7(C) CALCULATED WAVEFORM

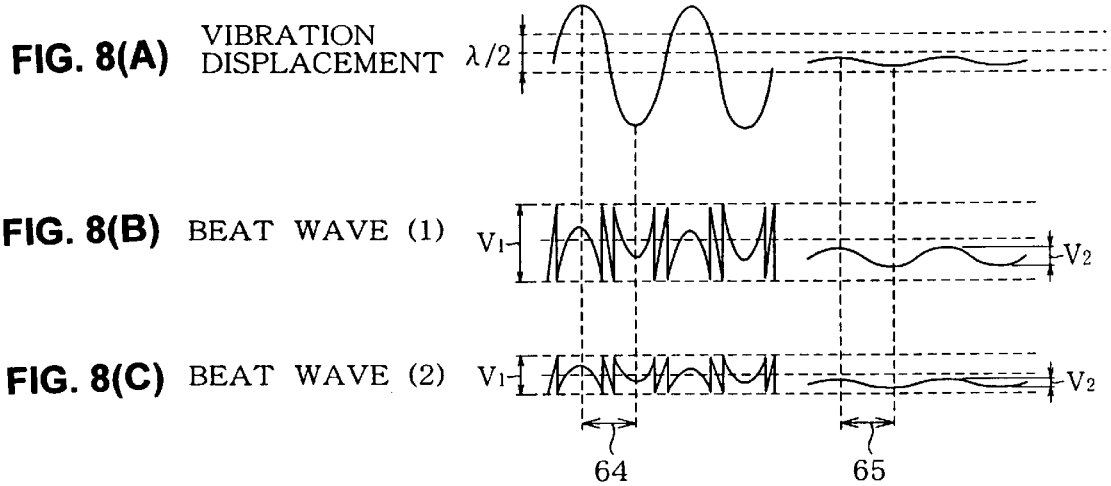
FIG. 8(A) VIBRATION DISPLACEMENT
FIG. 8(B) BEAT WAVE (1)
FIG. 8(C) BEAT WAVE (2)
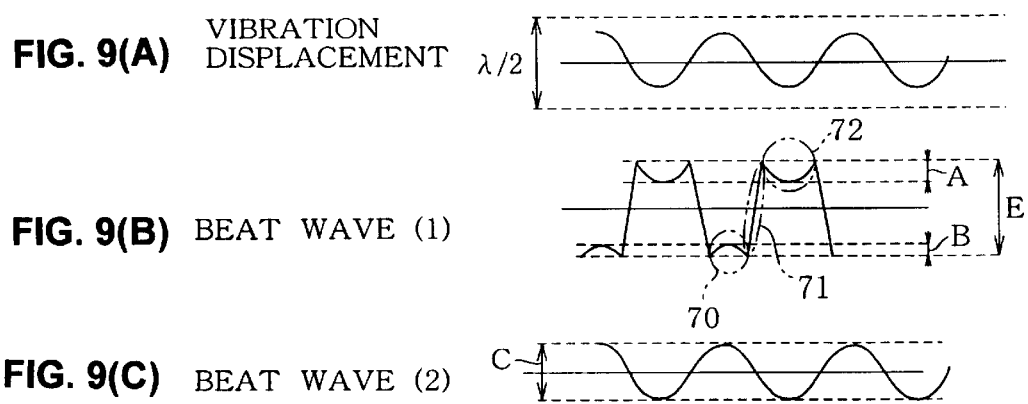
FIG. 9(A) VIBRATION DISPLACEMENT
FIG. 9(B) BEAT WAVE (1)
FIG. 9(C) BEAT WAVE (2)

FIG. 13(A) VIBRATION DISPLACEMENT

FIG. 13(B) BEAT WAVE

FIG. 13(C) CALCULATED WAVEFORM (TYPE 1 BEAT WAVE)

(FREQUENCY SPECTRUM OF TYPE 1)

(TYPE 2 BEAT WAVE)

(FREQUENCY SPECTRUM OF TYPE 2)

(TYPE 3 BEAT WAVE)

(FREQUENCY SPECTRUM OF TYPE 3)

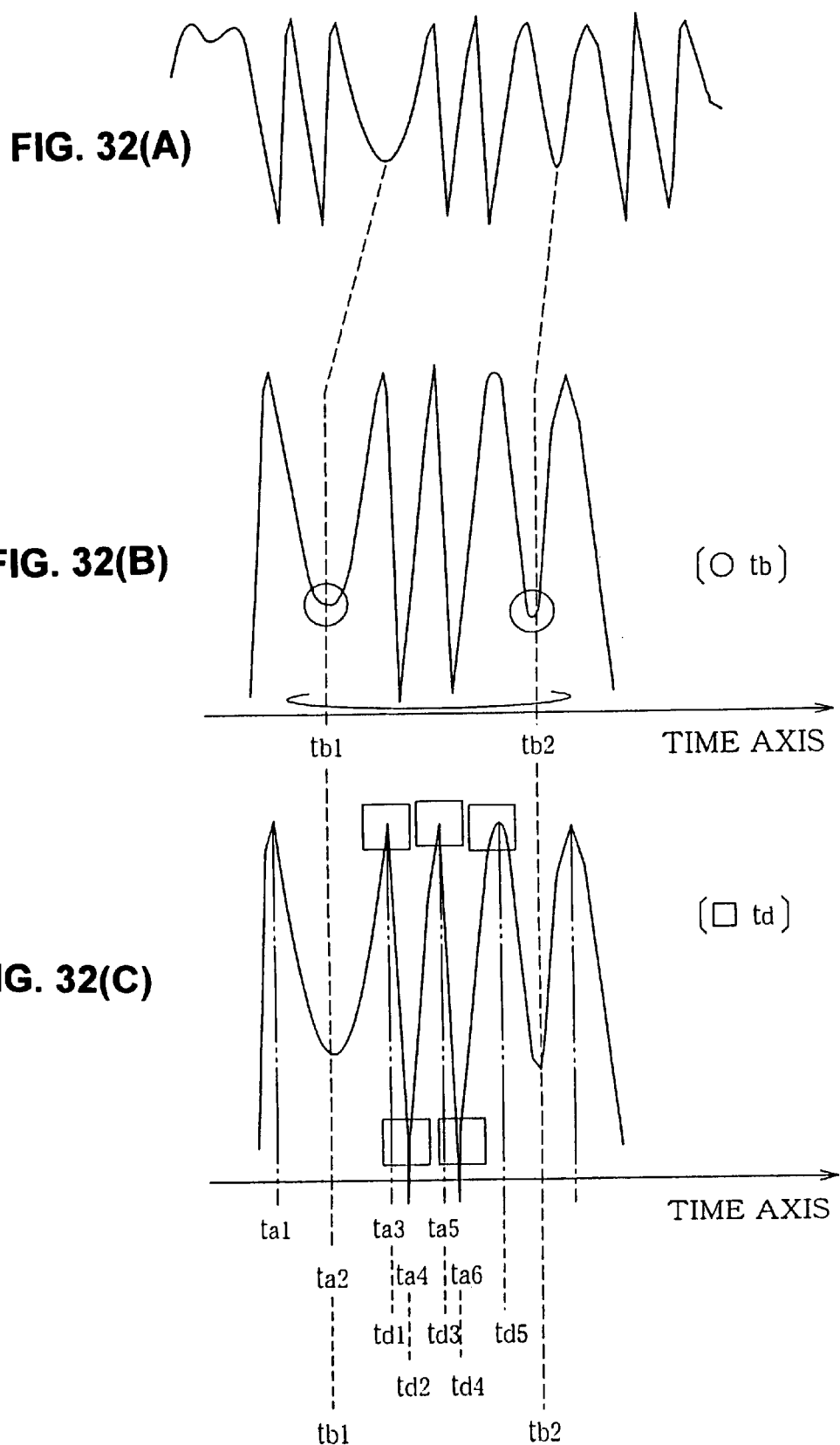

| BEAT WAVEFORM BEFORE AND AFTER ta | INCLINATION | ATTRIBUTE OF ta, scs VALUE |
|---|---|---|
| pv(ta7), dre(ta7), dfr(ta7) | INCLINATIONS NOT IDENTICAL | scs(ta7)=0 |
| dre(ta8), dfr(ta8) | INCLINATIONS IDENTICAL | scs(ta8)=1 |
| dre(ta9), dfr(ta9) | INCLINATIONS NOT IDENTICAL | scs(ta9)=0 |

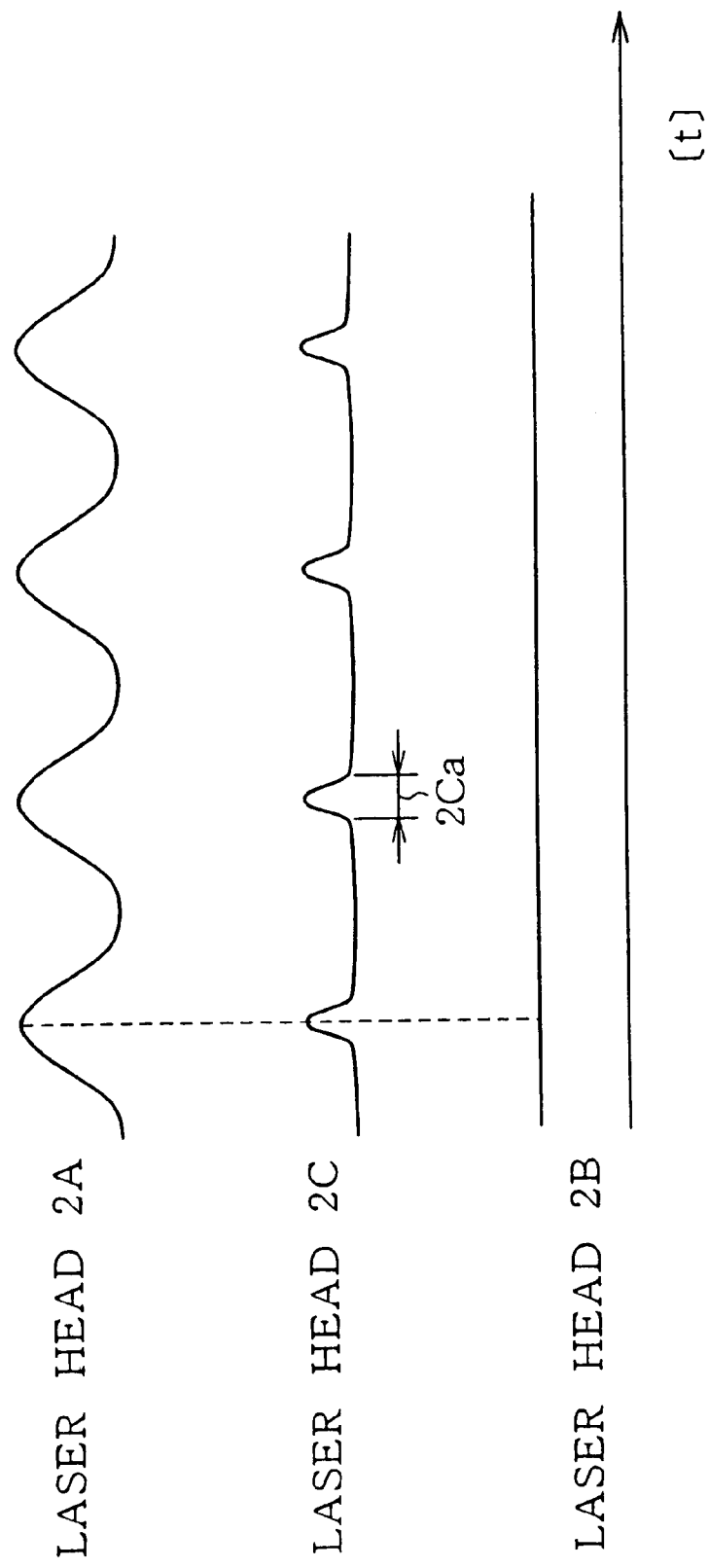

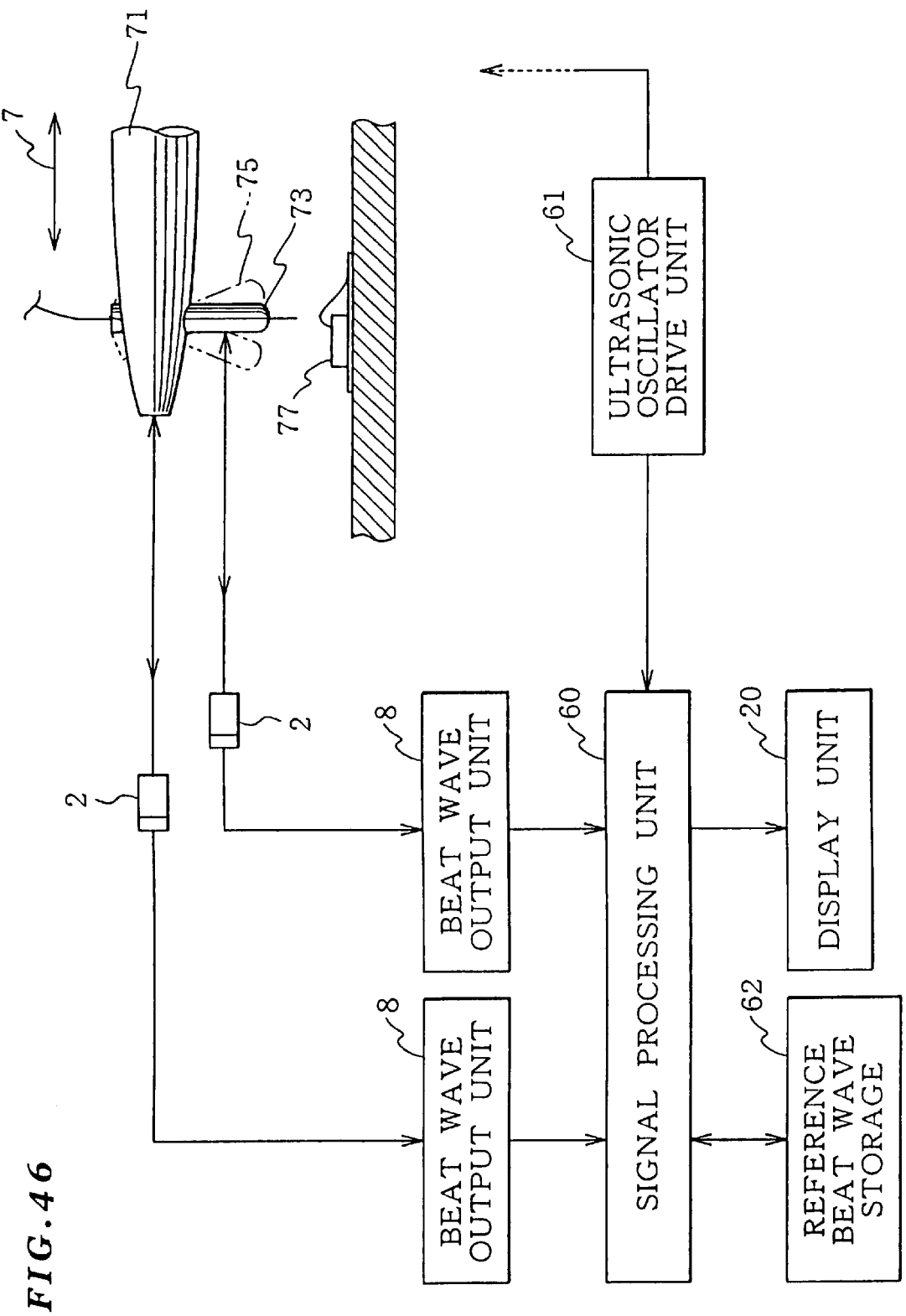

VIBRATION MEASUREMENT METHOD AND APPARATUS

BACKGROUND OF THE INVENTION

1. Field of the Invention

The present invention relates to a vibration measurement method and apparatus and in particular, to a method and an apparatus for identifying a vibration state of an object to be measured, i.e., a vibrating object by using the Doppler effect of laser light (beam).

The present invention can be applied to experiments for automobile production. More specifically, the present invention can be applied engine vibration analysis, body vibration transfer analysis, noise in the body, muffler vibration analysis, and the like. Since the vibration measurement apparatus according to the present invention is non-contact type capable of accurately measuring a small region, the apparatus can be preferably applied for detecting a tool breakage such as a drill. As will be detailed later, the present invention can be applied to a junction failure in a production technology. Furthermore, the present invention can be applied to a plant vibration using a motor, and maintenance of a water pipe and gas pipe for detecting leakage. Moreover, the present invention can be applied even to agriculture. A large fruit such as a watermelon can be knocked, so that resultant sound is detected to determine sweetness of the watermelon without cutting the watermelon. Hereinafter, "the object to be measured" includes an object, from an engine to watermelon, whose vibration is detected by the present invention.

2. Description of the Related Art

Conventionally, for analyzing a vibration state of an object to be measured, an acceleration pickup is attached to the object, which is knocked to vibrate, so as to analyze the acceleration pickup. However, in this case the acceleration pickup is in contact with the object to be measured. Accordingly, it is impossible to measure vibration if the object to be measured is very small or at a high temperature. Moreover, the contact type measurement with a pickup affects the vibration measurement.

As a non-contact type vibration measurement method, there is an apparatus for measuring vibration using a laser with the Doppler effect. For example, Japanese Patent Publication (unexamined) 10-9943 filed by the same applicant as the present invention discloses a vibration measurement method applying a laser light and the reflected light and oscillating light are mixed so as to detect Doppler frequency contained in the reflected light, thus enabling to measure the vibration frequency. This will be referred to as a self-mixing method.

Excluding the self-mixing type, the conventional vibration measurement apparatus mix the oscillating light with the reflected light externally using an expensive and accurate optical element. Accordingly, a space is required for allocating the element. This results in an expensive and heavy apparatus. In contrast to this, the self-mixing type, oscillation light is mixed with the reflected light using a laser resonator (laser diode). Thus, the self-mixing type enables to measure a vibration frequency at a low cost, with a small-size and small-weight apparatus without requiring the expensive optical system used in the non self-mixing type.

As a method for detecting a vibration information from a resultant beat wave generated in the self-mixing type, there are some methods: a method to obtain a vibration information from counting the beat waves and converting it into a vibration displacement; a method for differentiating a beat wave to obtain a vibration speed information and identifying a turning point of the vibrating plane to obtain the direction of the vibration displacement; and others. These methods count beat waves during the vibration plane advance direction is changed (turned).

However, the aforementioned methods require a beat wave extraction and a complicated calculation procedure. Furthermore, in the method counting the beat waves, the object displacement is determined by $\lambda/2$ of the laser light and cannot detect the vibration state changing by less than $\lambda/2$.

Moreover, the conventional method requires a number of calculation processes to identify the vibration state and it is difficult to assure response speed for real time measurement.

Next, explanation will be given on applications of the conventional example. A wire bonding apparatus for connecting a silicon chip and a lead frame using weight, heat, and supersonic vibration of about 60 kHz. The bonding apparatus repeated moves so that wire bonding is performed on a number of chips on a fixed table.

Conventionally, the bonding quality test has been performed by indirect inspection for electric conductivity and pulling test as well as the ultrasonic wave oscillator impedance change, and a fine change of pressurizing state. For example, there is a method using a non-contact type laser oscillation meter such as argon and helium-neon for use apart from the bonding apparatus.

However, in a conventional example for checking the wire bonding, there is a case when checking by current application may be impossible because of the IC internal circuit configuration. Moreover, the pulling test may break the bonding and is performed as a sampling inspection after bonding is complete. Accordingly, it is impossible to immediately stop the wire bonding apparatus when a junction failure is detected.

In a case of the impedance change, vibration state change of a tip (horn) of a resonator is detected at the root of the horn and accordingly, it is impossible to accurately detect the vibration state change due to the junction state change. Moreover, in pickup of pressurizing state, a piezoelectric element set on the fixed table of the silicon chips cannot accurately detect the vibration state of the horn. In a case of non-contact type laser vibration meter using argon or helium-neon, it is difficult to fix the laser head because of its large size and weight and cannot follow the bonding apparatus during operation.

Thus, in the conventional junction inspection systems for the wire bonding apparatus cannot move together with the wire bonding apparatus, i.e., cannot inspect at real time.

SUMMARY OF THE INVENTION

It is therefore an object of the present invention to provide a self-mixing type laser vibration meter capable of detecting a vibration state of an object to be measured, with a high accuracy.

Another object of the present invention is to detect with a high accuracy even a small vibration displacement equal to or smaller than ½ of the laser oscillated wavelength $\lambda$.

Still another object of the present invention is to identify a vibration state of the object to be measured, with a simplified processing.

Yet another object of the present invention is to detect with a high speed the vibration state of the object to be measured, which displaces within $2/\lambda$.

Still yet another object of the present invention to accurately identify various defects of the object to be measured.

Yet another object of the present invention is to move together with a wire bonding apparatus and detect at a real time whether wire bonding (junction) has been actually performed correctly.

The inventors of the present invention performed an experiment and observed a waveform when a displacement of the object to be measured is less than $\lambda/2$. It was found that the waveform contains chopping waves. When the vibration amplitude of the object to be measured is greater than $\lambda/2$, in the self-mixing type, it can be considered that generation of a single beat wave corresponds to a displacement of $\lambda/2$. When the vibration amplitude of the object to be measured is smaller than $\lambda/2$, the optical path changing according to the displacement of the vibration plane is less than $\lambda$, and accordingly, the phase relationship between the oscillated beam and reflected beam will not differ more than 360 degrees. As a result, the beat wave obtained as the mixture of the oscillated beam and the reflected beam does not contain a chopping wave for one cycle, and results in a waveform partially cut off.

When the vibration plane changes its direction, the phase of the reflected beam advancing to the oscillated beam is delayed or advance in the opposite direction. Around the moment of the advance direction change, the waveform becomes symmetric and appears as M-shaped (or W-shaped). This waveform will be referred to as M-shaped state waveform.

If the vibration amplitude is further decreased, the laser optical path length change is reduced, and the phase difference is also reduced. Accordingly, the beat wave contains less chopping waves. If the chopping wave component is further decreased at the smaller inclination of the chopping wave, around the moment when the vibrating plane has changed its direction, a symmetric waveform is formed such as a sinusoidal wave. The waveform in such a state will be referred to as an S-shaped state waveform.

In the S-shaped state beat wave, its cycle represents the vibration cycle. Moreover, the amplitude of the beat wave depends on the reflected light quantity and the time duration ratio of the chopping waves. If the reflected light is constant, the wave height is decreased as the time duration having chopping waves becomes smaller. The time duration of the chopping waves is defined by the optical path length which has changed by the movement of the vibrating plane. The S-shaped waveform amplitude is proportional to the vibration amplitude of the object to be measured.

In this specification, a "first M-shaped state" means, the beat waveform shown in FIG. 2A, for example. When the beat wave is in the first M-shaped state, the displacement amount of the object to be measured exceeds $\lambda/2$. A "second M-shaped state" means, for example, a beat wave shown in FIG. 2B. Moreover, the "S-shaped state" means the beat wave shown in FIG. 2C, for example. When the beat wave is in the second M-shaped state or in the S-shaped state, the vibration displacement is less than $\lambda/2$. The chopping wave means the second M-shaped state itself or the portion excluding the turning points. Here, the maximum value and the minimum value of a waveform will be referred to as extremes or extreme values. That is, the extreme are peak and bottom of a wave.

In this specification, the beat wave amplitude means a physical quantity from the upper extreme to the lower extreme of the beat wave and the physical quantity from peak to peak, i.e., from an extreme generated at the turning point to the adjacent extreme. Accordingly, the wave height in a sinusoidal wave may be referred to as an amplitude.

The present invention is a vibration displacement calculation method utilizing the laser beam Doppler effect. This method includes steps of: oscillation of a laser beam and applying the laser beam to the object to be measured;

mixing a reflected laser beam with an oscillated laser to output a beat wave; calculating a ratio of a predetermined reference amplitude with respect to the output beat wave of a turning point of the object to be measured; and calculating the displacement for the turning point of the object to be measured, according to the calculated ratio and a wavelength of the laser beam.

In the present invention, a displacement amount for the turning point is calculated according to the beat wave amplitude and a predetermined reference amplitude. This enables to calculate a displacement amount for the turning point in the M-shaped state as well as the beat wave in the S-shaped without any chopping waves.

Moreover, it is possible to perform a frequency analysis which can be applied to each of the first and the second M-shaped states and the S-shaped state. By performing the frequency analysis, it is possible to obtain a basic frequency of the vibration. Moreover, in analyzing a chopping wave, the chopping wave frequency can be converted into a voltage change, so as to obtain a speed change waveform.

Furthermore, in the present invention, the beat wave state (first or second M-shaped state or S-shaped state) is identified according to an extreme and inclination before and after the extreme. Thus, a displacement amount is calculated according to each of the states.

Moreover, as an application of the aforementioned vibration measurement method, the present invention performs inspection of the object to be measured. For example, a normal vibration state of a machining apparatus is stored as a beat wave itself or basic frequency or vibration displacement amount, which are compared to values during operation, so as to decide whether the vibration is normal.

In such an inspection, a multi-point simultaneous measurement is performed. As the measurement points, it is possible to select the following points to obtain a beat wave: one or more than one measurement points on a vibrating plane where the normal vector is matched with the vibration direction (displacement direction); a measurement point on a curved plane; reflection changing measurement point where the reflected beam is intermittently absent due to the vibration change; a moving measurement point in which a position of the laser beam intersecting a surface of the object to be measured is changed according to the vibration; a measurement point not vibrating in a normal state.

When a laser beam having a wavelength of $\lambda$ is applied, a chopping wave is generated in the beat wave if the object to be measured is displaced by $\lambda/2$. Moreover, if the vibration displacement is below $\lambda/2$ or below $\lambda/4$, a displacement changing waveform of the object to be measured is obtained.

On the other hand, if there is a difference between the laser beam oscillated and the returning laser beam, it is possible to obtain a beat wave where the beat frequency caused by the wavelength difference is overlain by the Doppler frequency component caused by the moving speed of the object to be measured. Thus, according to the various beat waves, it is possible to obtain a chopping wave, displacement changing waveform, and a speed changing waveform. By analyzing a waveform representing these oscillation states, it is possible to decide whether the vibration is normal.

Moreover, the aforementioned inspection method can be applied as a junction inspection system of a wire bonding apparatus. This junction inspection system inspects wire bonding of a wire bonding apparatus including: an ultrasonic oscillator for oscillating an ultrasonic vibration; a horn for transmitting the ultrasonic oscillation oscillated by the ultrasonic oscillator, to an object to be connected; and a capillary provided at the tip end of the horn, for applying a weight to the wire in contact with the object to be connected.

This wire bonding (junction) inspection includes: a laser resonator following the movement of the capillary or horn as an object to be measured, to apply a laser beam to the object to be measured and receive a reflected beam; a photo detector for receiving a laser beam self-mixed in the laser resonator; a beat wave output unit for detecting a beat wave from the signal output from the photo-detector; and a signal processing unit for deciding whether the vibration of the object to be measured is normal, according to the beat wave output from the beat wave output unit.

The junction inspection system according to the present invention, the laser resonator constitutes a part of the wire bonding apparatus and follows the movement of the horn and capillary during bonding and applies a laser beam to a measurement point. The return beam is self-mixed with the laser beam oscillated, thus generating a beat wave. The beat wave output unit amplifies the beat wave and removes noise from the beat wave before outputting the beat wave. According to this beat wave, the signal processing unit decides whether the vibration of the object to be measured is normal. For example, a beat wave obtained while the wire bonding is performed normally is used as a reference for comparing the amplitude and frequency with a current beat wave, so as to detect an abnormal vibration when the wire bonding is not performed correctly. Thus, when the signal processing unit has detected a vibration defect, it is decided that the wire bonding is defective.

BRIEF DESCRIPTION OF THE DRAWINGS

FIG. 2A to FIG. 2G show waveforms of beat waves obtained when a vibration frequency was set to 10 [kHz] and the drive voltage was changed from 3 V to 20 mV.

FIG. 3A shows a first M-shaped waveform and FIG. 3B shows an S-shaped waveform.

FIG. 7 waveform examples for calculating a displacement amount of an object to be measured. FIG. 7A shows a vibration displacement; FIG. 7B shows a beat waveform; and FIG. 7C shows a saw-tooth type waveform for counting.

FIG. 8 shows a beat waveform when displacement exceeds $\lambda/2$: FIG. 8A shows a vibration displacement; FIG. 8B shows a first state of beat waveform; and FIG. 8C shows a second state of the beat waveform.

FIG. 9 shows a beat waveform when displacement is within $\lambda/2$: FIG. 9A shows a vibration displacement; FIG. 9B shows a first state of beat waveform; and FIG. 9C shows a second state of the beat waveform.

FIG. 13A shows a vibration displacement; FIG. 13B shows a beat waveform; and FIG. 13C a waveform calculated by the saw-tooth wave count and amplitude ratio.

FIG. 19 shows a beat waveform of type 1 and an example of its frequency spectrum.

FIG. 20 shows a beat waveform of type 2 and an example of its frequency spectrum.

FIG. 21 shows a beat waveform of type 3 and an example of its frequency spectrum.

FIG. 32 shows application of the processing of FIG. 30 to the first M-shaped waveform (saw-tooth waveform): FIG. 32A shows an example of beat waveform; FIG. 32B shows a cyclic interval extracted; and 32C shows the number of peaks in the cyclic interval.

FIG. 36 shows a waveform of the first M-shaped wave (chopping wave) which has been subjected to the processing of FIG. 35.

FIG. 37 shows a second M-shaped wave (displacement less than $\lambda/2$) which has been subjected the processing shown in FIG. 35.

FIG. 38 shows an S-shaped wave (displacement less than $\lambda/2$) which has been subjected the processing shown in FIG. 35.

FIG. 39 is a table showing examples of attributes of the respective peaks ta assigned in the processing of FIG. 35.

FIG. 43 shows examples of a measurement point with curvature, a measurement point where the reflected light changes, and a measurement point where a laser beam is applied at a predetermined angle.

FIG. 44 shows a laser beam applied to a point where the beam is reflected at different angles.

FIG. 45 shows examples of beat waveforms output from the laser resonators shown in FIG. 43.

FIG. 46 is a block diagram showing a configuration of a junction inspection system for a wire bonding apparatus according to the present invention.

FIG. 50 shows an example of an oscillator drive current and a beat wave.

DESCRIPTION OF THE PREFERRED EMBODIMENTS

Figure 1:
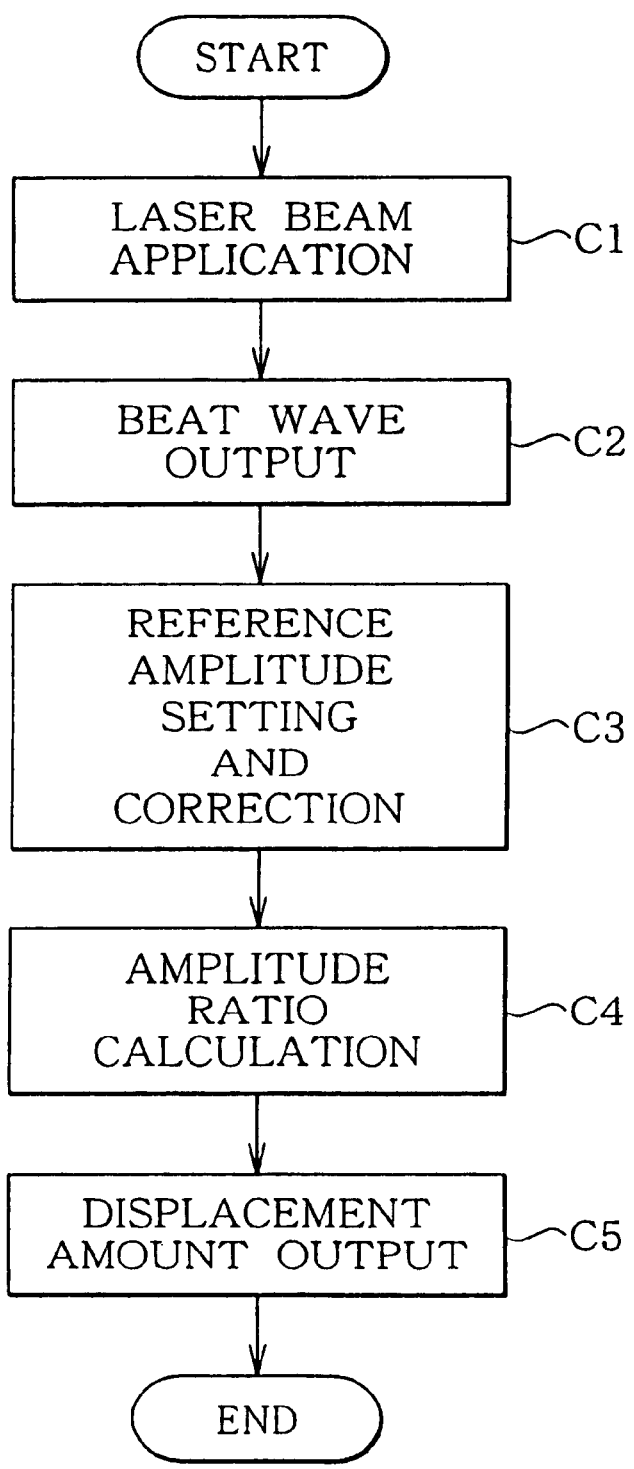
FIG. 1 is a flowchart showing a configuration of a vibration measurement method according to a first embodiment of the present invention.

Description will now be directed to preferred embodiments of the present invention with reference to FIG. 1 to FIG. 52.

Several embodiments will be disclosed according to the characteristics of the beat waves shown in FIG. 2. Each of the embodiments has a common object to measure an object vibration with a high accuracy. Moreover, specific characteristics to particular embodiments will also be described in corresponding paragraphs.

<Embodiment 1>

Explanation will be given on the first embodiment with reference to FIG. 1 to FIG. 13. In this first embodiment, a self-mixing type laser Doppler vibration meter is used to measure a movement smaller than the laser light wavelength. This measurement includes not only a displacement of the object greater than the half of the wavelength but also a displacement smaller than the half of the wavelength. In this embodiment, the displacement detection accuracy does not depend on the laser light wavelength.

FIG. 1 is a flowchart showing a vibration displacement calculation method according to the first embodiment. FIG. 2A to FIG. 2G shows results of fine vibration measured by an experiment system which will be detailed later. A beat wave was observed in each of the experiments.

Referring to FIG. 1, the vibration displacement calculation method includes: a laser light radiation step (step C1) for oscillating a laser light of a predetermined wavelength $\lambda$ and applying the laser light to an object to be measured; a beat wave output step (step C2) for mixing the laser beam reflected by the object to be measured, with a oscillated laser light, so as to output a beat wave; a ratio calculation step (step C4) for calculating the ratio of the beat wave amplitude at a turning point of the object (Va–Vc or Vc–Vb in FIG. 2A) against a predetermined reference amplitude (Va–Vb in FIG. 2A); and a displacement amount calculation step (step C5) for calculating a displacement amount for the turning point of the object.

The beat wave peak corresponding to the turning point has an identical absolute value of inclination. That is, the waveform is symmetric with respect to the peak. In the vibration causing the beat wave shown FIG. 2A, the object to be measured displaces with an amount greater than the half of the wavelength of the laser light. At the peak Vc, the speed of the object to be measured has the smallest speed, when the object turns its direction. In this FIG. 2A, the first Vc is followed by three chopping waves. Each of the chopping waves is generated when the object to be measured has displaced by $\lambda/2$. Accordingly, three chopping waves correspond to displacement of the laser light wavelength multiplied by 1.5. After this comes a vibration turning point. This results in a beat waveform having inclinations symmetric between right and left. In the example of FIG. 2A, the reference amplitude is the amplitude of the chopping wave. According to this reference amplitude, a displacement for the beat wave amplitude at the turning point is calculated.

Here, for each waveform, the maximum value and the minimum value will be referred to as extremes and a line connecting two adjacent extremes will be referred to as an inter-extreme line. A chopping wave has two inter-extreme lines. In the example of FIG. 2A, the chopping wave has an amplitude of Va–Vb. Hereinafter, the amplitude of an inter-extreme line also means the value of Va–Vb like in FIG. 2B and FIG. 2C. In a case of a sinusoidal wave, wave height will also be called amplitude.

FIG. 1 shows an example where a reference amplitude is set and a correction step C3 is added. The setting and correction of the reference amplitude is based on the amplitude of the inter-extreme line. When the object to be measured vibrates with a displacement amount equal to or above $\lambda/2$, the beat wave is a chopping wave. For this, amplitude of the chopping wave is set as a reference amplitude. On the other hand, when the displacement amount of the object to be measured is less than $\lambda/2$, it is possible to set or correct the reference amplitude with the amplitude of the inter-extreme line.

Moreover, as will be detailed later, the reference amplitude can be corrected according to the ratio of the voltage increase time from the least voltage to the maximum voltage, with respect to the voltage decrease time.

Referring to FIG. 2A to FIG. 2G, three types of beat waves can be seen according to the vibration of the object and the measurement timing. The waveform shown in FIG. 2A will be referred to as a first M-shaped state. In this state, the object to be measured displaces $\lambda/2$ or more.

The waveforms of FIG. 2C to FIG. 2G will be referred to as S-shaped state. The S-shaped waveforms are beat waves (fine waves) obtained when the displacement of the object to be measured is less than $\lambda/2$ or $\lambda/4$. An experiment proved that the S-shaped waveform directly corresponds to the vibration displacement of the object to be measured. Accordingly, if a beat wave is obtained as an S-shaped state, by analyzing the fine wave of the S-shaped state, it is possible to know the vibration of the object to be measured.

For example, the cyclic interval sandwiched by dotted lines in FIG. 2A corresponds to an interval when the object is displaced by vibration from one end to the other end, which is 50 microseconds. On the other hand, in case of S-shaped state, an interval from an extreme to the adjacent extreme is the interval when the object is displaced by vibration from one end to the other end, which is 50 microseconds.

FIG. 2B shows a waveform which will be referred to as a second M-shaped state. This second M-shaped state is obtained when the vibration displacement is less than $\lambda/2$. In the second M-shaped state, the chopping waves are collapsed and combined with one another.

It should be noted that the fine wave may appear on the M-shaped state wave. This occurs when the object to be measured is in a large vibration while center position is vibrated by very small amplitude. In such a case, the fine vibration waveform can be extracted for frequency analysis to identify the vibration state. The fine wave extraction or identification of a fine wave can be based on the amplitude of the beat wave. That is, the amplitude of the beat wave in the M-shaped state or chopping waveform is stored and when the beat wave amplitude becomes smaller than this stored amplitude, it can be decided that the beat wave has become fine waves. Moreover, fine waves added to a chopping wave can also be identified if the amplitude from the wave upper end to the lower end is continuous and below the amplitude of the chopping wave.

Referring to FIG. 3, detailed explanation will be given on the first M-shaped state and the S-shaped state.

A chopping wave is denoted by a reference symbol 3a, and a waveform portion corresponding to the turning point is denoted by a reference symbol 3b. This portion of the turning point may be called S-shaped state. The S-shaped state in the M-shaped waveform has characteristics identical to that of the S-shaped waveform shown in FIG. 3B. In both of them, the displacement amount is less than $\lambda/2$ and the velocity vector has changed its direction and therefore no chopping wave has been generated. Here, the waveform peak is referred to as extremes 3c and 3d. The extreme having a higher voltage may be called an upper extreme, and the extreme having a lower voltage is may be called as a lower extreme.

Moreover, a change between an extreme and an adjacent extreme will be referred to as inter-extreme line 3e, 3f. The inter-extreme line is not a straight line. However, in a chopping wave, the curve may be approximated as a straight line depending on the sampling frequency. The inter-extreme lines 3e and 3f have different inclinations. As is known in the technique of the laser Doppler speedometer, this inclination difference is based on the displacement direction of the object to be measured. Here, as shown in FIG. 3A, the inter-extreme line 3e will be referred to as a gentle slope, and the inter-extreme line 3f will be referred to as a hard slope. This definition is important when calculating the displacement amount using the amplitude of the S-shaped state.

As has been described above, in the first M-shaped state, the time 3g from an extreme for a turning point to the adjacent extreme of another turning point corresponds to a movement from the maximum value to the minimum value of the distance from the reference point. In the S-shaped state, one displacement of the object to be measured requires time 3g from an extreme to the next extreme.

In a case of the simple harmonic motion, the displacement speed is at its maximum at the center of displacement and 0 at the turning point. On the other hand, a chopping waveform is generated when the object to be measured has displaced $\lambda/2$. Accordingly, if the object to be measured performs fine vibration less than $\lambda/2$, the first M-shaped sate is not generated. Instead, the second M-shaped state or the S-shaped state are obtained. Identification of the wave state using a signal processing technique will be detailed later in the fourth embodiment.

Figure 4:
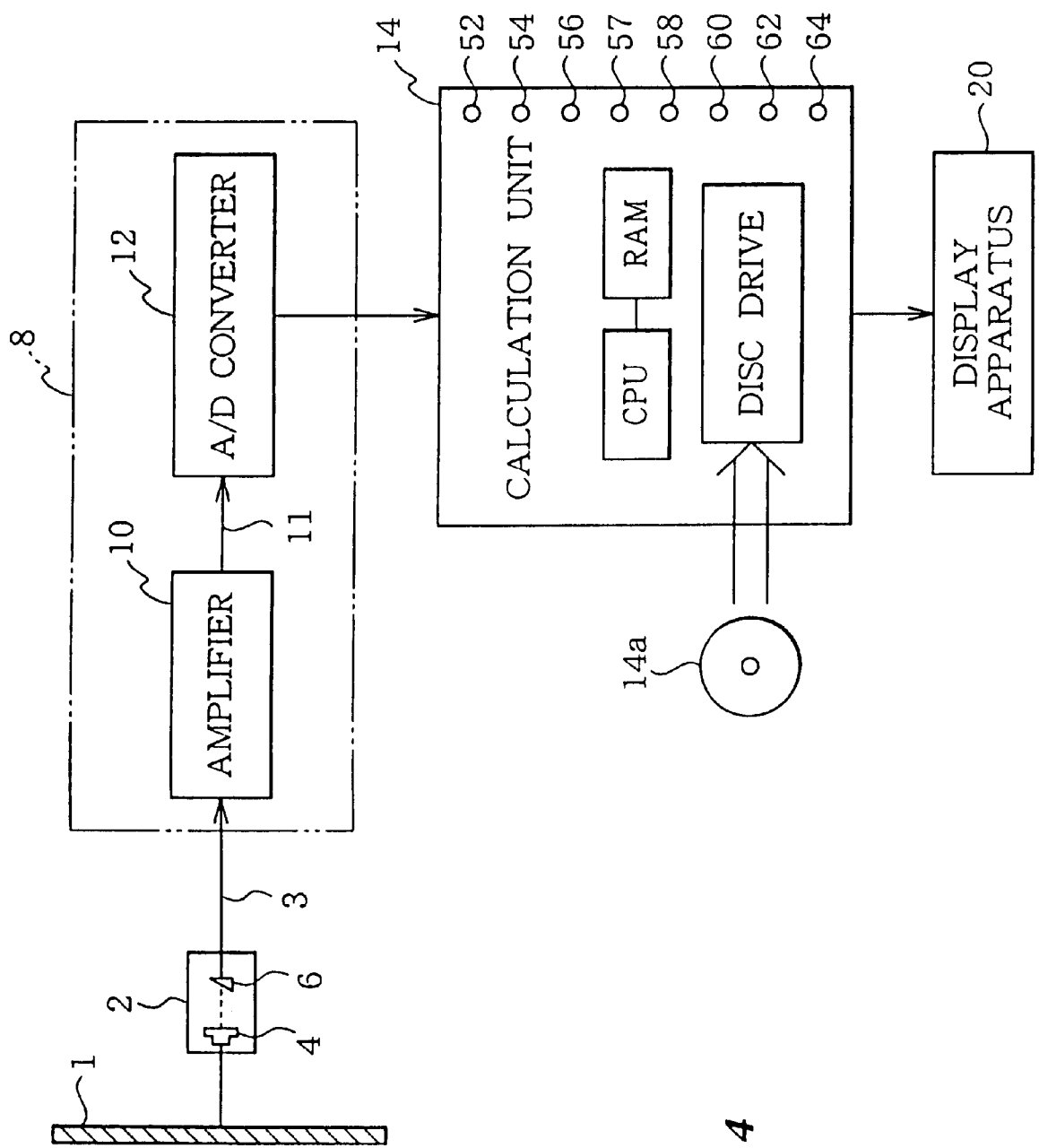
FIG. 4 is a block diagram showing a configuration of a vibration measurement apparatus according to the present invention.

FIG. 4 shows a vibration displacement calculation apparatus capable of calculating a fine displacement of the object to be measured, according to the first embodiment.

As shown in FIG. 4, the vibration displacement calculation apparatus includes: a light detection unit 2 for observing a laser beam reflected from the object to be measured; a beat wave detection unit 8 for analyzing a waveform signal output from the light detection unit 2 and detecting a beat wave; and a calculation unit 14 for calculating the vibration state of the object to be measured according to the beat wave detected by the beat wave detection unit 8.

The beat wave detection unit includes: an amplifier 10 for amplifying the signal 3 supplied from the light detection unit; and an A/D converter 12 for converting the amplified beat wave 11 into a digital data with a selected sampling frequency and a predetermined number of bits. The calculation unit 14 performs various calculations based on the beat wave expressed as a set of discrete data items.

In the first embodiment, the vibration amplitude displacement amount is calculated with a high accuracy according to the reference amplitude and the S-shaped beat wave amplitude.

In the second embodiment, the calculation unit performs frequency analysis.

In the third embodiment, increase and decrease of the beat wave frequency is changed into a voltage increase and decrease, and a speed change waveform is output.

In the fourth embodiment, a beat wave state is identified as a pre-processing for each of the embodiments.

Thus, the calculation unit 14 actually is a work station, microprocessor, or personal computer including a main storage device and a CPU and executing a program for displacement amount calculation as well as a frequency analysis program if necessary. These programs may be replaced by logic circuits or an FFT analyzer. In this specification, the calculation unit 14 is a unit performing a digital signal processing for discrete digital data items.

In the first embodiment, the calculation unit 14 includes: a reference amplitude setting block 52 for measuring an amplitude of the first or second-shaped waveform detected by the beat wave detector 8, and setting the reference amplitude; a ratio calculation block 54 for calculating the ratio of the reference amplitude against an S-shaped wave amplitude; and a displacement amount calculation block 56 for calculating a displacement amount of the object to be measured corresponding to the S-shaped waveform. Note that the function blocks 58 to 64 of the calculation unit are for other embodiments.

Figure 5:
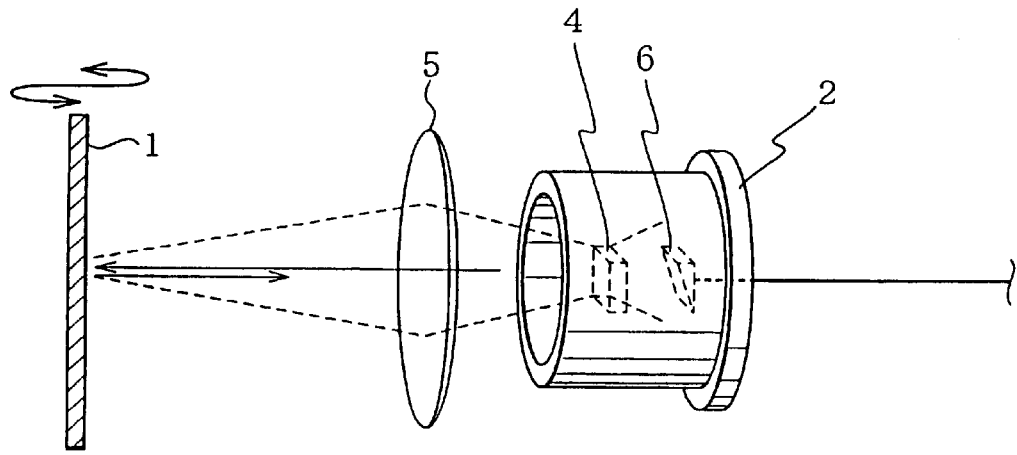
FIG. 5 is a perspective view of a light detection unit 2 shown in FIG. 4.

FIG. 5 shows a configuration of the light detection unit 2 of FIG. 4. The light detection unit 2 includes: a laser diode 4; and a photodiode (PD) 6 for receiving a mixture of outgoing light and incoming light mixed in the resonator of the laser diode 4. The laser light oscillated from the resonator of the laser diode 4 is focused by a lens 5 and applied to the object to be measured. Since a laser diode is available on market at a reasonable price, the diode can be used on a number of points on the object to be measured for simultaneous measurement of the plurality of diodes. Analysis of the vibration state using a laser light, which is a non-contact device, has an advantage of not affecting the object to be measured unlike a contact type acceleration pick-up.

Figure 6:
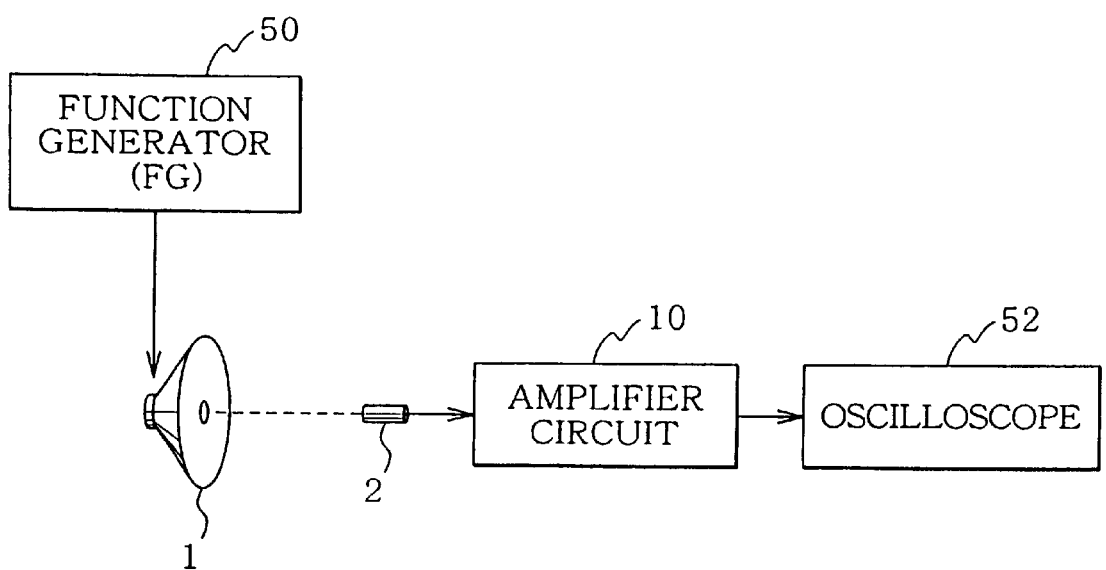
FIG. 6 is a block diagram showing a configuration of experiment system for observing a fine beat wave.

FIG. 6 is a block diagram showing an experiment system configuration for observing a fine vibration. The system includes: a function generator (FG) for vibrating a source of vibration; a light detection unit 2; an amplification circuit 10 for amplifying the beat wave detected by this light detection unit 2; and an oscilloscope for displaying the waveform of the beat wave amplified by this amplification circuit.

Here, by changing the voltage and frequency applied to the function generator, we observed the beat wave state in the oscilloscope 52.

Referring back to FIG. 2, the frequency and amplitude of the photodiode output waveform was changed corresponding to the change of voltage applied from the FG to the source of vibration.

When 3 V was applied to FG, chopping waves are generated around the turning point as shown in FIG. 2A. When 900 mV was applied, the chopping waves began to collapse. When the voltage was below 100 mV, the beat wave became S-shaped.

In FIG. 2C to FIG. 2G, the beat waves are shown by thick curves because of a white noise. These S-shaped beat waves indicate the displacement of the object to be measures. By observing the cycle of this beat wave, it is possible to obtain the vibration cycle of the object to be measured.

FIG. 7 shows correspondence between the vibration displacement and the beat waveform together with a calculated waveform, i.e., displacement of the object to be measured. In FIG. 7, the number of chopping waves in the beat wave was counted and the calculation was performed according to this chopping wave count and the turning position. That is, one chopping wave is generated for each vibration displacement $\lambda/2$. However, for the portion 61 in FIG. 7C, no calculation is performed. That is, the waveform becomes flat around the turning point and no actual displacement can be observed. Moreover, if the beat wave is in the S-shaped state 62, chopping wave counting cannot be performed and the displacement cannot be counted.

In contrast to this, the present embodiment enables to obtain a displacement amount from an amplitude of the S-shaped beat wave or the M-shaped beat wave for the turning point of the object to be measured. FIG. 8 shows a relationship between the vibration displacement and the beat wave amplitude. In case of FIG. 8A showing the vibration displacement, the beat wave amplitude is changed as shown in FIG. 8B or FIG. 8C due to the received light intensity affected by the environmental change. The portions indicated by reference numeral 64 and 65 correspond to a half cycle of the object to be measured.

In this embodiment, in order to eliminate a beat wave amplitude change due to the received light amount change, it is assumed that the amplitude of chopping waves in the same environment is V1, and the amplitude of the S-shaped state is V2. Using this V1 and V2, a vibration displacement amount L of the object to be measured for the S-shaped state can be obtained as follows. vibration displacement amount L $$L=(\lambda/2)\times(V2/V1) \quad \text{[Equation (1)]}$$

Referring back to FIG. 7, if the vibration displacement of the object to be measured exceeds $\lambda/2$, the displacement is determined on $\lambda/2$ basis as the chopping wave count. As for portion for the turning point, it is calculated from this Equation (1). A displacement amount smaller than $\lambda/2$ can also preferably calculated up to the limit by noise. If the laser oscillation has a wavelength of 780 nm, it is possible to calculate a displacement less than 390 nm. Moreover, when the vibration displacement is below $\lambda/4$, the beat wave is always in the S-shaped state. According to the amplitude of this S-shaped state, it is possible to calculate a fine displacement of the object to be measured.

FIG. 9 shows a waveform for explaining a beat wave when the vibration displacement is below $\lambda/2$ but above $\lambda/4$. Because of the phase difference between the object to be measured and the laser light, the object vibrating like FIG. 9A shows a second M-shaped state of FIG. 9B or S-shaped state of FIG. 9C. Here, the change from the upper (lower) extreme to the lower (upper) extreme is in the S-shaped state which occurs at the vibration turning point. In the example of FIG. 9B, no chopping wave appears, and one inter-extreme line 71 is present.

In the example of FIG. 9B, the S-shaped beat wave 70 is followed by an inter-extreme line 71. And at the next turning point of the object to be measured, an S-shaped beat wave 72 is generated. If it is assumed that the amplitude of the beat wave indicated by 72 is "A"; the amplitude of the beat wave indicated by 70 is "B"; and the amplitude of the amplitude of the beat wave shown in FIG. 9C is "C", then C>A+B. Accordingly, it is considered that the amplitude E of the aforementioned inter-extreme line 71 is equal to C− (A+B).

Figure 10:
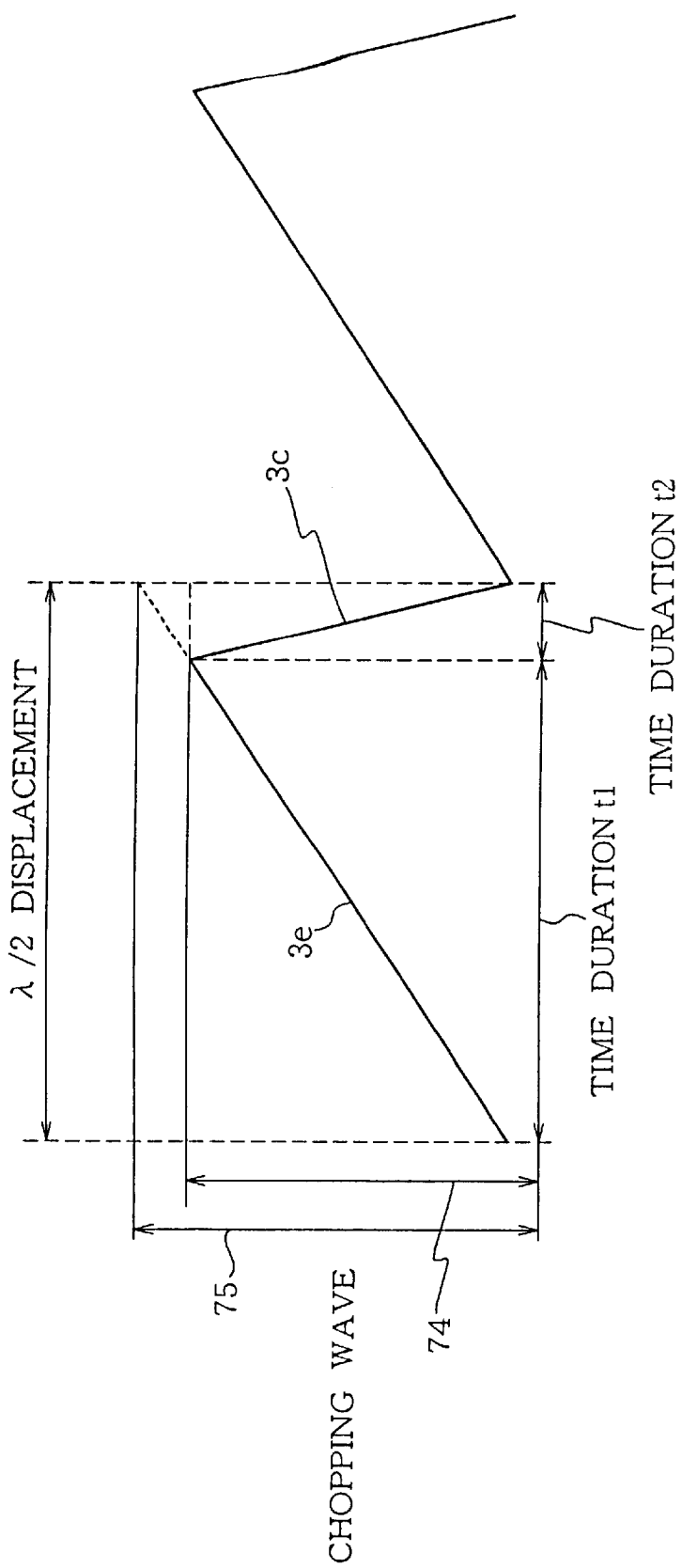
FIG. 10 shows a relationship between the saw-tooth waveform and the displacement amount.

When the object to be measured moves at a constant speed, the resultant chopping wave has different inclinations as shown in FIG. 10, i.e., a positive inclination for time t1 and a negative inclination for time t2. The inter-extreme line 3e for the time t1 is a long (gentle) slope while the inter-extreme line 3c is a short (hard) slope. For the voltage increase and decrease of this beat wave, the object to be measured has displaced by $\lambda/2$. Accordingly, in the chopping wave, the object displacement during the up-going gentle slope and object displacement during the down-going hard slope are at the ratio of t1:t2.

In general, in the second M-shaped wave or S-shaped wave, the turning of the object to be measured occurs with a higher probability at the longer inter-extreme during a longer time. Accordingly, in FIG. 9B, the shorter inter-extreme line 71 corresponds to the time t2 in the example of FIG. 10. On the other hand, the portions indicated by reference numerals 70 and 72 as well as the S-shaped wave shown in FIG. 9C corresponds to the time t1 in FIG. 10.

Considering the time ratio in this chopping wave, firstly, explanation will be given on the amplitude of the S-shaped state as a reference amplitude. The amplitude of the S-shaped beat wave as shown in FIG. 9C corresponds to the change during time t1 in the example of FIG. 10. During this time t1, the object to be measured actually displaces $(\lambda/2) \times T1/(T1+T2)$ and does not reach $\lambda/2$. The object to be measured also displaces during the time t2. Accordingly, the amplitude of the chopping wave itself is an amplitude corresponding to the displacement amount deleted by the displacement for the time t2. If this amplitude of the chopping wave is used as a reference amplitude in the calculation of displacement amount, the reference amplitude is smaller than the actual displacement. For this, in this embodiment, the reference amplitude is corrected.

The reference amplitude is the amplitude 74 multiplied by (t1+t2)/t1. For example, assuming t1 to be 4 and t2 to be 1, the amplitude 74 is multiplied 5/4. The amplitude thus corrected is indicated by the reference numeral 75 in FIG. 10.

Referring back to FIG. 1, in step C3 for correcting the reference amplitude, firstly, a ratio of the ascending time t1 against the descending time t2 is calculated. Next, the virtual amplitude 75 is calculated according to the ratio. This amplitude 75 is set as a reference amplitude corresponding to the displacement of the half of the wavelength.

Moreover, in the case of FIG. 3, the calculation unit 14 has a reference amplitude correction function for performing the correction in step C3.

Next, in relation to the ratio of the ascending time against the descending time, a method will be discussed for calculating the displacement of the object to be measured from the M-shaped beat wave shown in FIG. 9B. In the example of FIG. 9B, the voltage change indicated by reference numeral 71 corresponds to the aforementioned short (hard) slope. Accordingly, the displacement of the object to be measured during this voltage change 71 corresponds to the displacement amount of the object to be measured during time t2 in FIG. 10. The displacement for the short (hard) slope of FIG. 9B is t2/(t1+t2) multiplied by $\lambda/2$. In the aforementioned example, it is possible to obtain $(\lambda/2) \times (1/5)$. If the displacement amount for this short (hard) slope is added to the displacement for A+B, it is possible to obtain a displacement amount for C in FIG. 9.

The ratio of time t1 against t2 shown in FIG. 10 is almost constant regardless of the displacement speed of the object to be measured. Consequently, when calculating the reference amplitude, it is preferable to obtain the time ratio, which enables to calculate a displacement amount of the object to be measured when the waveform of FIG. 9B is obtained.

Figure 11:
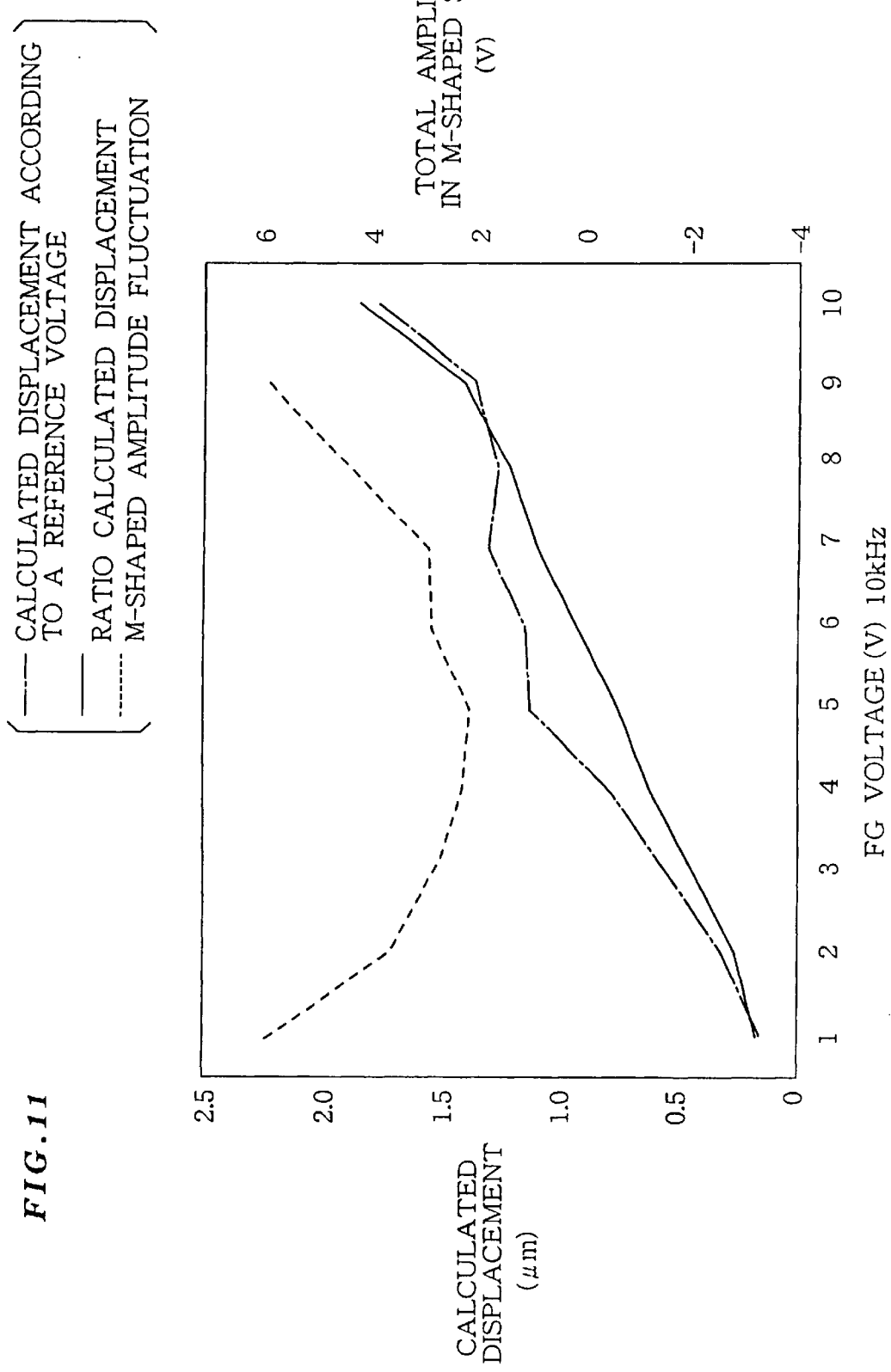
FIG. 11 is a graph showing a calculation displacement due to change in a received light amount.

FIG. 11 shows the relationship between an M-shaped amplitude fluctuation and a displacement amount calculation. In FIG. 11, the broken line indicates the M-shaped beat wave amplitude fluctuation. The beat wave amplitude fluctuates due to a measurement environment. The alternate long and short dash line indicates a displacement calculated according to a reference voltage. The solid line indicates a displacement amount calculated by using the aforementioned ratio.

As can be seen from FIG. 11, the use of the ratio in calculation enables to obtain a more accurate relationship between an actual displacement and a calculated value.

Figure 12:
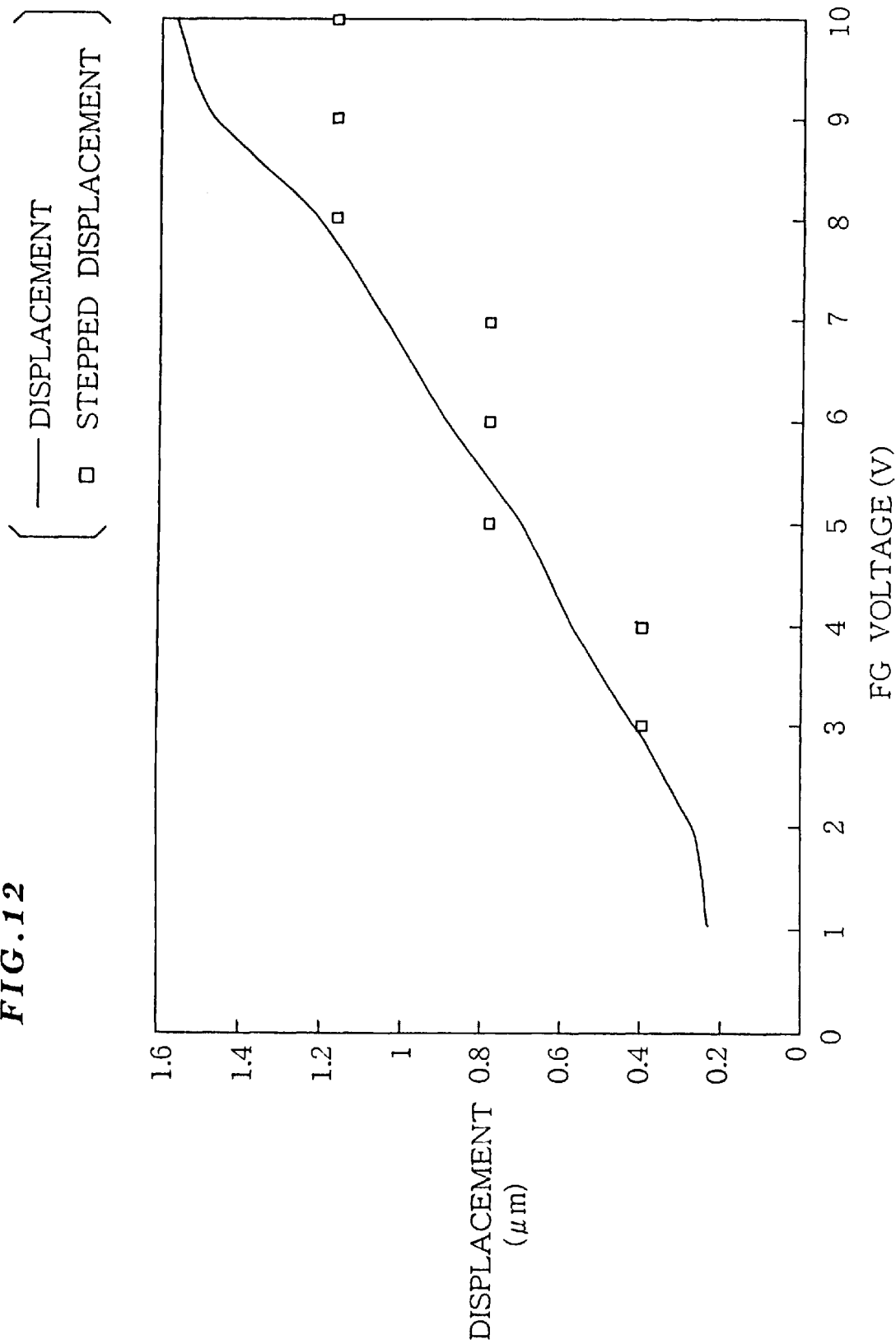
FIG. 12 graphs showing a stepped displacement on $\lambda/2$ basis in relation to a displacement calculation according to the present embodiment.

In FIG. 12, small squares indicate the stepped displacement obtained on $\lambda/2$ basis and the solid line indicates the displacement smaller than $\lambda/2$ obtained using the aforementioned amplitude ratio of the beat wave. As can be seen from FIG. 12, with the stepped displacement on $\lambda/2$ basis, it is impossible to know an accurate displacement amount of the object to be measured. Moreover, it is impossible to calculate a displacement for about 0.4 micrometers which is half of the laser oscillation wavelength. On the other hand, in the present embodiment, the displacement calculation using the amplitude ratio is more accurately matched with actual vibration of the object to be measured.

Figure 13:
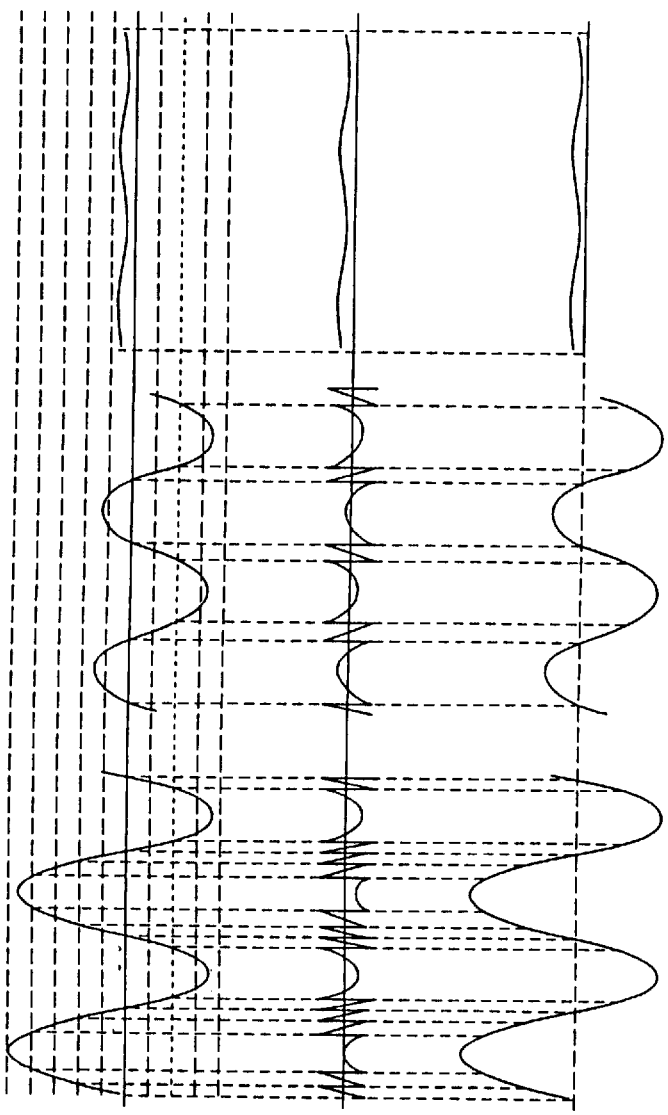
FIG. 13 shows waveforms as a calculation example of a displacement amount of a vibrating object.

This results in the calculated waveform shown in FIG. 13. In contrast to the calculated waveform shown in FIG. 7, the flat portion 61 is curved in FIG. 13 reflecting the actual displacement.

As has been described above, in the first embodiment, the ratio calculation step calculates a ratio of the amplitude of the beat wave for the turning point of the object to be measured against a predetermined reference amplitude; and the displacement calculation step calculates a displacement amount around the turning point according to the ratio obtained in the ratio calculation step and a laser light wavelength. That is, the present embodiment enables to obtain a higher accuracy than the calculation on $\lambda/2$ basis.

<Embodiment 2>

Description will now be directed to a beat wave frequency analysis according to the second embodiment of the present invention with reference to FIG. 14 to FIG. 26.

Figure 14:
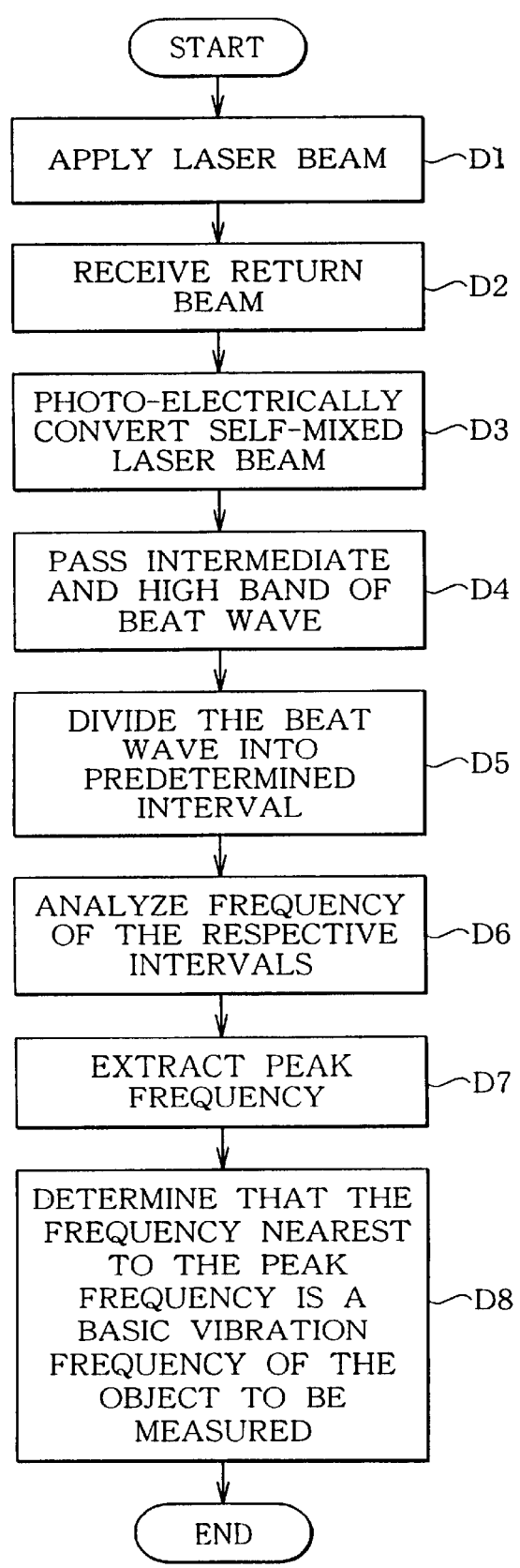
FIG. 14 is a flowchart showing the vibration measurement method according to a second embodiment.

FIG. 14 is a flowchart showing a configuration of the second embodiment. The vibration measurement method according to the second embodiment includes: radiation step D1 for applying to a vibrating object a laser light oscillated by a laser resonator; a light receiving step D2 for receiving the laser light reflected from the vibrating object; a photoelectric transform step D3 for photoelectrically transform the laser light mixed with the laser light received in the light receiving step; and a signal processing step for analyzing the state of a beat wave output from the step D3.

It is preferable that the signal processing step include as a pre-processing, a filtering step D4 for passing a particular frequency component of the beat wave; and dividing step D5 for dividing the resultant beat wave into cyclic intervals.

The signal processing step includes: a frequency analysis step D6 for analyzing the beat wave frequency; a peak frequency extract step D7 for extracting a peak frequency from the frequency analyzed in step D6; and a determination step D8 for determining that the lowest frequency among the frequencies extracted in step D7, as a basic vibration frequency.

Next, explanation will be given on the vibration measuring apparatus operating according to the aforementioned procedure.

Referring back to FIG. 4, the calculation unit 14 includes; a filter 57 for passing only a predetermined frequency component of the beat wave; a frequency analysis block 58 for analyzing frequency for the beat wave which has passed the filter 57; and a vibration analysis block 60 for analyzing the vibration state of the vibrating object according to the frequency spectrum output from the frequency analysis block 58. The vibration analysis block 60 has a decision block for deciding the lowest peak frequency as a reference frequency of the vibrating object.

Figure 15:
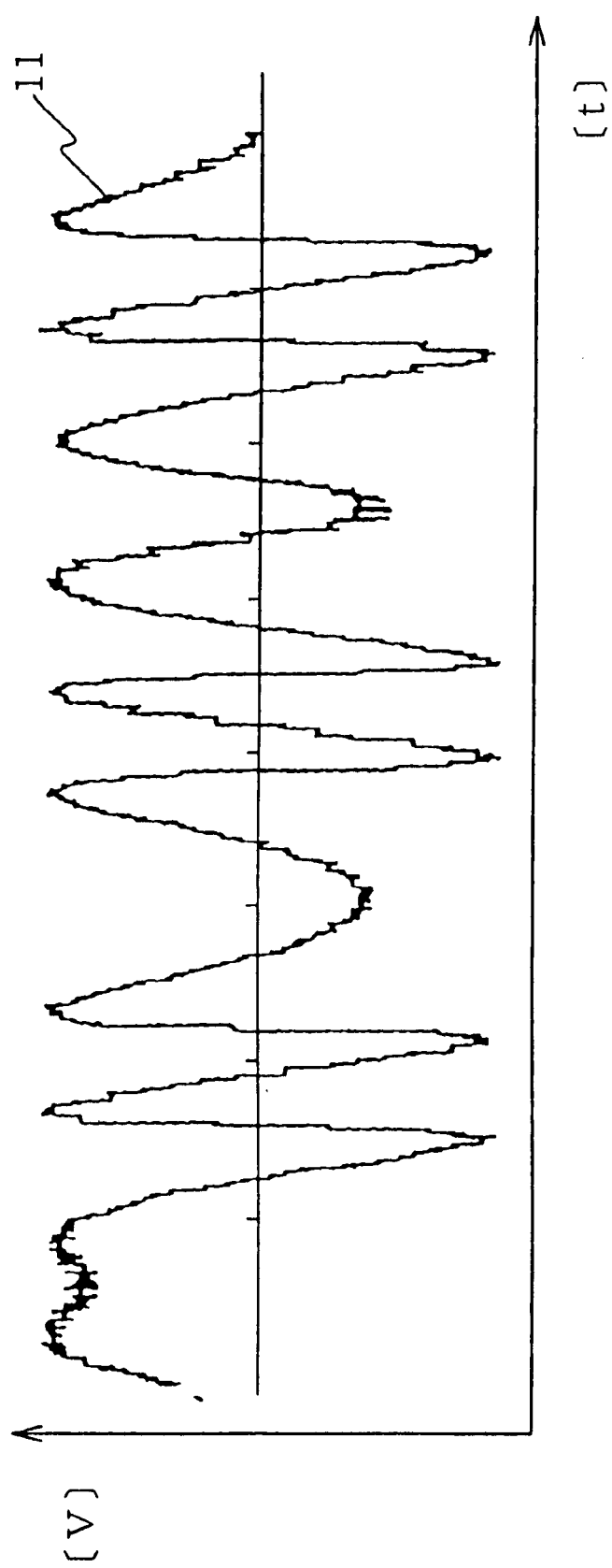
FIG. 15 shows an example of a beat wave which becomes a saw-tooth (chopping) waveform.

FIG. 15 shows a waveform detected as a beat wave of the Doppler component contained in the self-mixed reflected light. Here, the Doppler frequency fd and the moving velocity v of the vibrating plane are in the relationship expressed by Equation (2) given below. From Equation (2), it is possible to obtain Equation (3) which expresses the laser direction component of the vibration plane displacement velocity. Accordingly, the displacement amount of the vibrating plane is $\lambda/2$ for one cycle of a chopping wave. Moreover, it is possible to consider that when the vibrating plane is displaced $\lambda/2$, one chopping wave is generated.

[Equation (2)]

$$fd = \frac{2|v|\cos\theta}{\lambda} \quad (2)$$

$fd$ : Chopping wave frequency $\lambda$ : Laser oscillation frequency $\theta$ : Difference between velocity direction and laser angle

[Equation (3)]

$$|v| = fd\frac{\lambda}{2} \quad (3)$$

By counting the number of beat waves, it is possible to obtain a displacement of vibrating plane, vibration velocity, and a vibration acceleration. However, this has been difficult when the vibrating plane turns its vibration direction. In order to easily calculate the vibration frequency, it is necessary to detect the moment when the vibration plane changes its advance direction. This detection has been indispensable for the self-mixing method.

There are several methods for detecting the turning moment from chopping waves, such as a method for calculating the chopping wave wavelengths and detecting the turning point according to their distribution and a method for differentiating the chopping wave and detecting according to the waveform inclination. However, these methods presume that a number of chopping waves are present around the turning moment. If the number of chopping waves is small, it is difficult to detect the turning moment. When the displacement of the vibrating plane becomes smaller, less chopping waves appear during the direction turning. Furthermore, if the vibration displacement is below $\lambda/2$, the conventional method cannot calculate correctly to know the turning point.

Figure 16:
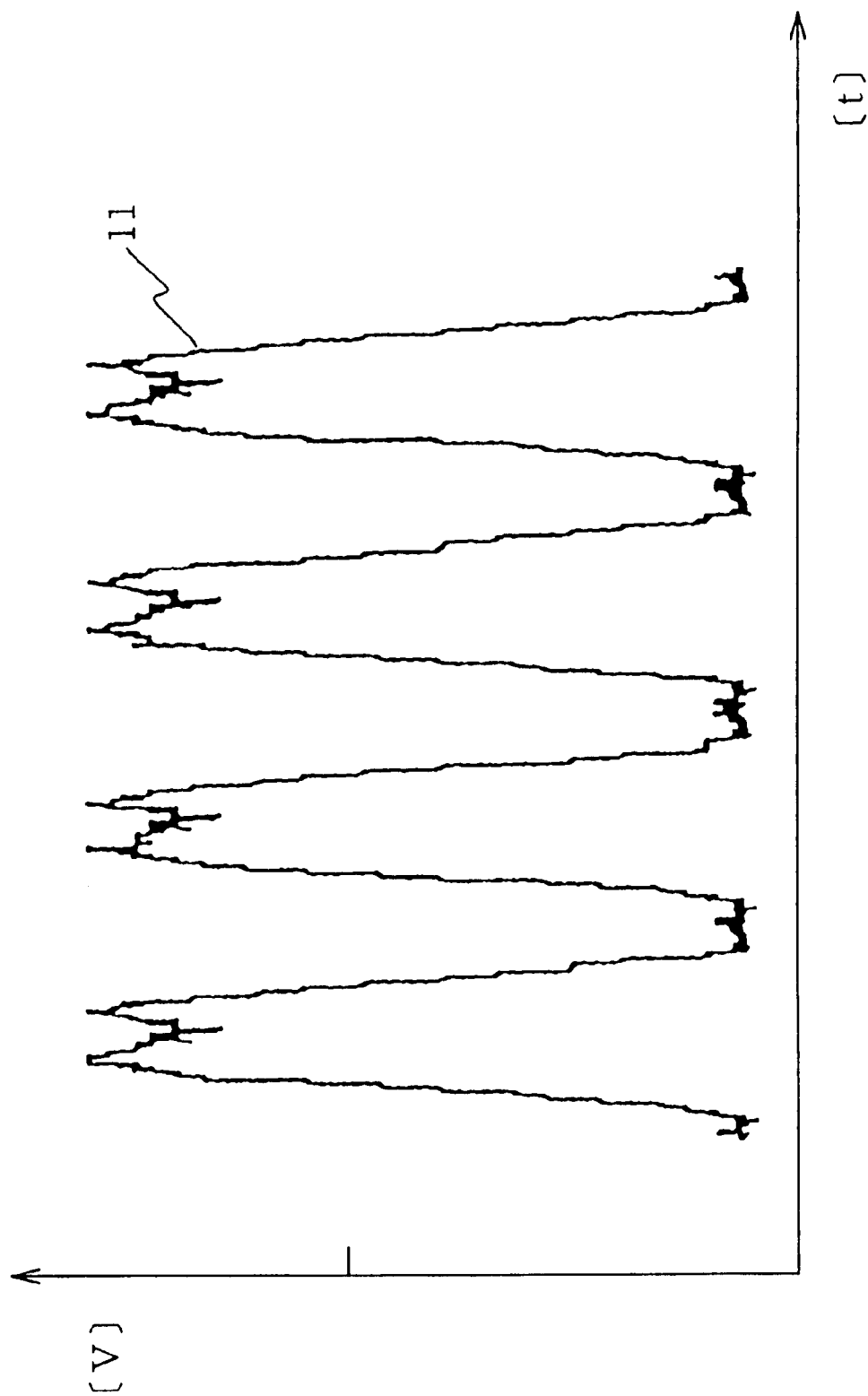
FIG. 16 shows a first example of beat waveform when the object displacement is less than the $\lambda/2$ and no saw-tooth wave is generated.
Figure 17:
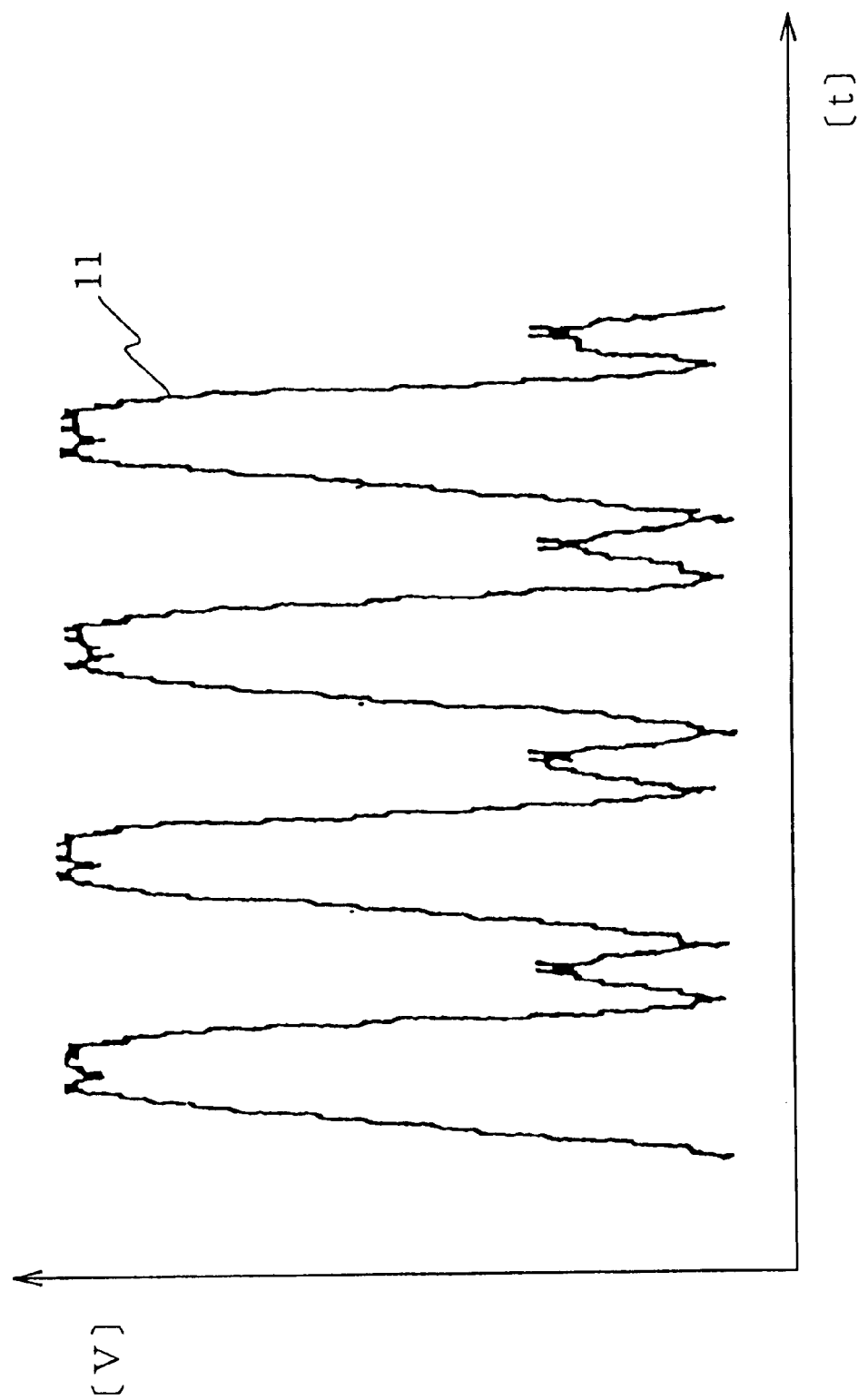
FIG. 17 shows a second example of beat waveform when the object displacement is less than the $\lambda/2$ and no saw-tooth wave is generated.
Figure 18:
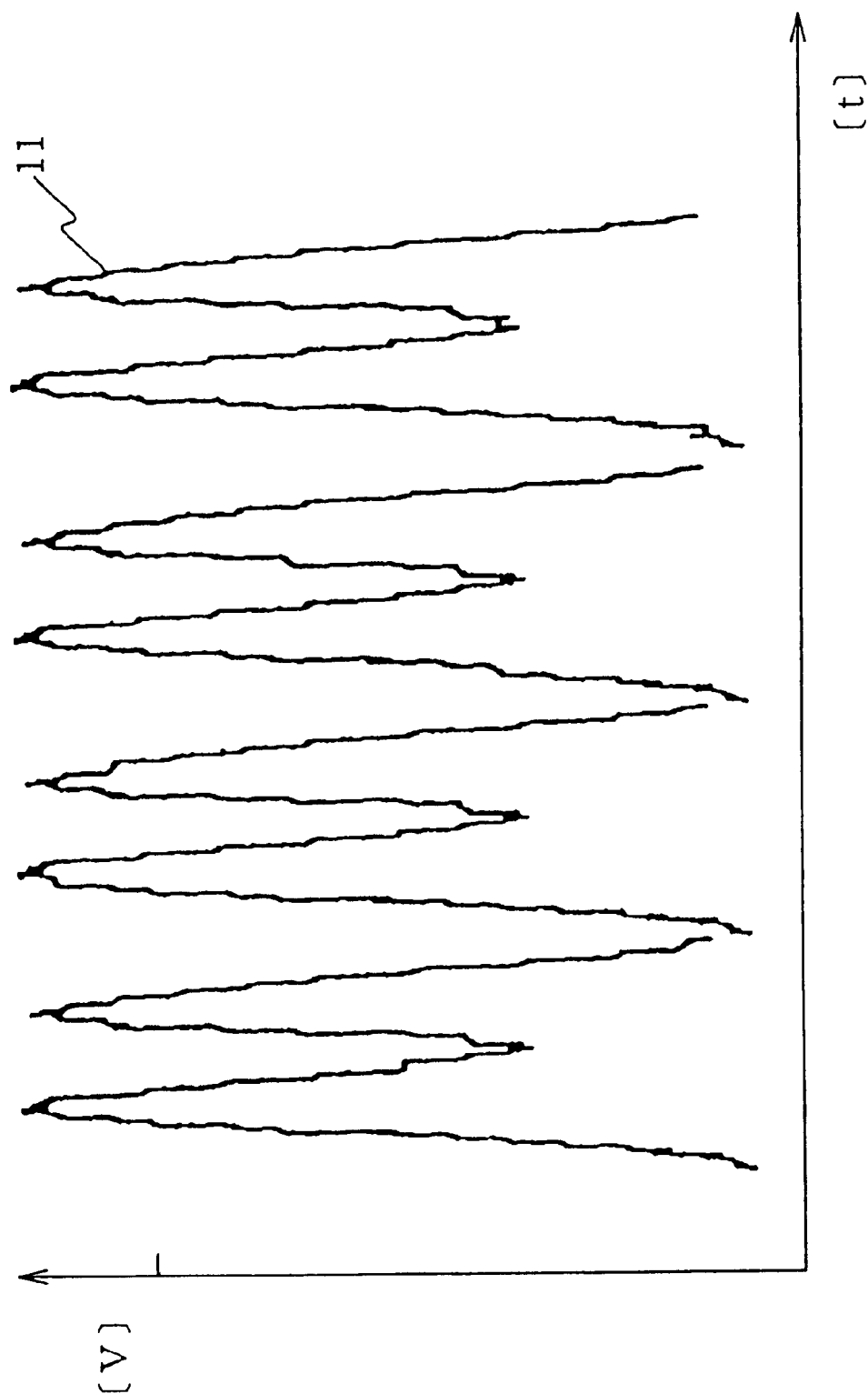
FIG. 18 shows a third example of beat waveform when the object displacement is less than the $\lambda/2$ and no saw-tooth wave is generated.

FIG. 16 to FIG. 18 show examples of waveforms having no chopping waves when the vibration displacement is less than $\lambda/2$. Thus, when the vibration displacement is less than $\lambda/2$, the beat wave has various waveforms and it becomes difficult to identify the direction turning moment.

According to the second embodiment, a vibration characteristic can be detected in such second M-shaped beat waves, or the first M-shaped beat wave as shown in FIG. 15, or the S-shaped beat wave, without detecting the turning moment.

Figure 19A:
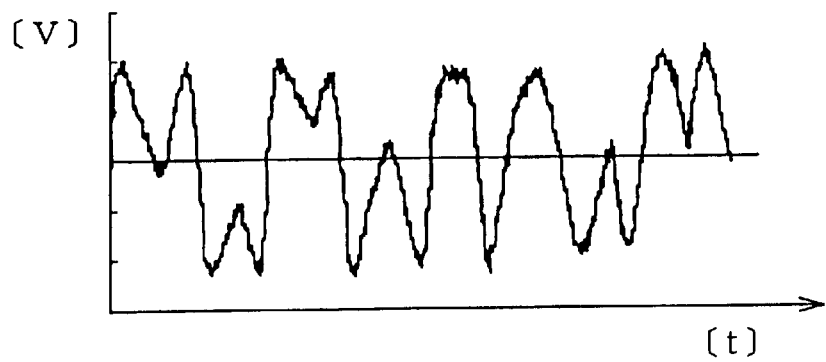
FIG. 19A shows an example of the beat waveform.
Figure 19B:
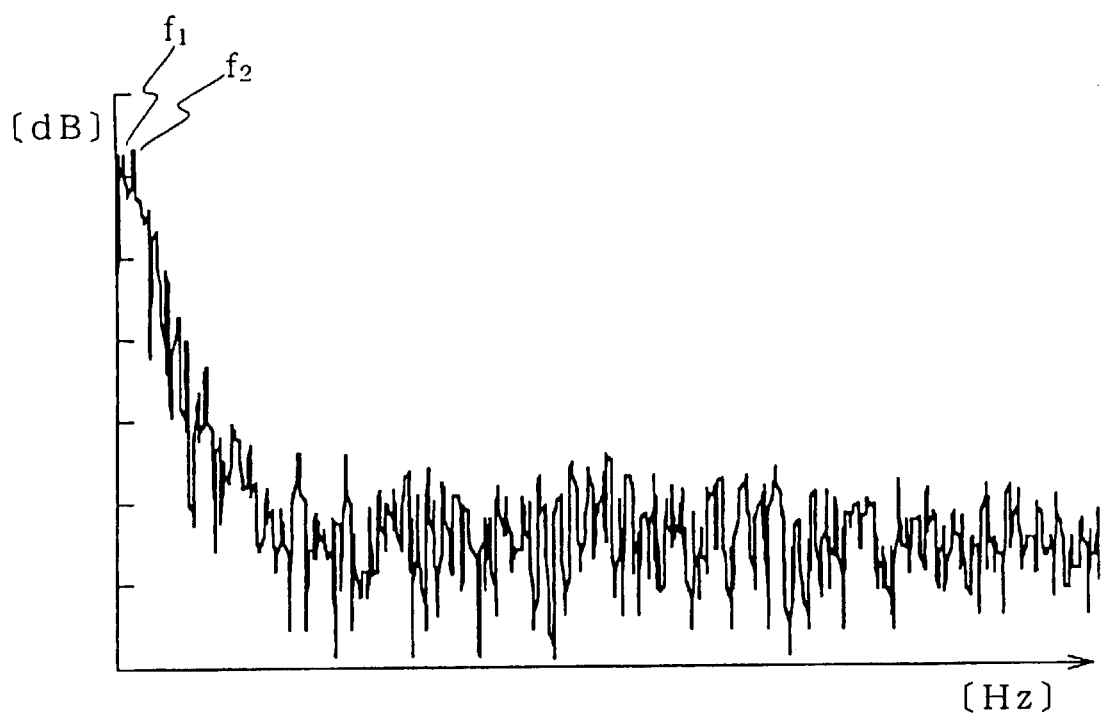
FIG. 19B shows its frequency spectrum.
Figure 20A:
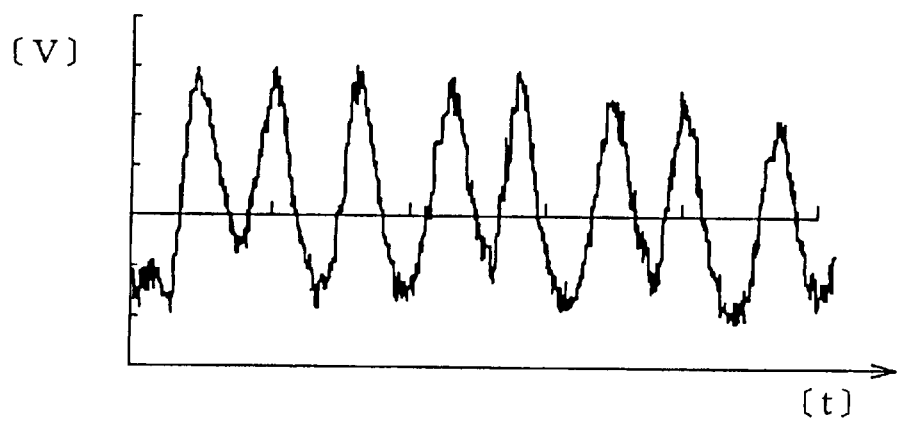
FIG. 20A shows an example of the beat waveform.
Figure 20B:
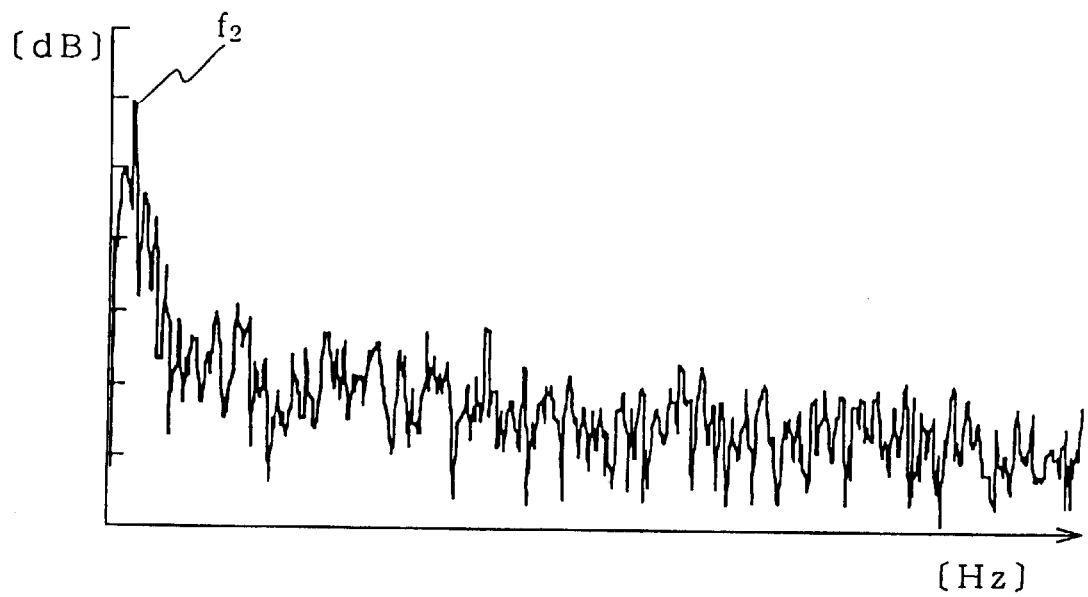
FIG. 20B shows its frequency spectrum.
Figure 21A:
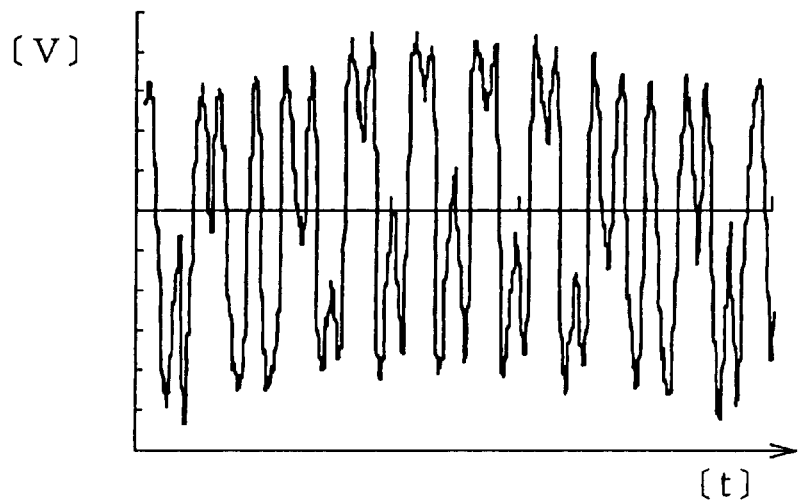
FIG. 21A shows an example of the beat waveform.
Figure 21B:
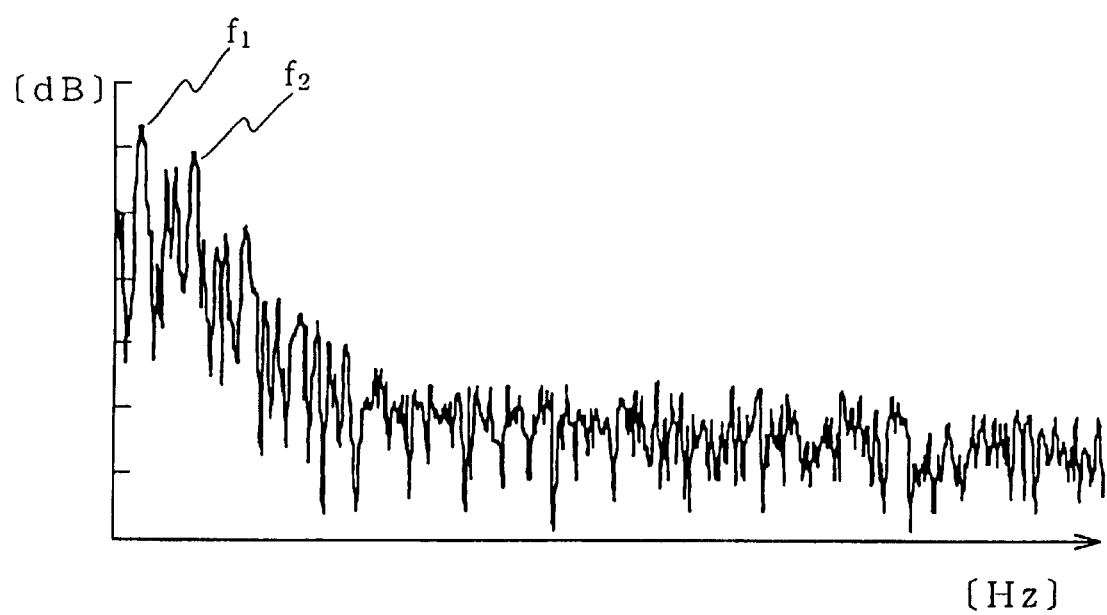
FIG. 21B shows its frequency spectrum.

FIG. 19 to FIG. 21 show three types of the second M-shaped beat wave, together with respective frequency spectra.

FIG. 19 shows type 1 waveform in which smaller waveforms are formed at the peaks and bottoms. FIG. 20 shows type 2 waveform in which one beat wave appears for each vibration cycle. FIG. 21 shows type 3 waveform in which two beat waves appear for each vibration cycle.

When these waveforms are subjected to frequency analysis, frequency f1 is mainly observed in type 1, and frequency f2 is mainly observed in the type 2 and type 3.

In case of type 3, where chopping waves are formed, it is possible to identify the type 3 beat wave by detecting a higher harmonic component of f2. The frequency (f2) is multiplied by ½ to obtain the vibration frequency. In other than the type 3, that is, in the case of type 1 and type 2, the lowest frequency (f1) is detected as a vibration frequency.

Practically, the waveforms of type 1, type 2, and type 3 alternately appear in a complex vibration. Accordingly, when a beat wave for a displacement less than $\lambda/2$ is subjected to frequency analysis, the lowest frequency (f1) among the frequencies is selected as a vibration frequency.

Moreover, the vibration state change can be detected by the ratio of the frequencies such as f1 and f2. In this case, the identification step calculates a ratio of the basic vibration frequency with respect to a frequency peak which is a higher harmonic wave, as a characteristic value of the object to be measured. By calculating the ratio of f1 with respect to f2, it is possible to express the beat wave change, i.e., change of the vibrating object, without using a displacement amount of the vibrating object.

A beat wave generated by a vibrating object greater than $\lambda/2$ can be subjected to a frequency analysis in order to observe the vibration state. That is, when an appropriate amount of reflected light can be obtained, the chopping waves can be observed with a preferable SN, and a plurality of chopping waves appearing around the turning moment of the vibrating plane advance direction have a basic frequency component appearing together with secondary and tertiary higher harmonics. Here, the ratio of the basic frequency, the secondary frequency, and the tertiary frequency decreases in this order, resulting in a stepped frequency distribution. In the basic frequencies (lowest frequencies), the least frequency indicates the vibration frequency and the highest frequency indicates a Doppler frequency at the highest velocity of the vibrating plane. Accordingly, by measuring the lowest frequency it is possible to detect a vibration cycle, and by measuring the highest frequency, it is possible to detect a vibration velocity and acceleration.

In this case, the identification step may include a step for identifying the highest frequency among the frequencies extracted by the peak frequency extraction step, as the Doppler frequency at the highest velocity of the vibrating object. Moreover, the identification step may include a step for calculating a vibration velocity or acceleration at the highest velocity of the vibrating object.

In the case of the S-shaped beat wave, the range for extracting chopping waves is reduced to a small range and accordingly, the waveform becomes comparatively simple. Without a complicated processing it is possible to obtain the beat wave cycle from a waveform analysis and a frequency analysis. It is possible to perform F-V conversion before analyzing the waveform.

Figures 22A, 22B:
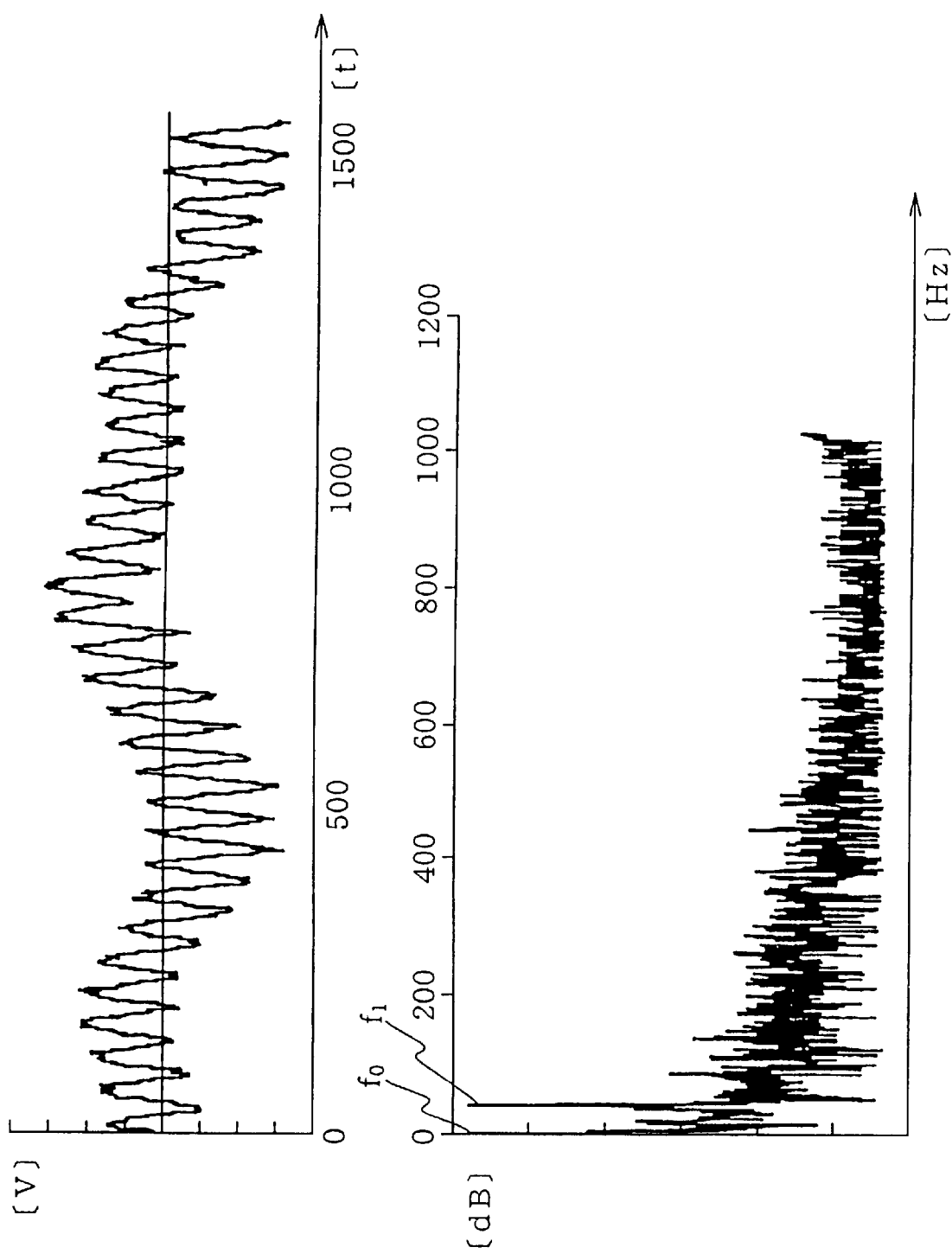
FIG. 22A shows a type 2 beat waveform overlain on a low frequency component and FIG. 22B shows its frequency spectrum.
Figures 23A, 23B:
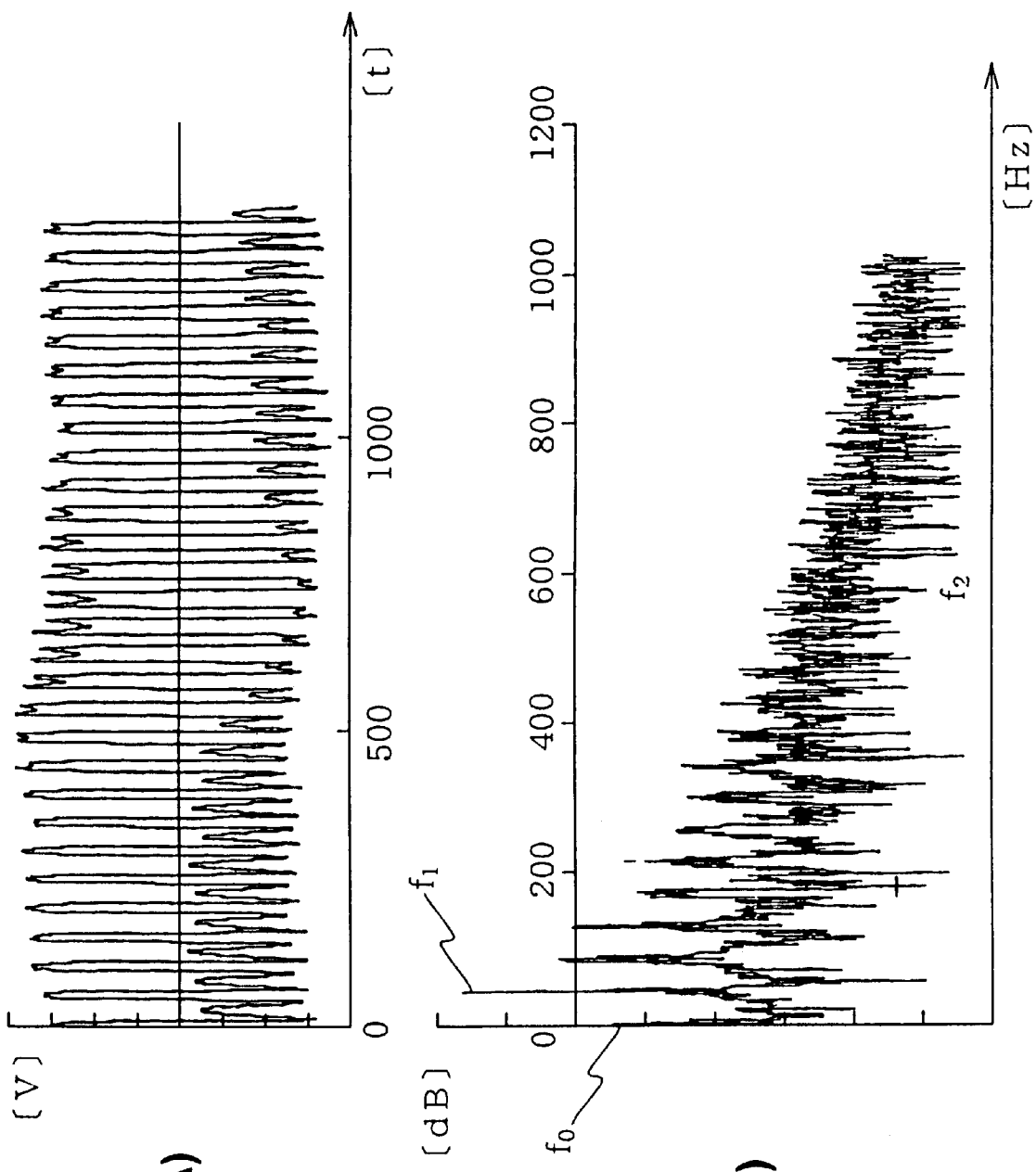
FIG. 23A shows a type 1 beat waveform overlain on a low frequency component and FIG. 23B shows its frequency spectrum.

FIG. 22 to FIG. 25 show various types of beat wave and their frequency spectra. In the example of FIG. 22, a beat wave of type 2 is overlain on a low frequency component. In this case, as shown in FIG. 22, f0 and f1 are present as the frequency peaks. The f0 is the basic vibration frequency of the vibrating object. In the example of FIG. 23, a beat wave of type 1 is overlain on a low frequency component. In this case, the peak f1 shown in FIG. 23B is the basic vibration frequency of the vibrating object.

Figures 24A, 24B:
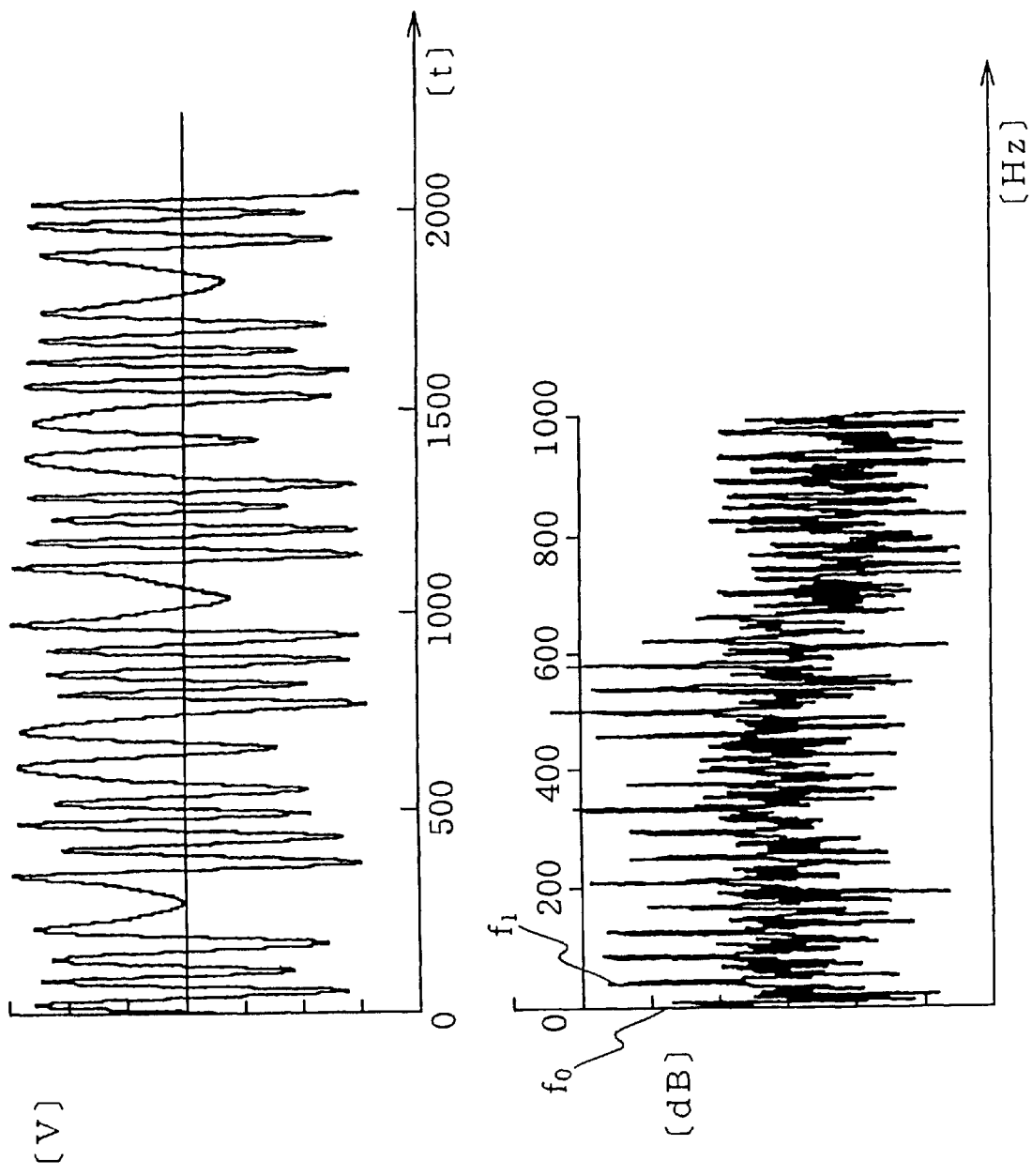
FIG. 24A shows a beat waveform of the first M-shaped state and FIG. 24B shows its frequency spectrum as a first example.

FIG. 24 is an enlarged M-shaped beat wave obtained when an object vibrates with a displacement greater than λ/2. In this case also, the basic vibration frequency of the object appears at f1. That is, the turning point frequency shown in FIG. 24A corresponds to the peak f1 frequency in FIG. 24. The same applies to the M-shaped wave of FIG. 25.

As shown in FIG. 22 to FIG. 25, in an actual measurement, a lower frequency component appears as a peak. Accordingly, it is preferable to eliminate the lower frequency component from the beat wave using a filter before performing the frequency analysis. Moreover, it is also possible to delete a frequency spectrum lower than a predetermined frequency.

As has been described above, according to the second embodiment, by using a predetermined technique (frequency analysis), it is possible to obtain information on the characteristics of vibration of a vibrating object, regardless of a displacement amount of the vibrating object. Especially, when the lower component other than those to be measured is cut off and the lowest frequency of the frequency spectrum is identified as a basic vibration frequency of the vibrating object, it is possible to obtain characteristic values of the vibration of the vibrating object with a comparatively simple configuration. Moreover, in the second embodiment, a characteristic value used is a ratio of the lowest frequency component of the peaks in the beat wave frequency spectrum against the next lowest frequency component. This enables to obtain value which appropriately indicates the change of the beat wave state.

Thus, in the second embodiment, the frequency analysis step performs frequency analysis of a self-mixed beat wave; and the identification step identifies as a basic vibration frequency the lowest frequency component of the peaks appearing in the frequency spectrum. Accordingly, even if the vibration amplitude is above or below λ/2, it is possible to determine the basic vibration frequency as a characteristic value of the vibrating object. Thus, it is possible to measure the change of the natural vibration of the vibrating object with a comparatively simple configuration. This enables to realize a small-size apparatus operating with an appropriate response to an abnormal state for example.

<Embodiment 3>

Figure 26:
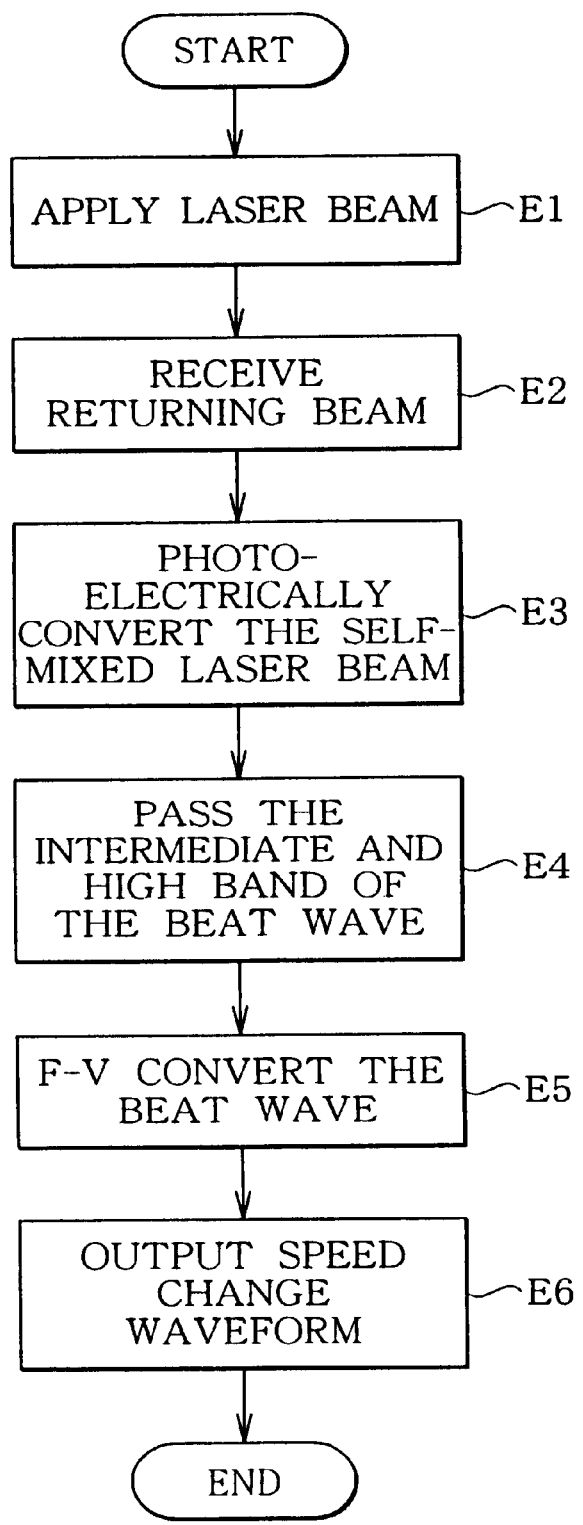
FIG. 26 is a flowchart showing a vibration measurement method according to a third embodiment of the present invention.
Figure 27:
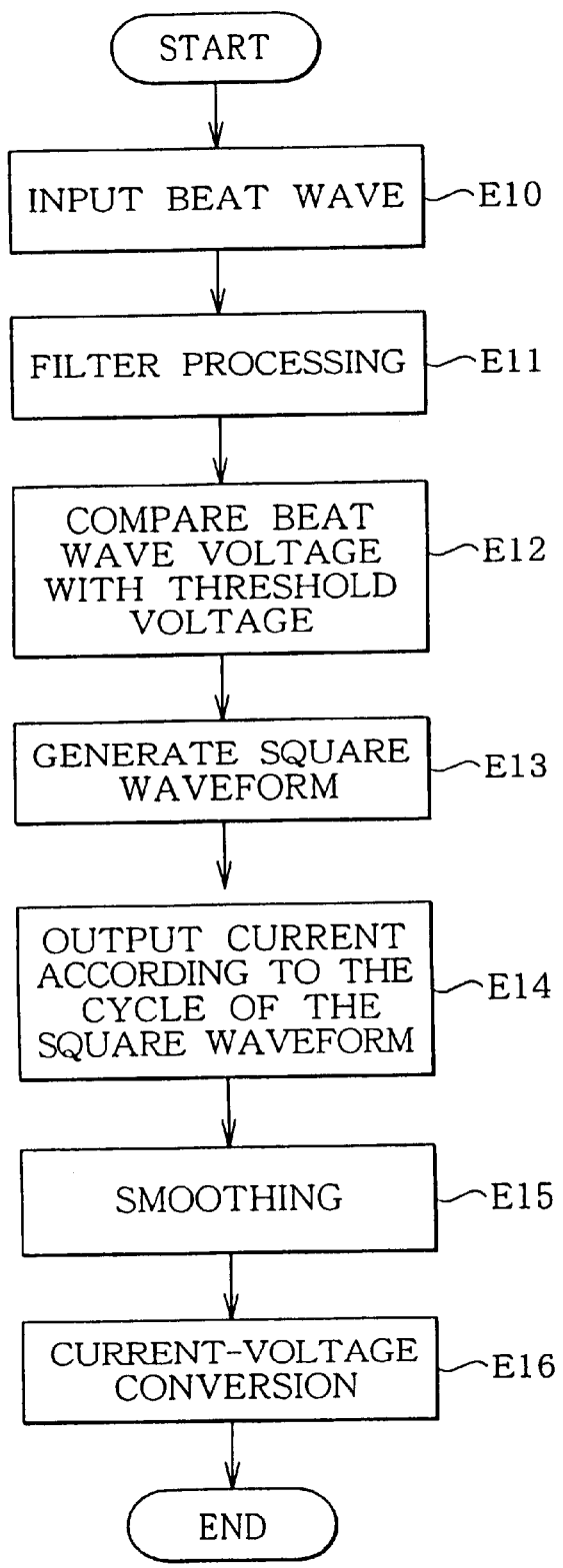
FIG. 27 shows details of the F-V conversion shown in FIG. 26.
Figure 28:
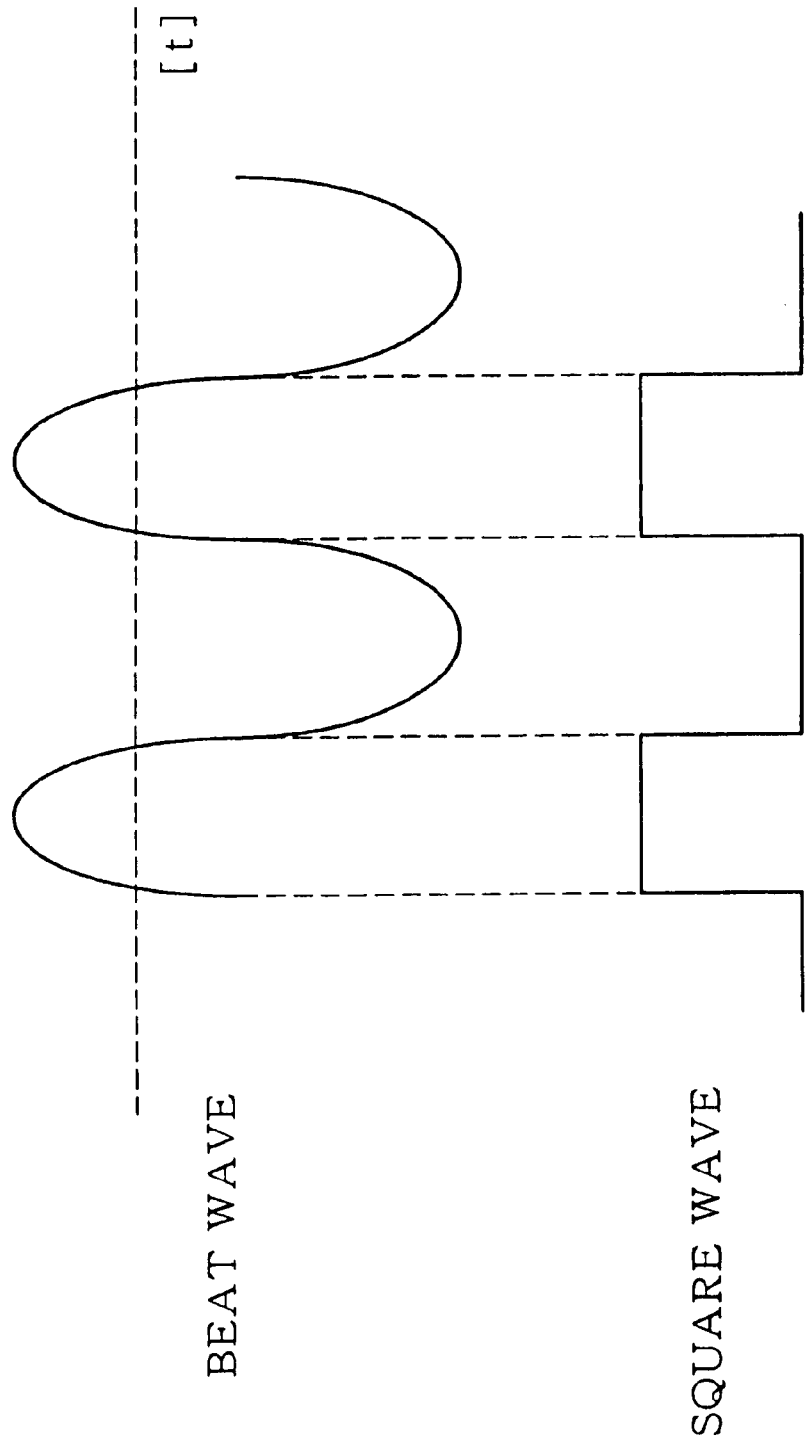
FIG. 28 shows an example of square wave creation shown in FIG. 27.

Description will now be directed to a third embodiment (beat wave is F-V converted to obtain a speed changed waveform) with reference to FIG. 26 to FIG. 28.

FIG. 26 is a flowchart showing a configuration of the vibration measurement method according to the third embodiment of the present invention. As shown in FIG. 26, the vibration measuring method according to the third embodiment comprises: a radiation step E1 for applying laser light to an object to be measured; light receiving step E2 for receiving a reflected laser light; a photoelectric conversion step for photoelectric converting the self-mixed light of the oscillated light and the reflected light; and a signal processing step for analyzing the waveform of the beat wave output from the photoelectric conversion step E3.

The signal processing step includes: a filtering step E4 for passing only the predetermined frequency band component; an F-V conversion step E5 for converting into a signal strength change the frequency change of the beat wave which has passed the filtering step E4; a decision step E6 for deciding that a waveform generated by this conversion step E5 corresponds to a speed change of half of the vibration cycle of the object.

FIG. 27 is a detailed flowchart of the F-V conversion E5 in FIG. 26. A beat wave is supplied (E10) and subjected to filtering (E11). After this, a predetermined threshold value Vref is compared to the voltage of the supplied beat wave (E12). Then, a square waveform is generated according to the point where the beat wave exceeds the threshold value and the point where the beat wave becomes lower than the threshold value (E13). FIG. 28 shows a relationship between the beat wave and the square wave. As shown in FIG. 28, the interval of the square wave corresponds to the cycle of the beat wave. Next, according to the cycle of this square wave, an electric current is output (E14). Thus, the beat wave cycle change can be converted into a current change. After this, smoothing is performed (E15), and current is converted into voltage. Thus, it is possible to generate a signal according to a wavelength change of the chopping waves. This signal indicates the speed change of the object to be measured.

Here, even if the vibrating surface moving direction is changed, an identical frequency transition can be seen. For example, when an object is in simple harmonic motion, it is possible to observe the beat wave frequency converted into voltage, keeping ½ cycle for one vibration cycle. Accordingly, an oscillation frequency can be determined from the speed change waveform as follows.

1) The speed change waveform is subjected to frequency analysis and the obtained frequency is multiplied by ½ to obtain an oscillation frequency.

2) A sign is reversed for each of the speed change waveform (or the wave form is reversed so as to be symmetric for a voltage axis), and two speed change waveform cycles is rectified into a one-cycle vibration waveform. By determining the frequency and amplitude, it is possible to observe the vibration state.

Moreover, by differentiating (or calculating divided difference) this waveform, it is possible to determine acceleration, and by integrating (or calculating trapezoidal approximation), it is possible to determine a displacement. Accordingly, it is possible to determine a power and other factors accompanying the vibration.

As for the reversing sign of the speed change waveform for each cycle, it can be realized as follows. When the speed change waveform intersects a predetermined voltage level (normally, at speed zero), a toggle circuit reverses the voltage level. Alternatively, by identifying inclination of the chopping waves in the beat wave, at a predetermined position of the speed change waveform (normally, at the bottom), the sign of the speed change waveform is reversed. These methods can be implemented using a digital signal. Moreover, it is possible to directly observe the speed change waveform (or frequency analysis), it is possible to know that change has been caused in the vibration state.

<Embodiment 4>

Description will now be directed to analysis of a beat wave according to the fourth embodiment of the present invention with reference to FIG. 29 to FIG. 39.

Figure 29:
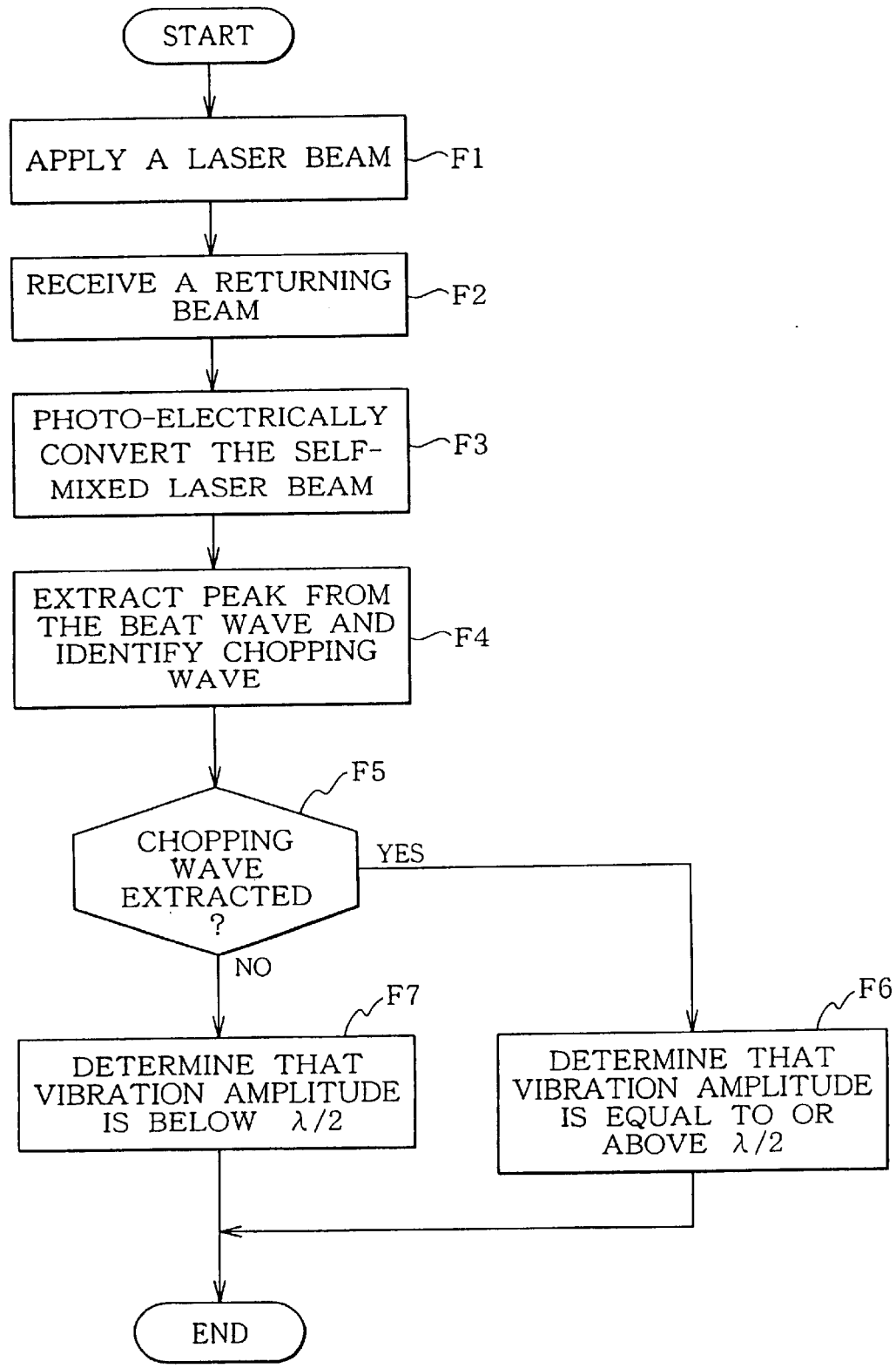
FIG. 29 is a flowchart showing a vibration measurement method according to a fourth embodiment of the present invention.

FIG. 29 is a flowchart showing a configuration of the fourth embodiment. In this fourth embodiment, the maximum amplitude of the object to be measured is determined according to a waveform of a beat wave. The vibration measurement method according to the fourth embodiment includes: a radiation step (step F1) for applying a laser light from a laser resonator; a light receiving step (step F2) for receiving a returning light of the laser light applied; photoelectric conversion (step F3) for photo-electrically converting a self-mixed laser light of the oscillated light and the received light in step F2; and a signal processing step (steps 4 to step 7) for analyzing a waveform state of the beat wave output from the photoelectric conversion step F3.

This signal processing step includes an extraction step (step F4) for extracting chopping waves from the beat waveform; it is determined whether any chopping waves have been extracted in step F4 (F5); a first decision step (step F6), if any chopping waves have been extracted (F5), for deciding that the amplitude of the vibrating object in the extracted range is equal to ($\lambda/2$) or larger than the half of the laser light wavelength $\lambda$; and second decision step (step 7), if no chopping waves have been extracted (step F5), for deciding that the amplitude of the object in the non-extracted range is shorter than the laser wavelength multiplied by ½ ($\lambda/2$).

For extracting chopping waves in the beat wave, there are various methods such as observing the relationship between the beat wave peak and bottom (hereinafter, referred to as extremes) and returning points or observing the waveform before and after the peaks.

If a beat wave contains chopping waves, the vibration amplitude of the object to be measured is equal to or greater than $\lambda/2$. On the other hand, if the vibration amplitude of the object to be measured is less than $\lambda/2$, no chopping waves appear in the beat wave. By utilizing this phenomenon, it is possible to determine whether the vibration amplitude of the object to be measured is equal to or greater, or smaller than $\lambda/2$. Depending on whether the vibration amplitude of the object to be measured is equal to or greater than the $\lambda/2$, different analysis is used for identifying the vibration state of the object to be measured. For example, in a case of attenuation where the vibration amplitude of the object to be measured changes from above to below $\lambda/2$, it is possible to preferably analyze the vibration state.

In the vibration measurement apparatus according to the fourth embodiment, a calculation unit includes: a filter 13 for passing a predetermined frequency band component of a beat wave; a chopping wave extraction block 62 for extracting a chopping wave from the beat wave which has passed the filter 13; and an amplitude length decision block 64 which operates as follows. When a chopping wave is extracted by the chopping wave extraction block 62, the vibration amplitude is determined to be equal to or greater than $\lambda/2$. On the other hand, when no chopping wave is extracted, the vibration amplitude is determined to be smaller than $\lambda/2$.

Figure 30:
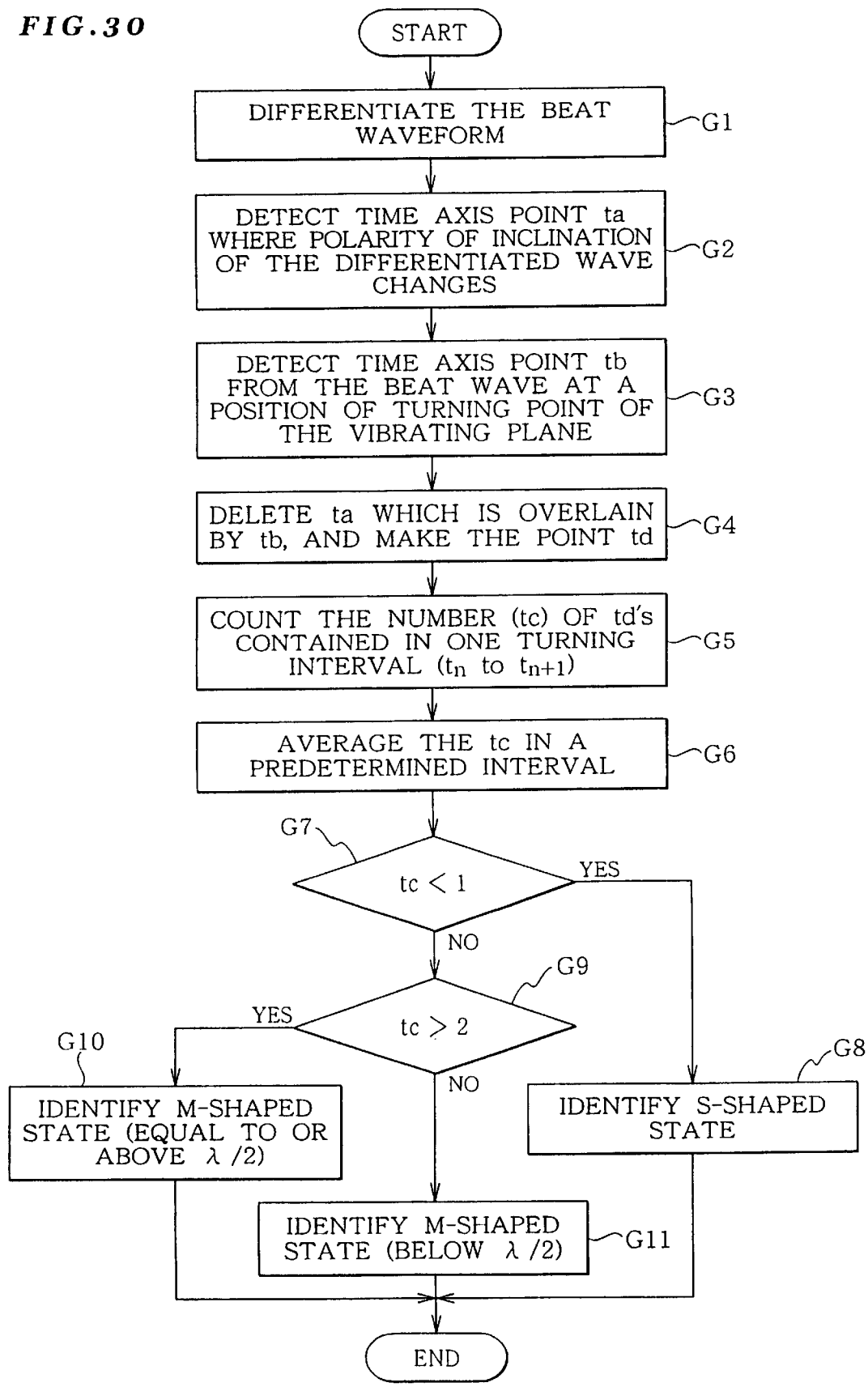
FIG. 30 is a flowchart showing a processing example to identify a waveform state according to the number of peaks in one cyclic interval.

Next, explanation will be given on an example of chopping wave extraction. FIG. 30 is a flowchart showing a processing example to determine the amplitude of the vibrating object according to the number of extremes of the beat wave for an interval from an object turning point to the next turning point.

The extraction step F4 shown in FIG. 29 includes: a turning point identification step G3 according to a beat waveform; an extreme detection step G2 for detecting extremes of the beat waveform; and chopping wave identification steps G5 to G11 where according to the number of the extremes detected by the extreme detection step 2, it is decided whether a chopping wave is present during the aforementioned interval. The object vibration plane turning point can be detected from the chopping wave as follows. The chopping wavelengths are respectively calculated and their distribution is used to determine the turning point. Alternatively, the chopping waves are differentiated to obtain a waveform inclination, and from this inclination information, the wavelength is detected.

More specifically, as shown in FIG. 30, when a beat wave is supplied, firstly the beat wave form is differentiated (step G1). Next, the time axis point ta is detected where the differentiated waveform changes its polarity (plus or minus) (G2). Moreover, a time axis point tb is detected as a vibrating plane turning point (step G3). Furthermore, among the beat wave inclination change points ta, those which are also turning points tb are deleted, and the remaining points ta are defined as td (step G4). Then, referring to FIG. 32C, the number tc of the td points (tan, tan+1 where n is an integer) are counted for the aforementioned interval (step G5).

Subsequently, the tc of a plurality of intervals are averaged (step G6) and the obtained average value is analyzed (steps G7 and G9). If the extreme count tc in one interval is below 1, it is decided that the interval has an S-shaped wave state (step G8, identification of S-shaped state). If the extreme count tc exceeds 2, it is decided that the interval has a first M-shaped state when the amplitude of the vibrating object is equal to or above $\lambda/2$ (step G10). Moreover, if the tc value is between 1 and 2, 1 and 2 included (in the closed interval), it is decided that the interval in the second M-shaped state with the vibration amplitude below $\lambda/2$ (step G11, M-shaped state identification step).

The flowchart of FIG. 30 shows an example identifying two types of M-shaped state.

Figure 31:
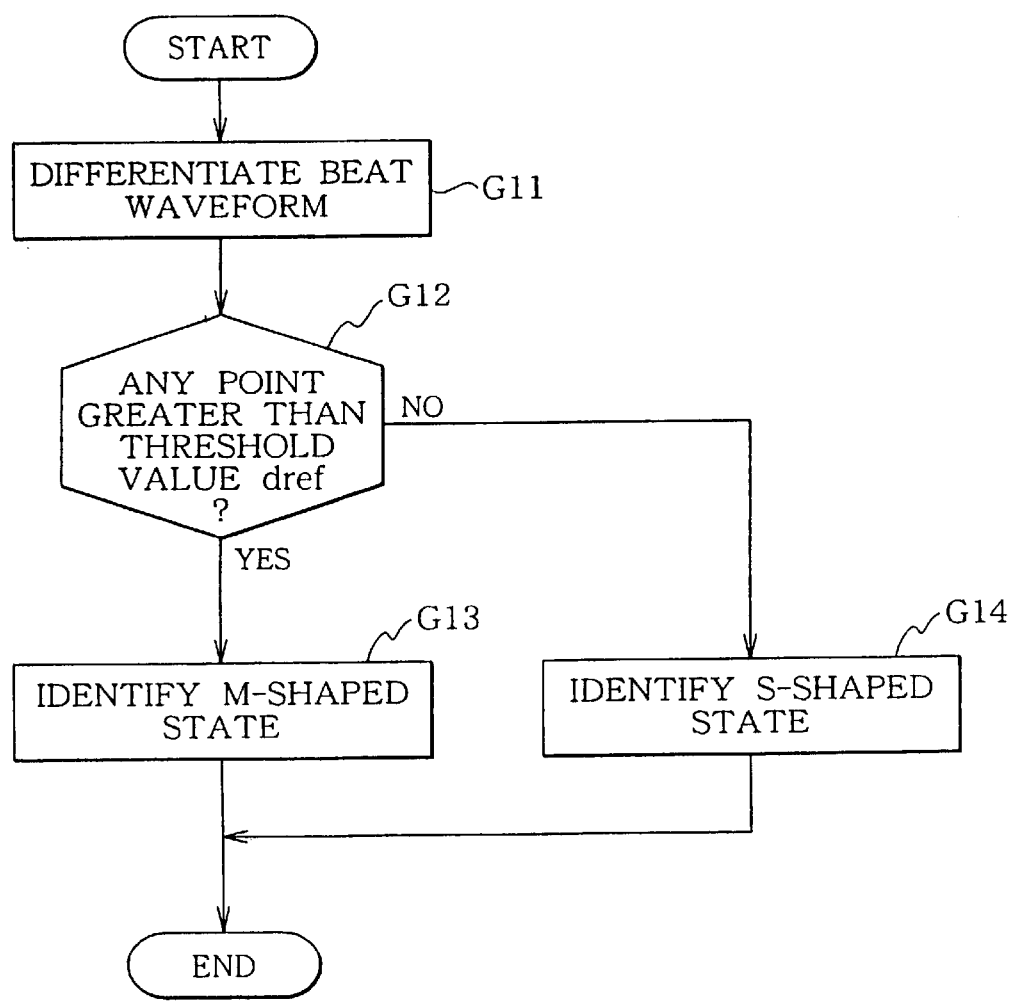
FIG. 31 is a flowchart showing a processing example for identifying the waveform state according to the beat waveform inclination.

On the other hand, if it is sufficient to distinguish the S-shaped state from the other states, the procedure shown in FIG. 31 can be used. If chopping waves are present, the beat wave inclination increases, and if the S-shaped state is present, the inclination decreases. By utilizing this phenomenon, it is possible to decide whether the beat wave is in the M-shaped state or S-shaped state.

More specifically, as shown in FIG. 31, firstly, the beat waveform is differentiated (step G12). Next, it is determined whether any point exceeds a threshold value dref (step G13). If the beat wave has an inclination greater than the threshold dref, it is determined the wave is in M-shaped state (step G14). On the other hand, the beat wave not having an inclination greater than the threshold dref, it is determined that the wave is in the S-shaped state (step G15). This technique of FIG. 31 may be applied when it is difficult to distinguish the M-shaped state and the S-shaped state from each other. In this case, a beat wave not having an inclination greater than the threshold value dref is in the S-shaped state.

Figure 33A:
FIG. 33A shows an example of beat waveform.
Figure 33B:
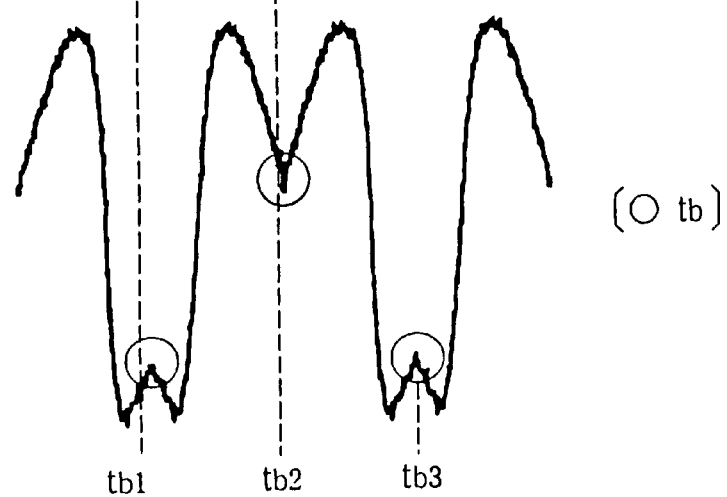
FIG. 33B shows a cyclic interval extracted; and 33C shows the number of peaks in the cyclic interval.
Figure 33C:
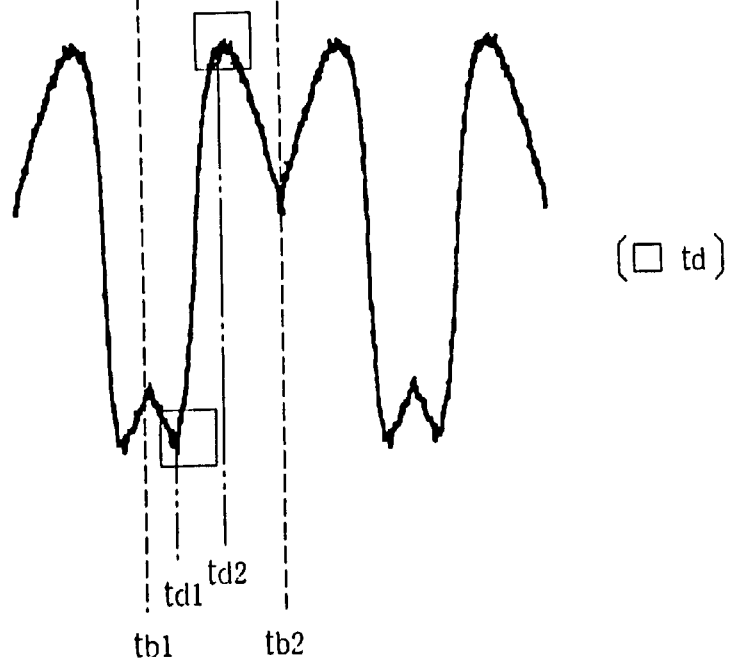
FIG. 33 shows application of the processing of FIG. 30 to the second M-shaped waveform (displacement smaller than $\lambda/2$)
Figure 34A:
FIG. 34A shows an example of beat waveform.
Figure 34B:
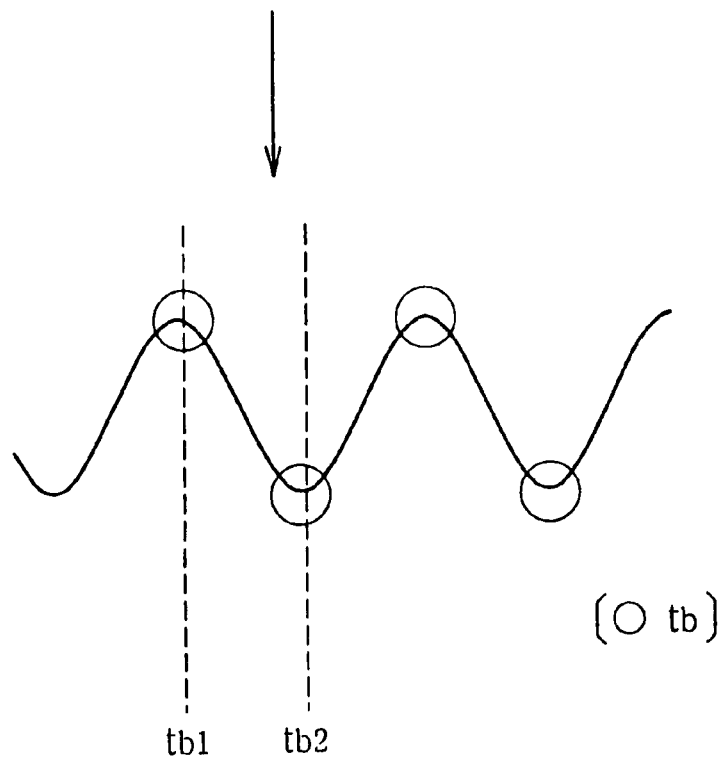
FIG. 34B shows a cyclic interval extracted; and 34C shows the number (0) of peaks in the cyclic interval.
Figure 34C:
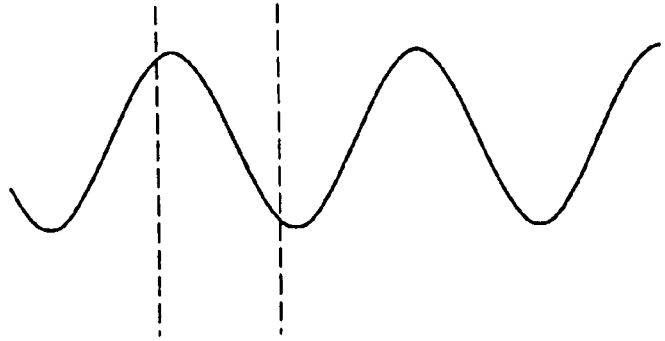
FIG. 34 shows application of the processing of FIG. 30 to the second S-shaped waveform (displacement smaller than $\lambda/2$)

Referring to FIG. 32 to FIG. 34, explanation will be given on an example of processing shown in FIG. 30 and FIG. 31. FIG. 32A shows an M-shaped beat wave having an amplitude equal to or above $\lambda/2$. FIG. 33A shows an M-shaped beat wave having an amplitude below $\lambda/2$. FIG. 34A shows an S-shaped beat wave having an amplitude below $\lambda/2$ or equal to or smaller than $\lambda/2$. Furthermore, as shown in FIG. 32C, five extremes td can be counted in the interval between tb1 to tb2. Thus, the M-shaped beat wave having an amplitude equal to or greater than $\lambda/2$ has a number of extremes in the interval.

As shown in FIG. 33, in an M-shaped beat wave having a mirror image, the number of extremes is two. As shown in FIG. 34, in an S-shaped beat wave, no extremes are present during the interval between two turning points. Accordingly, if an average of the tc values is obtained in step G6 in FIG. 30, it is possible to distinguish the M-shaped wave and the S-shaped wave from each other. Furthermore, for the M-shaped wave, it is possible to determine the amplitude equal to or above, or below $\lambda/2$.

As shown in FIG. 32 and FIG. 33, if the beat wave is M-shaped, the inclination of the beat wave increases. On the other hand, an S-shaped beat wave has inclination smaller than the M-shaped wave. Accordingly, the processing of FIG. 31 enables to distinguish an M-shaped wave and S-shaped wave from each other.

Next, explanation will be given on identification of the amplitude according to the waveform before and after the respective extremes in the beat wave. In this example, the extraction step F4 includes: an extreme counting step for detecting and counting extremes in the beat wave; from the detected extremes, a symmetric wave extreme, extreme in the middle of a symmetric waveform, is extracted and counted; and a chopping wave identification step for deciding that the beat wave has any or no chopping waves according to the symmetric wave extreme count from the symmetric wave extreme counting step and the number of extremes counted by the extreme counting step. The symmetric wave appears when the vibrating object changes its advance direction. Thus, if the symmetric wave count is compared to the total number of extremes including the symmetric waves, it is possible to identify the amplitude of the vibrating object.

Figure 35:
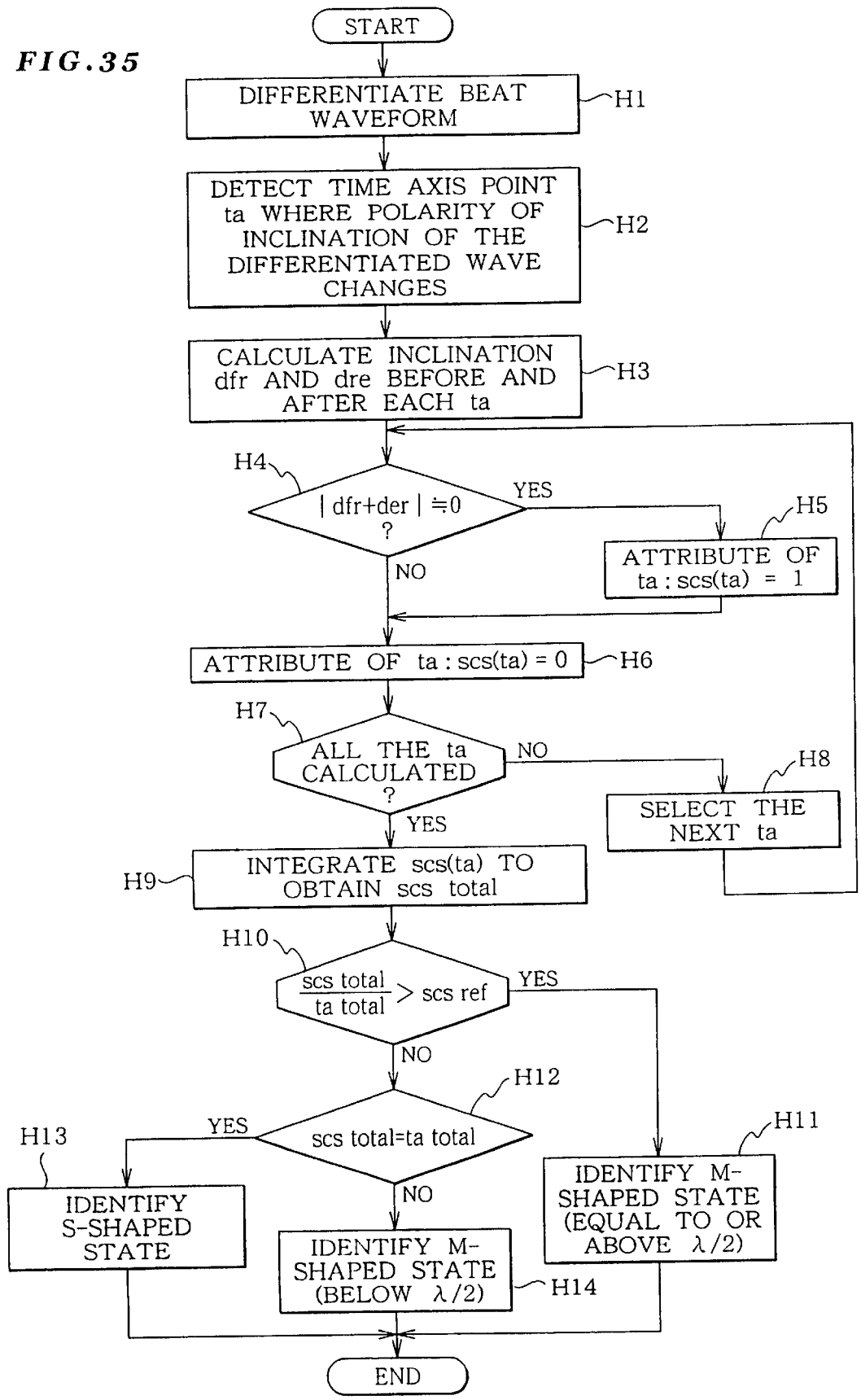
FIG. 35 is a flowchart for identifying a beat wave state according to the ratio of the number of symmetric waveform peaks against the total number of beat wave peaks.

FIG. 35 is a flowchart showing a specific processing example for identifying the amplitude according to the symmetric wave count and the total number of extremes. In FIG. 35, firstly, the beat waveform is differentiated (step H1). Next, the waveform is rectified if necessary. Furthermore, step H2 (extreme detection step) detects a time axis point ta where the inclination of the differentiated waveform is changed. Next, step H3 calculates inclinations dfr and dre before and after each of the ta.

Figure 36A:
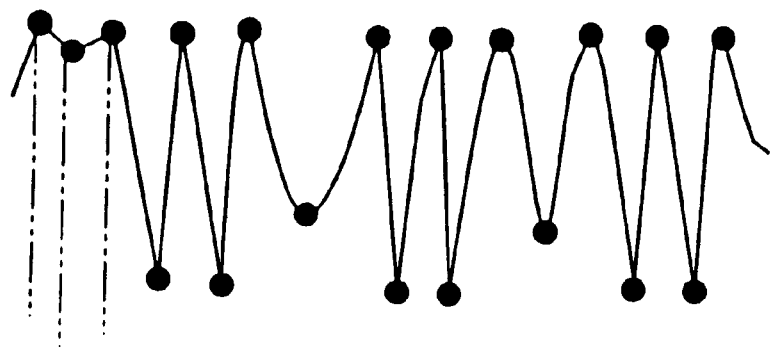
FIG. 36A shows an example of beat wave.
Figure 36B:
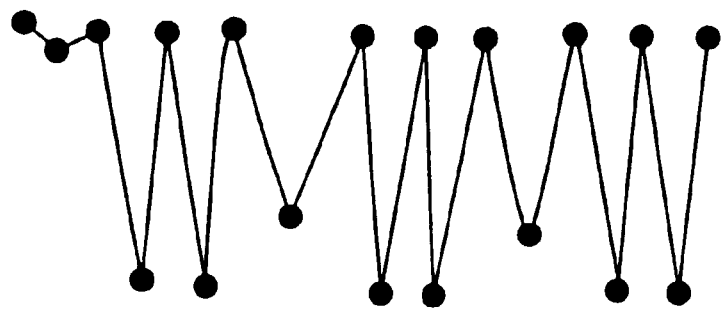
FIG. 36B shows a beat wave which has been rectified.
Figure 37A:
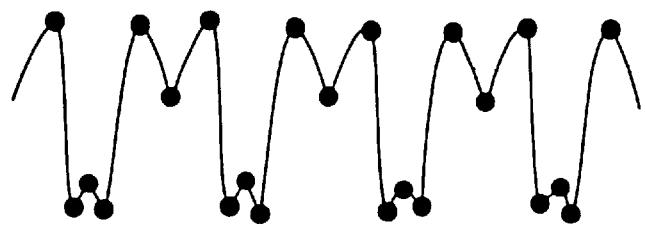
FIG. 37A shows an example of beatwave.
Figure 37B:
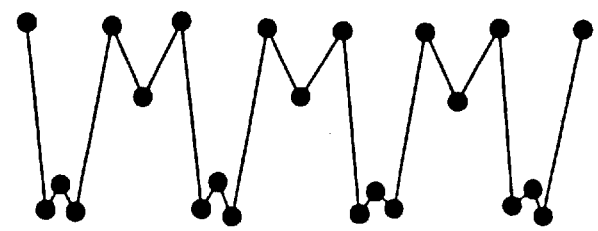
FIG. 37B shows the beat wave which has been rectified.
Figure 37C:
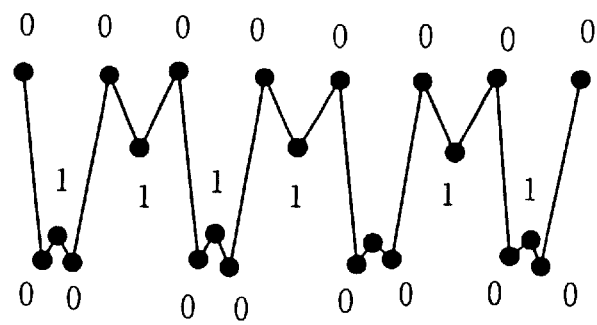
FIG. 37C shows the waveform after calculation to determine whether the peaks are symmetric.
Figure 38A:
FIG. 38A shows an example of beat waveform.
Figure 38B:
FIG. 38B the beat waveform which has been rectified.
Figure 38C:
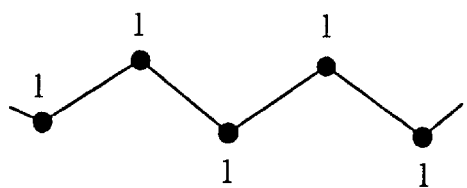
FIG. 38C shows a waveform after calculation to determine whether peaks are symmetric.

Subsequently, step H4 (symmetric wave extreme detection step) checks whether dfr+dre is 0 in order to confirm the ta is in the center of a symmetric waveform. If the wave has a symmetric shape, the extreme is assumed to have an attribute scs(ta) of 1 (step H5). On the other hand, if not symmetric, the extreme is assumed to have an attribute scs (ta) of 0 (step H6). FIG. 36 to FIG. 38 show extreme values of attribute scs (ta), i.e., 1 or 0. FIG. 39 shows relationship between the inclination and the attribute ta.

Next, calculation of the attribute of all the extremes is performed (step H and step H8). When calculation of attribute of all the ta is complete, the scs(ta) values are integrated (added) to obtain a scstotal (step H9). Moreover, the total number of extremes are assumed to be tatotal. The ratio of the total number of extremes with is compared to the number of extremes in symmetric waves (step H10). If this ratio is smaller than the threshold value scref, the number of extremes of symmetric waves is small compared to the total number of extremes, and accordingly, it is possible to identify chopping waves. Consequently, if YES in step H10, it is decided that the vibration amplitude is equal to or greater than $\lambda/2$ and in the M-shaped state (step H11, the first M-shaped state identification).

On the other hand, if the total number of extremes of the symmetric waves "scstotal" is almost identical to the total number of extremes "tatotal" (step H13), it is decided that the wave is in the S-shaped state (step H13, S-shaped state identification). If other than step H11 and H13, it is decided that the wave is in an M-state smaller than $\lambda/2$ (step H14, second M-shaped state identification).

Figure 36C:
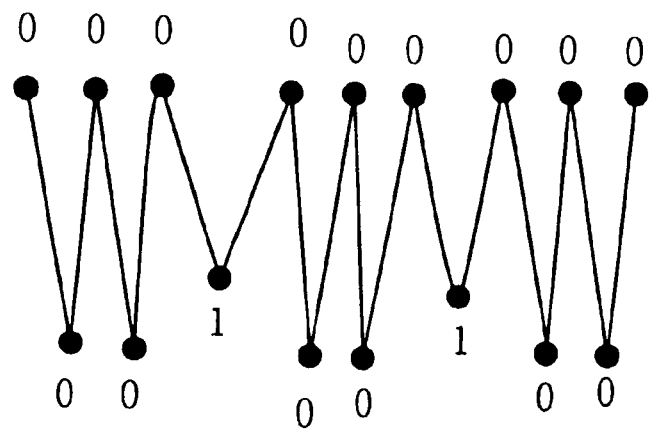
FIG. 36C shows an example after calculation to determine whether the peaks are symmetric.

As shown in FIG. 36C, in a case of chopping waves, the number of extremes of the symmetric waves (scstotal) denoted by "1" as the turning point positions is 2, while the total number of the extremes denoted by "0" is 17. $2/17$ is smaller than $1/3$, and step H10 in FIG. 35 results in Yes, and it is decided to be in an M-shaped state of $\lambda/2$ or above. In the example of FIG. 37, the total number of the extremes of the symmetric waves (scstotal) is 7, while the total number of the extremes (tatotal) is 16. $7/16$ is greater than $1/3$, it is decided that the wave is in M-shaped state of less than $\lambda/2$.

In the example of FIG. 38, scstotal=tatotal=5, and it is decided the wave is S-shaped.

As has been explained above, acccording to the fourth embodiment, a beat wave is identified as M-shaped or S shaped according to an object displacement turning position and the number of extremes contained in two adjacent turning positions. This beat wave analysis enables to easily and accurately identify the beat wave state (M-shaped, S-shaped) serving as a base for calculating the vibration amplitude and the vibration cycle.

If a beat wave has chopping waves, the first identification step decides that the amplitude of the object to be measured is equal to or greater than the $\lambda/2$, where $\lambda$ represents laser light wavelength. On the other hand, when no chopping waves are present in the beat wave, the amplitude of the object to be measured is decided smaller than $\lambda/2$.

By properly setting a predetermined interval such 3 seconds, it is possible to know which interval has amplitude below $\lambda/2$. This enables to perform a vibration analysis according to the waveform such as a chopping wave, M-shaped wave, S-shaped wave or the like. Moreover, in a case of a vibrating object attenuation, even if attenuated below $\lambda/2$, the beat wave is divided into a region of $\lambda/2$ or above and a region below $\lambda/2$, so that a corresponding processing can be selected. Accordingly, it is possible to accurately identify the attenuation.

<Embodiment 5>

Description will now be directed to the fifth embodiment for identifying a vibrating object amplitude using a frequency spectrum instead of waveform of a beat wave, with reference to FIG. 40 and FIG. 19 to FIG. 25.

Figure 40:
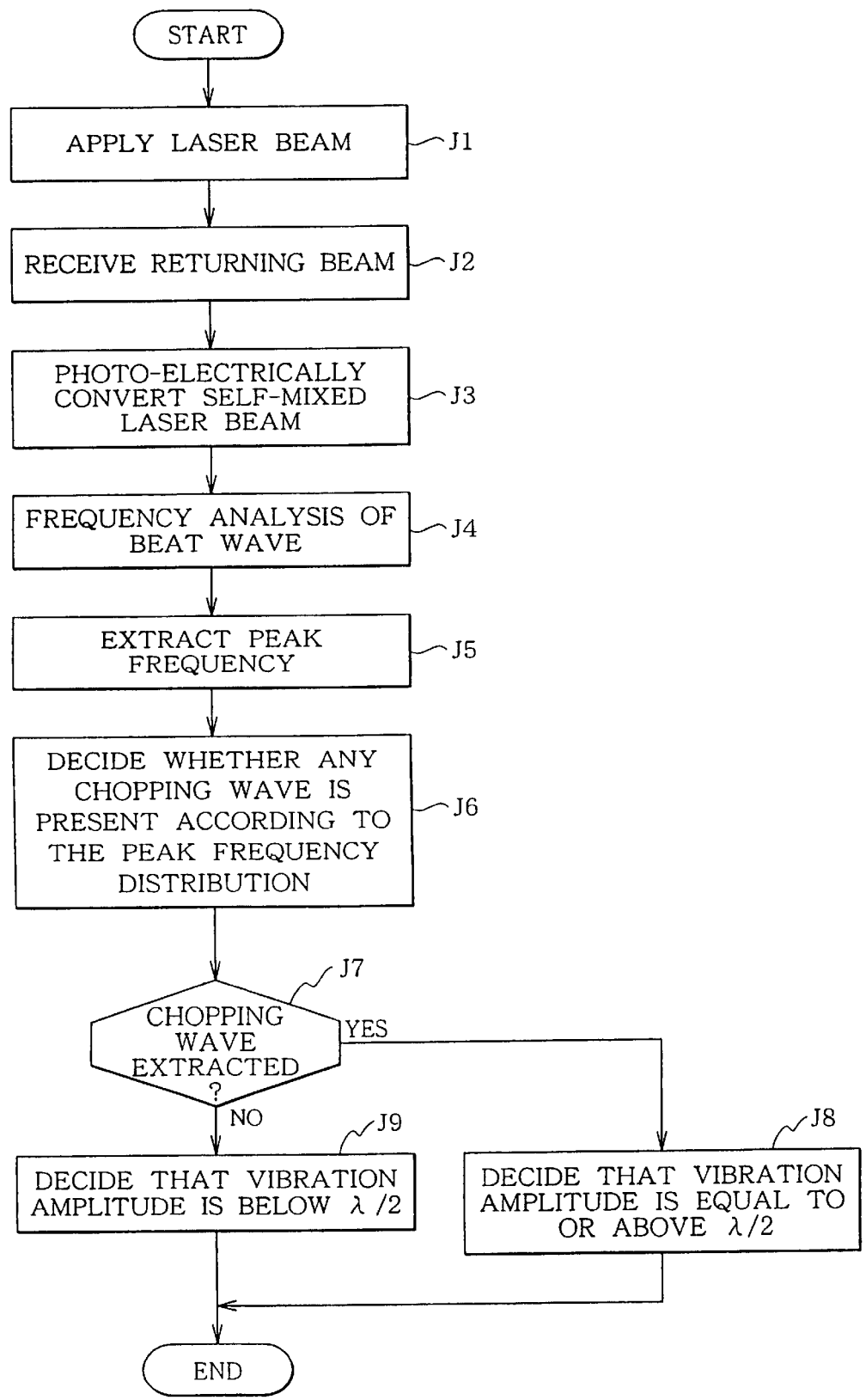
FIG. 40 is a flowchart showing the fifth embodiment of the present invention.

FIG. 40 is a flowchart showing a processing example according to the present embodiment. This processing example includes: a radiation step (step J1) for applying a laser light from a laser resonator; light receiving step (step J1) for receiving a reflected light of the laser light; a photoelectric conversion step (step J3) for photo-electrically converting the mixture of the oscillated light and the reflected light; and a signal processing procedure for analyzing the waveform of the beat wave output from step J3.

The signal processing procedure includes: a frequency analysis step (step J4) for analyzing the frequency of a predetermined interval of the beat wave; frequency extraction step (step J5) for extracting a frequency appearing as a peak of the frequencies analyzed in J4; an identification step (step J6) for deciding whether the beat wave contains a chopping wave according to the distribution and strength of the peaks extracted in J5; a first decision step (step J8) for deciding that the amplitude of the object is equal to or greater than the half of the wavelength of the laser light if the beat wave is determined to contain a chopping wave (step J7); and a second decision step (step J9) for deciding that the amplitude of the object is smaller than the half of the wavelength of the laser light if no chopping waves have been identified (step J7).

As shown in FIG. 19 and FIG. 20, in a case of a second M-shaped beat wave when the vibration displacement is smaller than $\lambda/2$, its frequency spectrum is stepped. This is because the turning point of the vibrating object has its greatest peak in the lowest band and no peaks appear in the intermediate and high band.

Figures 25A, 25B:
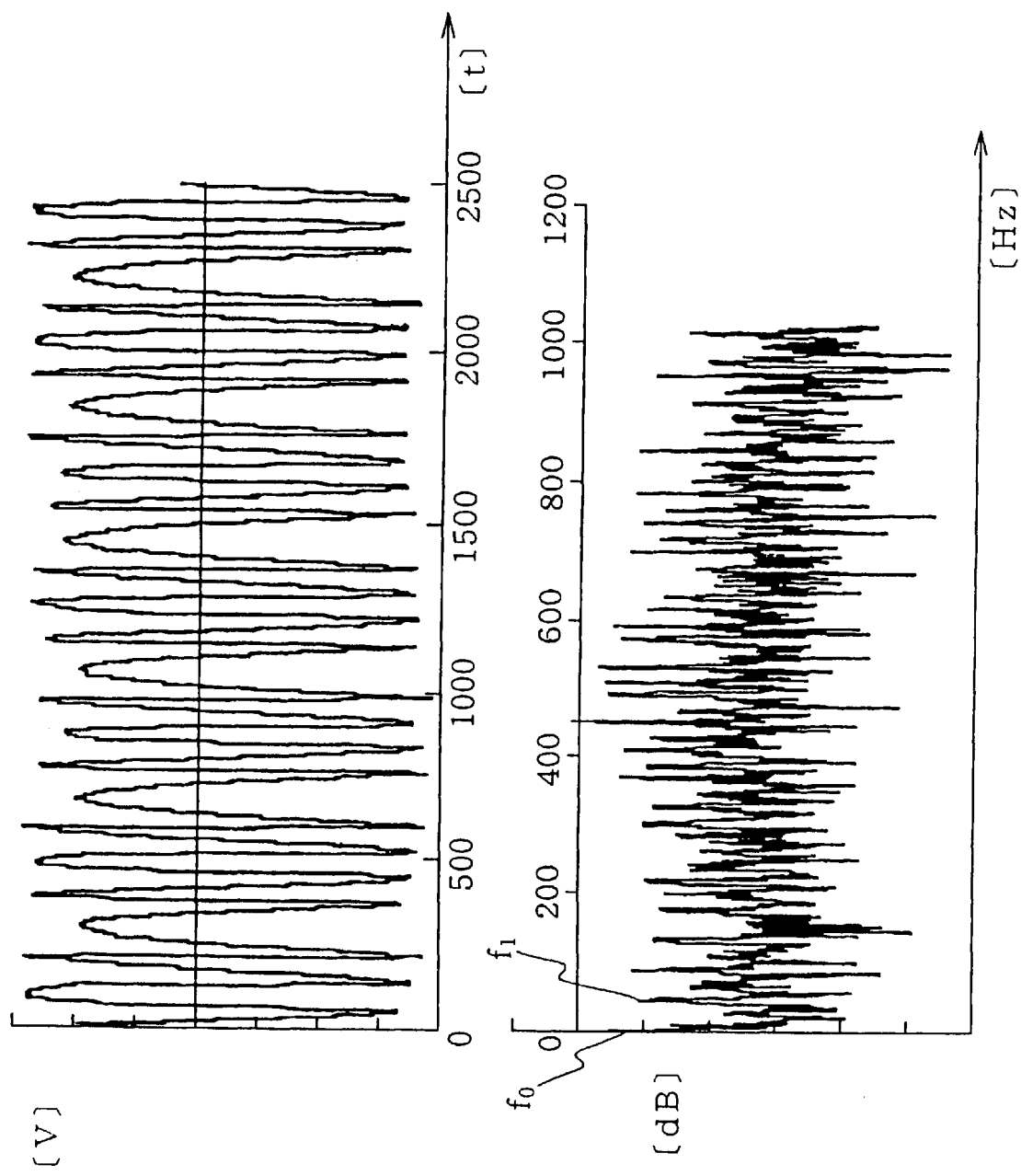
FIG. 25A shows a beat wave form of the first M-shaped state and FIG. 25B shows its frequency spectrum as a second example.

On the other hand, as shown in FIG. 24 and FIG. 25, when the vibrating object has a vibration displacement equal to or greater than $\lambda/2$, for each $\lambda/2$, a single chopping wave is generated. The wavelength of this chopping wave becomes shorter as the vibration speed becomes high. The beat waves in FIG. 24A and 25A were subjected to frequency analysis, and the spectra shown in FIG. 24B and FIG. 25B were obtained, respectively. When chopping waves are present in the beat wave, peaks appears in the intermediate band having a greater value than the basic vibration cycle of the vibrating object appearing at a low band.

Moreover, when the vibration amplitude of the vibrating object is in an S-shaped state, the vibration frequency of the vibrating object is directly reflected in the frequency spectrum. In this case also, the basic vibration frequency appears in a lower band. Accordingly, by confirming whether the lowest peak or the next lowest peak in the frequency spectrum is present in the intermediate or higher band, it is possible to determine whether chopping waves are present. Depending on whether a copping wave is present or absent by the frequency analysis, it is possible to determine whether the amplitude of the vibrating object exceeds $\lambda/2$. That is, if a large peak is present in the intermediate band, it is possible to decide that the vibrating object has a vibration amplitude exceeding $\lambda/2$.

<Embodiment 6>

Description will now be directed to object inspection using the aforementioned vibration measurement apparatus according to the sixth embodiment with reference to FIG. 41 to FIG. 52.

Figure 41:
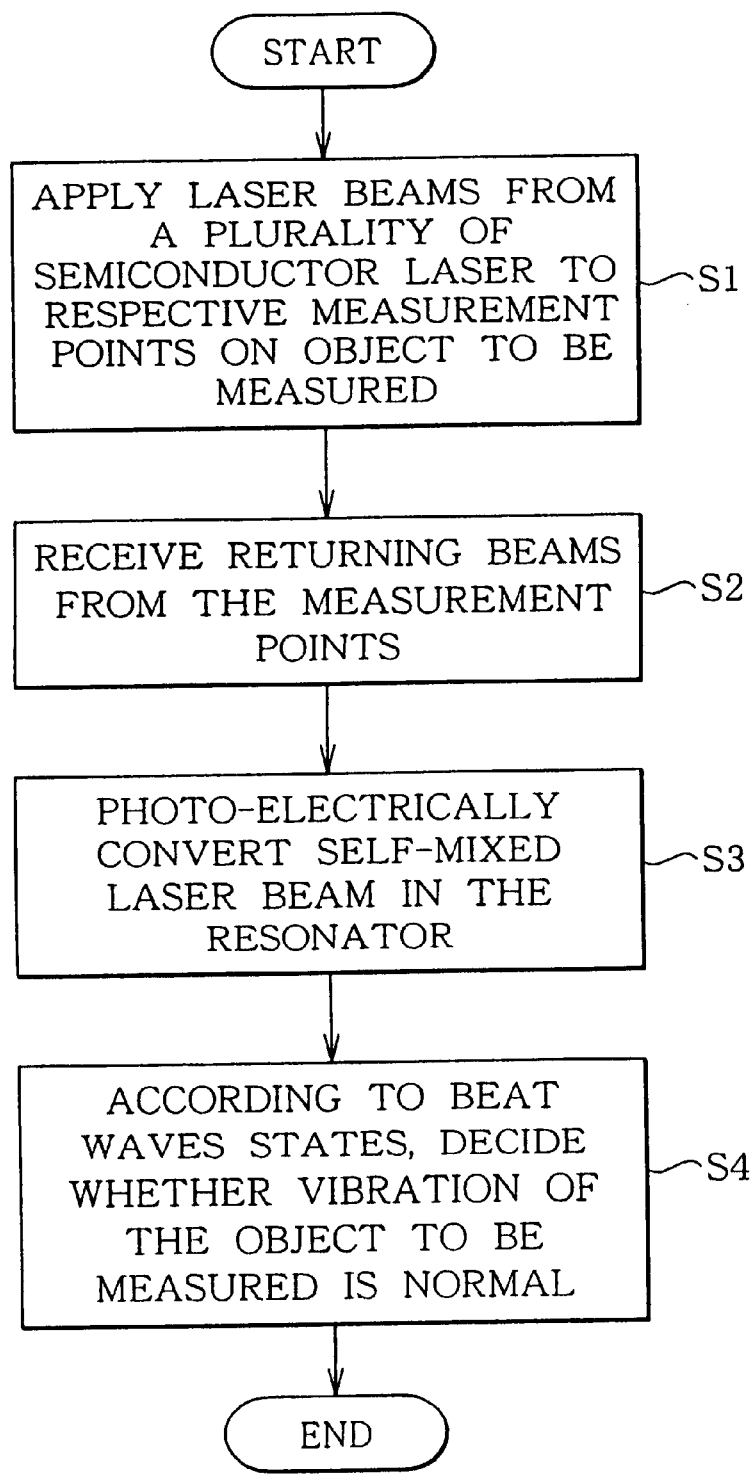
FIG. 41 is a flowchart showing the sixth embodiment of the present invention.

FIG. 41 is a flowchart of the object inspection method according to the sixth embodiment. As shown in FIG. 41, the inspection method according to the present embodiment includes: a radiation step (Step S1) for applying a plurality of laser beams oscillated by a plurality of laser resonators to a plurality of points of an object to be measured (inspected); a light receiving step (step S2) for receiving reflected beams from the respective points of the object to be measured; a photo-electric conversion step (step S3) for photo-electrically converting a self-mixture of the laser beam oscillated in the resonator and the returning laser beam reflected; and vibration evaluation step (step S4) for deciding whether the vibration of the object to be measured is normal, according to the waveforms of the respective beat waves output from the photo-electrical conversion step S3.

In the example of FIG. 41, a plurality of laser beams are simultaneously applied to a plurality measurement points in the object to be measured. Here, the laser beams are applied not only the object displacement direction but also various directions according to the defect to be detected. That is, a multi-point simultaneous measurement is performed. Each of the laser beams is reflected from the corresponding measurement point and enters the laser resonator. The oscillated beam and the returning beam are self-mixed with each other, generating a beat wave.

Figure 42:
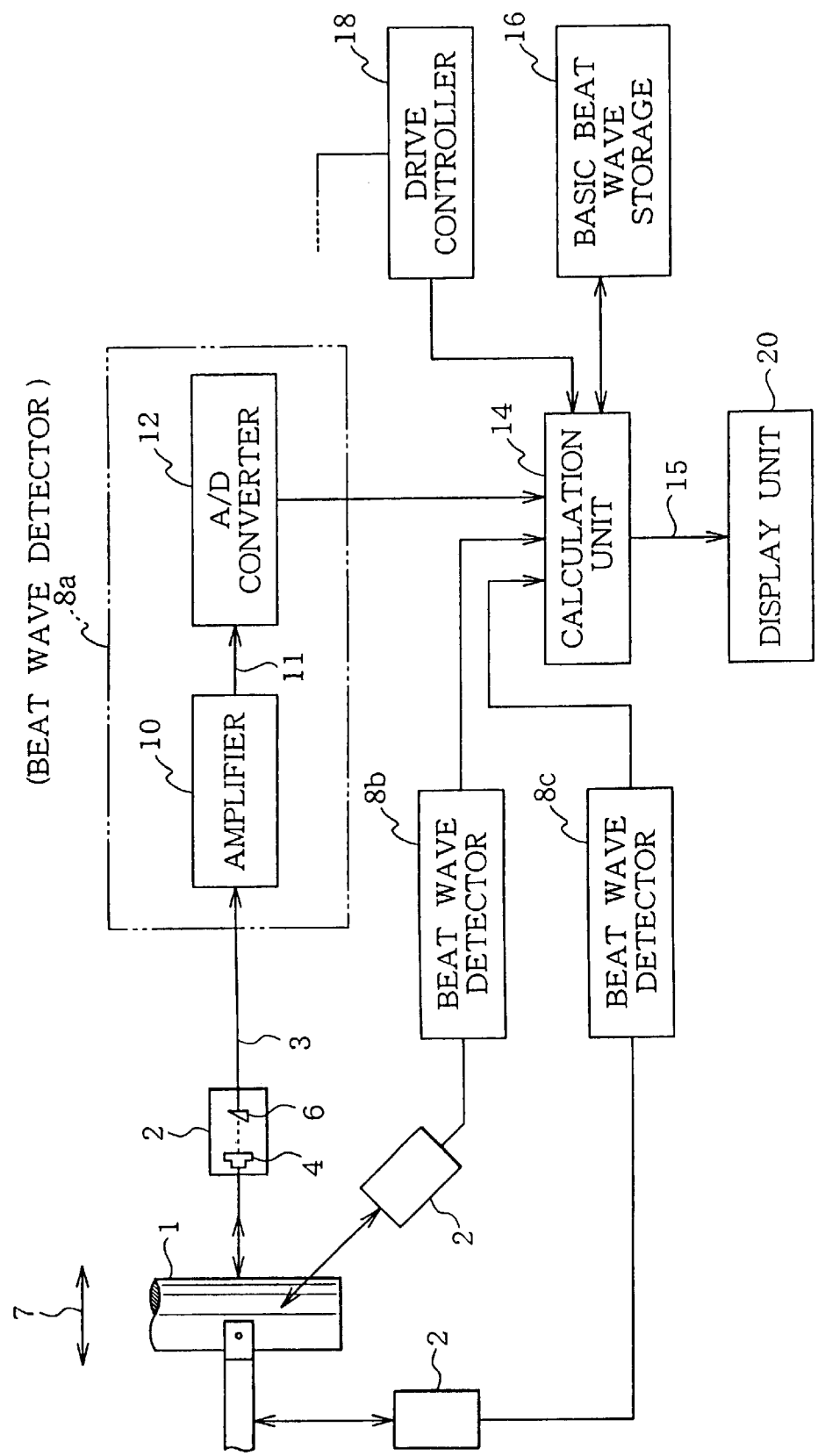
FIG. 42 is a block diagram showing a configuration of a vibration measurement apparatus according to the present invention.

Next, explanation will be given on the object inspection apparatus according to the present invention with reference to FIG. 42. The inspection apparatus detects a defect of the object 1 vibrating in the direction 7. The object may be a junction device, cutting apparatus, drive apparatus and the like used in producing various products. In the example of FIG. 42, the vibrating object is a cylindrical body vibrating from right to left. In order to measure vibration at a plurality of points of this object, three semiconductor lasers 2a, 2b, 2c are used. Signals output from the respective semiconductor lasers 2a, 2b, 2c are supplied to beat wave detection units 8a, 8b, 8c, respectively. In each of the beat wave detection units, the signal input is amplified by an amplifier and is converted into a digital data. This digitized beat wave is analyzed in the calculation unit 14.

Moreover, it is possible to perform signal processing of an analog data without converting the beat wave into a digital data.

This inspection method enables to perform a real time inspection during an operation of the junction device, cutting device, drive apparatus, and the like. The calculation unit 14 may be a work station, microcomputer, personal computer, and the like including a main storage unit and a CPU.

Furthermore, the calculation unit 14 may be connected to a reference beat wave storage 16 for storing a beat wave of a normal operation as a reference beat wave. The normal beat wave is compared to a beat wave being measured, so as to detect a defect if any. Moreover, the calculation unit 14 may be connected to a drive control unit 18 for driving the object 1 to be measured, so that a drive frequency information of the object can be obtained from this drive control unit. The object driven with a certain cycle vibrates with this drive frequency. If any crack or attachment failure is present, the beat wave is overlain by a frequency component other than the vibration frequency component by the drive frequency. Thus, it is possible to detect a defect by comparing the drive frequency from the drive control unit 18 with the vibration frequency of the object to be measured.

Next, explanation will be given on measuring points for the radiation step of FIG. 41. For example, if a measuring point is on a curved portion of the object, it is preferable to set a radiation direction on the center of that curvature. In the example FIG. 43, a semiconductor lasers 2A and 2B irradiate a laser beam toward the center of the curvature of the object. Moreover, the radiation step S1 may include a step for setting a laser beam application direction toward a reflection changing measurement point where the laser is reflected or not reflected and the reflection angle changes depending on the vibration of the object to be measured. In the example of FIG. 43, the semiconductor laser 2C applies a laser beam to the reflection changing measurement point. When a laser beam is applied to this reflection changing measurement point, the evaluation step S4 may include a step for identifying a periodicity of the vibration of the object to be measured, according to a return beam from the reflection changing measurement point.

Moreover, the radiation step S1 may include: a step for setting a laser beam application position toward a measurement point moving according to the vibration of the object 1; and a step for increasing a beam spot diameter of the laser so as to be greater than a reference. In FIG. 43, the semiconductor laser 2B applies a laser beam to this moving measurement point. In this case, the beam spot diameter indicated by reference numeral 13 is approximately equal to the vibration displacement multiplied by 2. This enables to decrease the affect the measurement point movement due to vibration displacement.

Figure 43A:
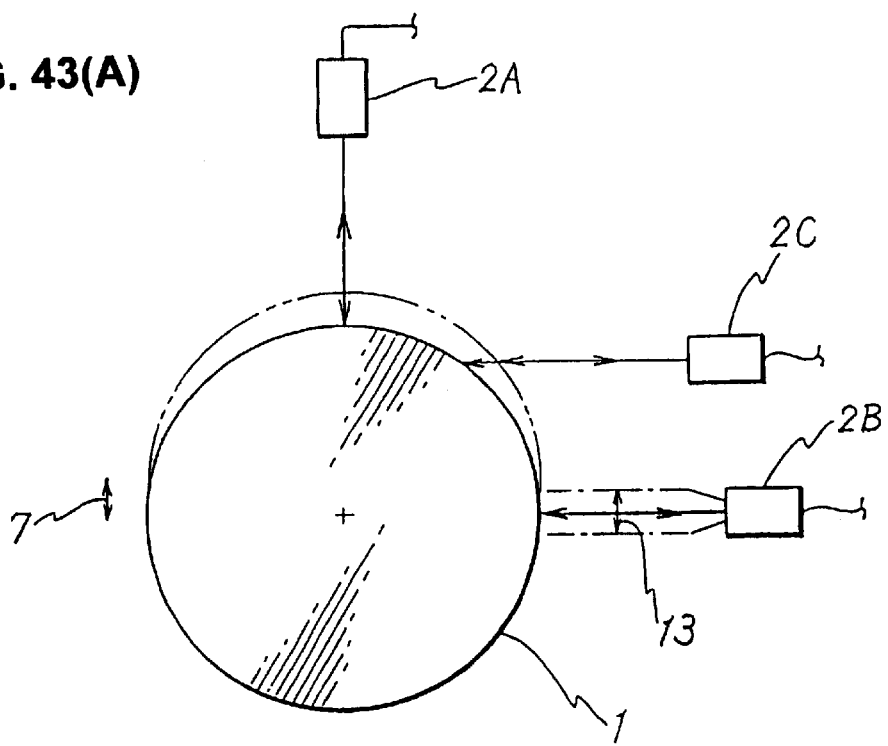
FIG. 43A is a plan view and FIG. 43B is a side view.
Figure 43B:
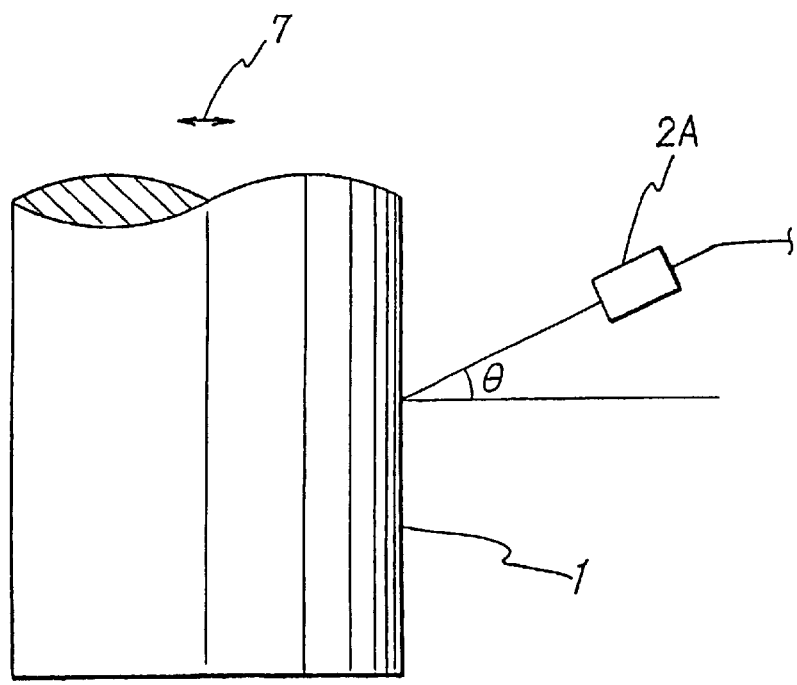

The radiation step S1 may further includes a step for setting the laser beam, as shown in FIG. 43B, at an angle $\theta$ against the vibration direction 7 on a single plane containing the vibration direction. That is, a predetermined angle $\theta$ is defined against the vibration (displacement) direction of the object to be measured, and the laser beam is applied at this angle, which enables to obtain $1/\cos \theta$ of the displacement amount of the vibrating object and making the beat wave S-shaped.

In the self-mixing type laser Doppler vibration meter (with laser oscillation wavelength $\lambda=780$ nm), when the object has displaced $\lambda/2$, i.e., 390 nm, a chopping wave appears as an output signal. Here, if the vibration amplitude is equal to or greater than $\lambda/2$, the beat wave is called M-shaped state, and if the vibration amplitude is smaller than $\lambda/2$, the beat wave is called S-shaped state. When performing a measurement, the laser angle can be adjusted so that the amplitude range is in the S-shaped. Then, the resulting beat wave amplitude fluctuates in the same way as the vibration of the object to be measured. Accordingly, bonding failure having an amplitude change can easily be detected.

FIG. 44 shows a reflection direction changing measurement point.

Figure 44A:
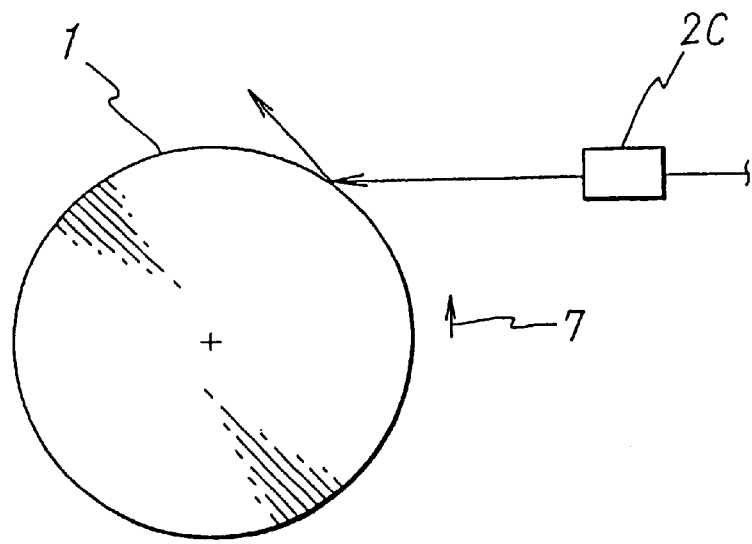
FIG. 44A shows a laser beam optical path in the state shown by a solid line in FIG. 43A.

In the examples of FIG. 44A and FIG. 43A (shown in a solid line), the beam is reflected at an obtuse angle and almost no light returns to the semiconductor laser.

Figure 44B:
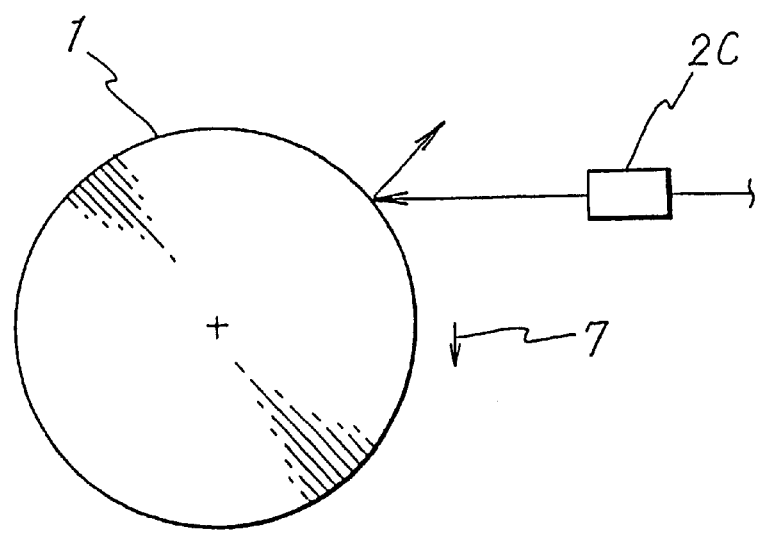
FIG. 44B shows a laser beam optical path in the state shown by the alternate long and two short dashes line in FIG. 43A.

On the other hand, in the examples of FIG. 44B and FIG. 43A (shown by alternate long and two short dashes line), the beam is reflected at an acute angle with respect to the semiconductor laser 2C and some returning light enters the laser resonator. From such a reflection changing measurement point, it is possible to obtain the second waveform from the top in FIG. 45. That is, each on cycle of the vibrating object generates one peak. This peak has a small width as shown by 2Ca in FIG. 45, and small amplitude. Thus, by measuring the reflection changing measurement point, it is possible to easily gent a vibration cycle of the object to be measured.

The semiconductor laser 2A shown in FIG. 43 generates an S-shaped state as shown at the top of FIG. 45, and it is possible to detect an amplitude change. The beat wave obtained by the semiconductor laser 2B in FIG. 43 generates a wave almost a straight line because the same scale as the S-shaped state is applied. When the waveform of the semiconductor laser 2B is amplified, it is possible to obtain identical to that of the laser head A multiplied by 2.

As a specific inspection technique, it is possible to compare a preceding waveform data with a current waveform data and the difference between them is used for detecting a defect. For comparison, it is also possible to use (i) a typical waveform in the past for no defect; (ii) a waveform data averaged from past preferable data items; (iii) a waveform data which has learned the past data items to have characteristics extraction by neural network; (iv) an externally input waveform data which can be referenced. The data to be referenced can be selected, depending on the inspection accuracy and an available period of time.

Moreover, it is also possible to compare a drive frequency of an object to be measured, with a vibration frequency of the object. In this case, the evaluation step (S4) in FIG. 41 includes: a calculation step for calculating a vibration frequency of the object according to a beat wave; a comparison step for comparing the vibration frequency with a drive frequency of a drive unit for vibrating the object to be measured; and an evaluation step to decide "defective" if the vibration frequency does not match with the drive frequency.

As has been described above, according to the present embodiment, using the self-mixing type laser Doppler vibration meter constituting a small-size light-weight laser head, it is possible to detect a vibration state of an object to be measured even during operation of the object. Moreover, by using the self-mixing type laser Doppler vibration meter, it is possible to detect a defect accompanied by the vibration amplitude change. Furthermore, as shown in FIG. 43, if a multi-point simultaneous measurement is performed, it is possible to increase the defect detection accuracy. Furthermore, a combination of beat waves enables to presume the defect type.

Moreover, according to the present embodiment, comparison with a single normal state waveform enables to detect a defect, and by using a plurality of normal state waveforms, it is possible to further increase the inspection accuracy. Furthermore, data on a plurality of normal waveforms can be stored in memory, enabling to add waveform processing to the data for emphasizing the waveform features, for example. In stead of processing a waveform itself, it is possible to use a data on extracted characteristics of the waveform such as an envelope. This increases the processing speed and reduces the apparatus weight. Moreover, the comparison processing performed for the frequency and phase can be increased in speed with simplified evaluation by using an external input waveform as a reference.

Furthermore, depending on the necessary accuracy, response speed, memory capacity, and other conditions, it is possible to select a reference data used for evaluation. By simultaneously using a plurality of small-size laser heads, it is possible to detect a vibration change in two or three dimensions. Moreover, by comparison with a single normal state wave, it is possible to detect an abnormal state if any. Furthermore, a number of normal state waveforms can be stored in memory, it is possible to use an averaged value and a neural network for identifying a waveform itself or emphasizing particular features of the waveform. In stead of using the beat waveform itself alone, it is possible to use some extracted features such as an envelope. This increases the processing speed and reduces the weight of the apparatus.

As has been described above, according to the sixth embodiment, a multi-point simultaneous measurement can be performed. For example, it is possible to select various points for obtaining a beat wave: a vibration plane having a normal vector having a direction identical to a vibration direction, a curved measurement point, reflection change measurement point, moving measurement point, non-vibrating point in a normal state. Furthermore, the evaluation step decides vibration state (normal or abnormal) according to the displacement change of the beat wave. Accordingly, when an abnormal vibration is generated, this abnormality can be detected immediately.

<Example of Embodiment 6>

Next, explanation will be given on an example of junction evaluation apparatus for a wire bonding apparatus. As shown in FIG. 46, the wire bonding apparatus includes: an ultrasonic oscillator for oscillating an ultrasonic oscillation; a horn 71 for transmitting the ultrasonic vibration to a junction object; and a capillary provided at the tip end of the horn 71 for applying a load to a bonding wire 89.

On the other hand, the junction evaluation (inspection) apparatus includes: a laser resonator for applying a laser beam following the movement of the object to be measured and receiving a return light (reflected beam); a photo-detector for receiving a laser light generated by self mixing in the laser resonator 2; a beat wave output unit for detecting a beat wave from the signal from the photo-detector 6; a signal processing unit 60 for using the beat wave for evaluating normal/abnormal state of the vibration of the object to be measured.

In this example, a laser head 2 consisting of a semiconductor laser and a lens is fixed on the wire bonding apparatus for checking an abnormal vibration during bonding operation. The laser head 2 is fixed, for example, at a position extended in the oscillation direction of the ultrasonic oscillator from the capillary of the wire bonding apparatus 73. If necessary some angle is defined at the top and bottom so as to obtain the S-shaped state. For example, if the laser head is arranged at a distance of 20 mm from the capillary, it is possible to obtain a sufficient returning light without interference with another apparatus. The capillary vibration state which has been converted into an electric signal by the semiconductor laser is input to the signal processing unit and, if necessary, information is sent to an operation apparatus (not depicted) of the wire bonding apparatus.

When the self-mixing type laser Doppler vibration meter is used, it is possible to constitute a small size and small weight laser head using a semiconductor laser. Accordingly, this can be applied for detecting the vibration state of the bonding apparatus, and it is possible to constitute a real time vibration monitoring system for the horn 71 or the capillary 73 fixed at the tip end of the horn.

Figure 47:
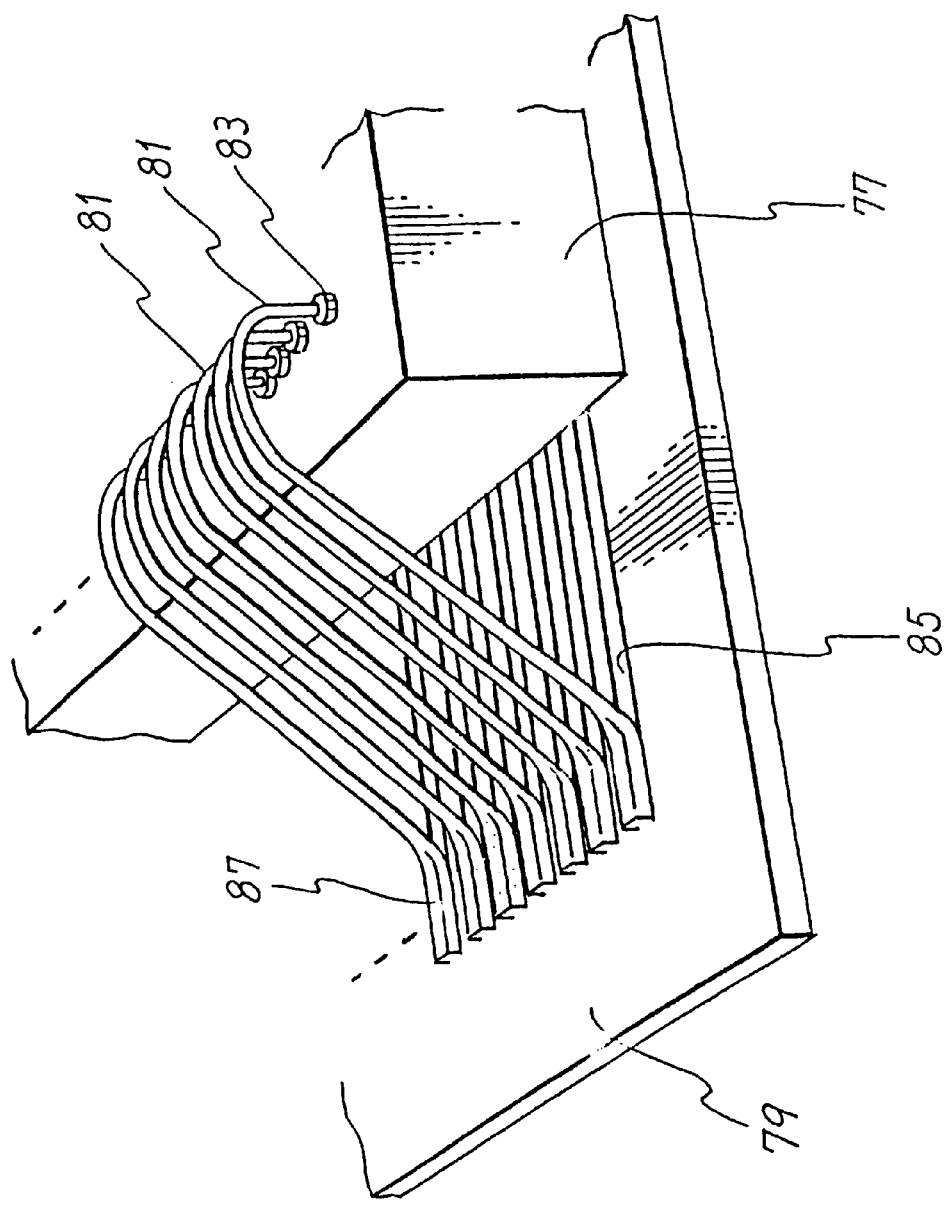
FIG. 47 is a perspective view of connections made by the wire bonding apparatus shown in FIG. 46.

FIG. 47 is a perspective view of a junction example by the wire bonding apparatus of FIG. 46. Here, a terminal 83 of the silicon chip 77 which serves as a kernel of an IC or LSI is connected to a lead frame 85 by a wire 81.

Figure 48:
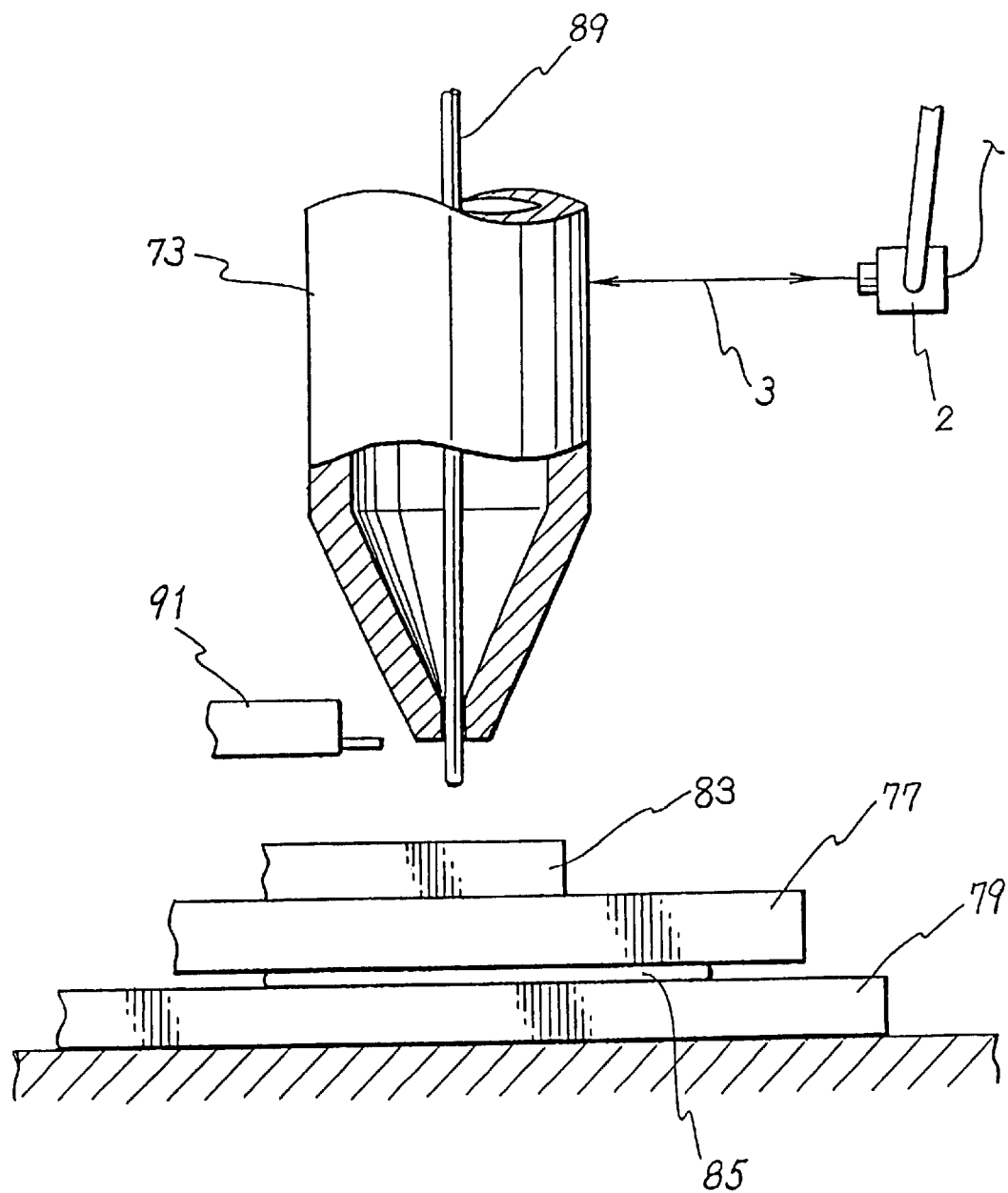
FIG. 48 is an enlarged view of the capillary shown in FIG. 46.

As shown in FIG. 48, capillary 73 is a hollow member and is supplied with a wire. For example, the silicon chip 77 is arranged on a substrate 79 and fixed to the substrate by an adhesive 85. A jig is used for fixing a fixed table of the wire bonding apparatus and the substrate 79.

Figure 49A:
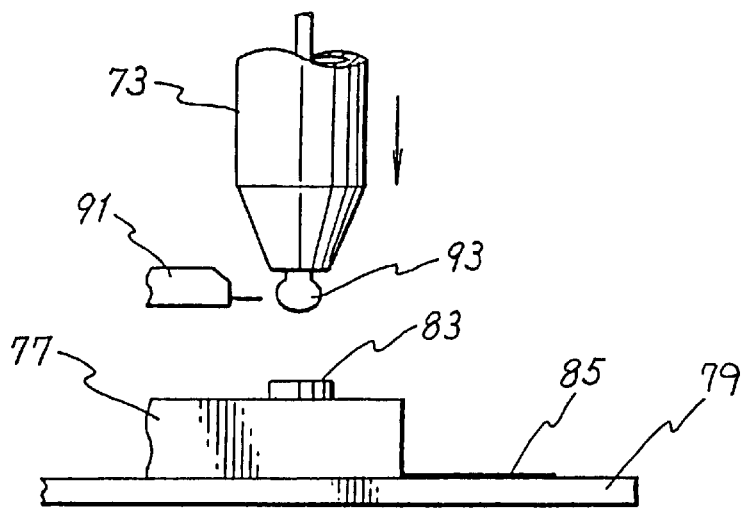
FIG. 49A to FIG. 49C shows a process of wire bonding performed by the wire bonding apparatus shown in FIG. 46.
Figure 49B:
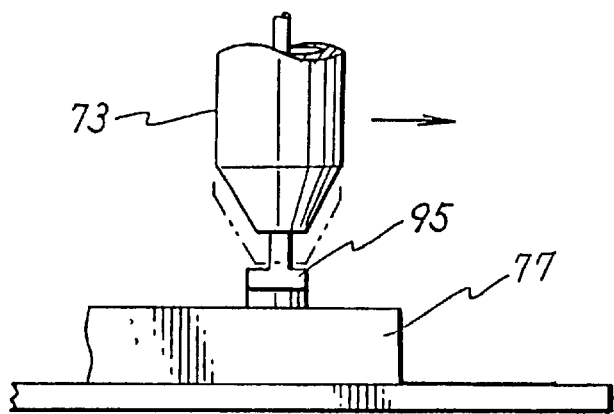
Figure 49C:
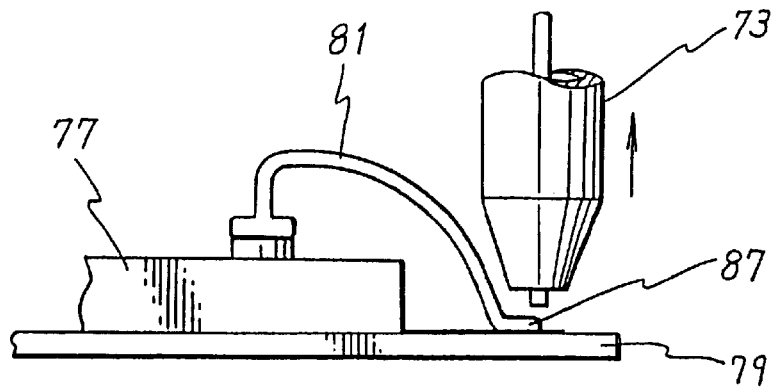
Figure 50A:
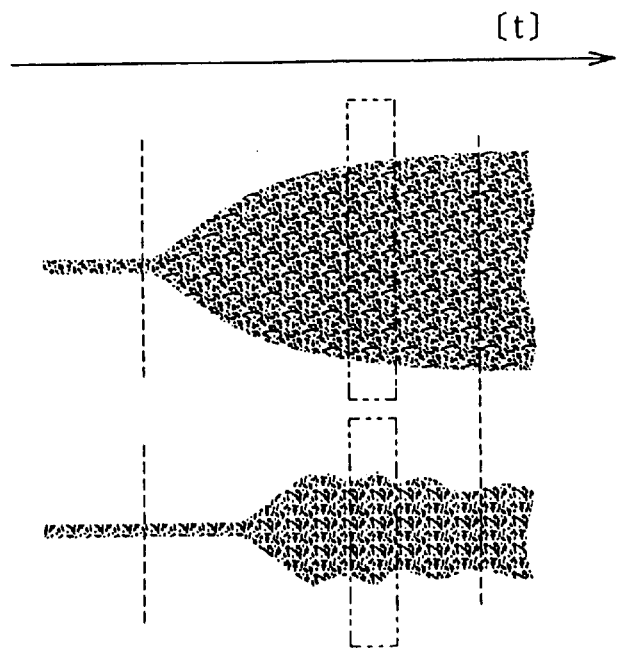
FIG. 50A shows an example of oscillator drive current waveform.
Figure 50B:
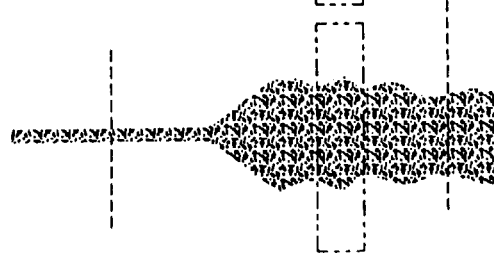
FIG. 50B shows an example of beat wave.
Figure 50C:
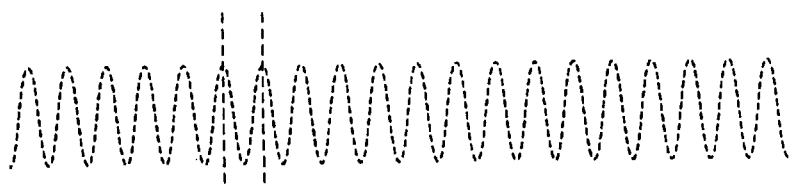
FIG. 50C is an enlarged view of the portion indicated by the alternate long and two short dashes line in FIG. 50A.
Figure 50D:
FIG. 50D is an enlarged view of the portion indicated by the alternate long and two short dashes line in FIG. 50B.

FIG. 49 shows a wire bonding procedure. Firstly, as shown in FIG. 49A, a gold ball 93 is formed at the tip of capillary by an electric torch 91. Next, as shown in FIG. 49B, the horn is lowered so that the gold ball is attached to the terminal 83 of the silicon chip. This is performed when the tip of the capillary is lowered to the position indicated by alternate long and two short dashes line, and load and heat are applied simultaneously with a ultrasonic oscillation of about 60 kHz. Thus, the terminal 83 of the chip 77 is fixed to each other. Furthermore, the horn 71 is moved to the lead frame 85 and the wire is fixed to the lead frame. This bonding apparatus repeatedly moves, so that a number of wire connections are made on the chips on the fixed table in FIG. 48.

Next, explanation will be given on the defect detection procedure in the wire bonding explained with reference to FIG. 46 to FIG. 49. In the Example of FIG. 46, the signal processing unit 60 has a function to identify a defect of the object to be measured, according to a change of the beat wave amplitude. When the silicon chip 77 is connected to a wire by the capillary 73, the vibration energy is used for the work of junction, and the vibration amplitude of the object to be measured such as capillary 73 becomes small. Accordingly, the signal processing unit 60 can check the beat wave amplitude at the timing of junction, so as to determine whether the junction is normal.

Moreover, it is preferable that the junction evaluation system include a reference beat wave storage 62 for storing a normal beat wave when the object to be measured has vibrated normally, and the signal processing unit 60 compare this reference beat wave stored in the reference beat wave storage 62 with a beat wave output from the beat wave output unit 8, so that the comparison decides whether the vibration of the object has been normal. This enables to detect with a high speed whether the vibration amplitude during the junction or the movement is increased or decreased normally.

FIG. 50 shows a beat wave according to a capillary vibration during a preferable bonding and an example of a drive current of the ultrasonic oscillator. FIG. 50A shows a drive current applied to the ultrasonic oscillator; and FIG. 50B shows an S-shaped beat wave. The portions defined by alternate long and two short dashes line of FIG. 50A and FIG. 50B are enlarged in FIG. 50C and FIG. 50D, respectively. As shown in FIG. SOC and FIG. 50D, the oscillation frequency applied to the ultrasonic oscillator is matched with the frequency of the vibration waveform measured. By observing a difference in frequency and cycle of the oscillation frequency applied to the ultrasonic oscillator and the vibration waveform measured, it is possible to detect a bonding defect accompanied by the vibration frequency change in the same way as the aforementioned amplitude change. In this case, the signal processing unit has a function to identify a defect according to the change in the beat wave frequency.

More specifically, in the example of FIG. 46, the signal processing unit 60 includes a vibration cycle (periodicity) calculator for calculating a vibration cycle of the object to be measured, according to the beat wave output from the beat wave output unit; and a drive cycle comparator for comparing the drive current cycle of the ultrasonic oscillator with the vibration cycle of the object to be measured so that the comparison result can decide whether the vibration of the object to be measured is normal. The drive current cycle is input from the ultrasonic oscillator drive block 61 in FIG. 46.

Figure 51:
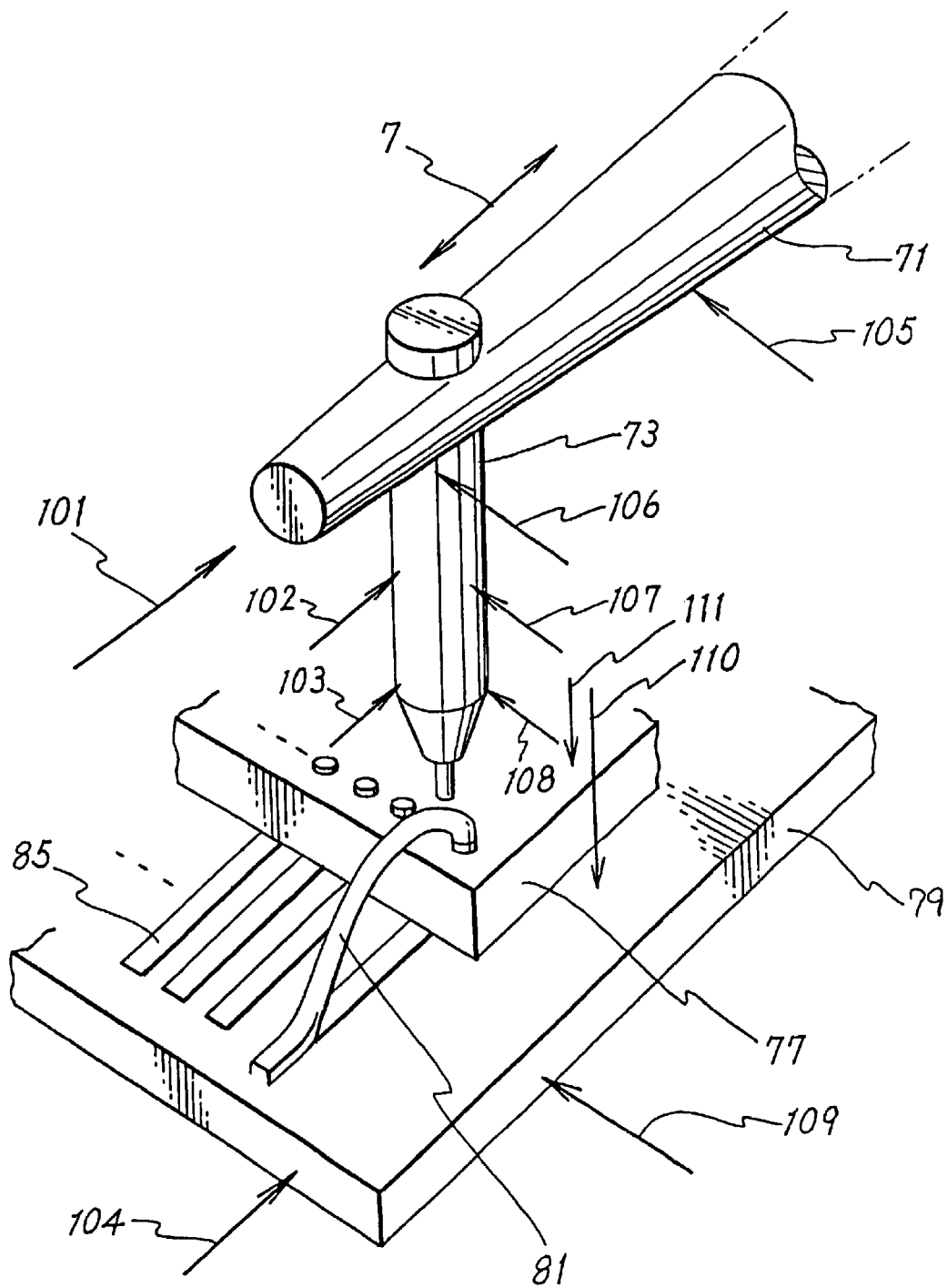
FIG. 51 is a perspective view of the wire bonding apparatus during operation with measurement points and laser beam directions for multi-point simultaneous inspection.

FIG. 51 shows an example of measurement points when performing multi-point simultaneous measurement for the various measurement points explained with reference to FIG. 43 to FIG. 45. By measuring the capillary vibration together with the IC chip and the substrate, it is possible to increase the defect detection accuracy. More specifically, the measurement system includes: capillary laser resonators for applying laser beams to the capillary 71 (in the directions of 101, 102, 103, 106, 107, 108) and receiving return beams; horn laser resonators for applying laser beams to the horn 71 (in the directions of 105 and 106) and receiving a return beam from the horn; and work laser resonators for applying laser beams to a junction (for example, a work having a silicon chip 77 and a substrate 79)(in the directions of 104, 109, 110, and 111).

By using a plurality of laser heads, it is possible to identify a capillary movement in two and three dimensions. Simultaneously with this, the horn vibration can be measured in two or three dimensions. Furthermore, by measuring the vibrations of the IC chip and substrate, it is possible to increase the bonding inspection accuracy. For example, in the measurements indicated by 102 and 103, if the S-shaped beat waves different amplitudes or cycles, it can be decided that this is caused by a defective attachment of the capillary, generating a vibration as indicated by an alternate long and two short dashes line 75. Moreover, the fine vibration of the work 88 can be checked from the directions indicated by 104, 110, and 109. If any chopping wave is detected, it can is decided that the wire is defective or the additive 85 shown in FIG. 48 is defective. Furthermore, if a measurement is performed by applying a laser beam from the top to the bottom of the capillary, it is possible to detect a defective gold ball.

This Example can perform sensing vibrations of the horn and capillary of the wire bonding apparatus even during its continuous operation. This Example can accumulate, process, and utilize a waveform data concerning the amplitude frequency, frequency amplitude, and phase of the horn and capillary of the wire bonding apparatus. Moreover, the vibration of not only the capillary but also the IC chip and substrate can also be used for increasing the defect inspection accuracy.

Furthermore, by utilizing the voltage or the like applied to the ultrasonic oscillator, as a reference waveform, it is possible to compare at real time a current waveform in frequency and phase with the reference waveform. This enables a defect identification at a high speed with a simple processing. Moreover, the reference data for inspection can be selected according to the necessary accuracy and response speed, and the memory capacity. By simultaneously using a plurality of laser heads of small size and small weight, it is possible to observe vibrations of the horn and capillary in two or three dimension.

As has been described above, in this Example, the junction failure inspection system for a bonding apparatus follows the movement of the horn and capillary and applies a laser beam to a measurement point, so that the return beam is mixed with the outgoing beams in the laser resonator, generating a beat wave. According to this beat wave, the signal processing unit identifies a vibration defect, if any. For example, the beat wave amplitude from a correct junction is compared to a current amplitude to detect a vibration defect of the object to be measured. Especially in a case of capillary mounting defect or work junction failure, a vibration different from the normal state is obtained. By detecting the abnormal vibration of the wire bonding apparatus, the bonding junction defect can be inspected. Moreover, in the present invention, a beat wave is generated in the laser resonator and accordingly, of small size and small weight. The present invention enables to detect at real time whether junction is actually made.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed:

1. A vibration displacement calculation method for calculating a vibration displacement of an object, using a laser beam Doppler effect, said method comprising:

applying an oscillated laser beam to said object;

mixing a reflected laser beam with said oscillated laser beam to generate a beat wave signal;

calculating a ratio of a predetermined reference amplitude to an amplitude of said beat wave signal at a displacement reversal point of said object; and calculating a displacement of said object at said displacement reversal point, according to said ratio and a wavelength of said oscillated laser beam.

2. A vibration displacement calculation method as claimed in claim 1, wherein said beat wave signal comprises a chopping wave, and wherein said reference amplitude comprises one of a chopping wave amplitude and one-half of a chopping wave amplitude.

3. A vibration displacement calculation method as claimed in claim 1, further comprising:

calculating said reference amplitude according to an amplitude of a chopping wave in said beat wave signal, said calculating of said reference amplitude comprising:

calculating a ratio of an ascending time of said chopping wave from a bottom to a top, to a descending time of said chopping wave from a top to a bottom; and correcting a beat wave signal amplitude of a shorter one of said ascending time and said descending time, with an inclination of a longer one of said ascending time and said descending time, wherein a corrected beat wave signal amplitude represents a reference amplitude corresponding to a displacement corresponding to one half of a wavelength of said oscillated laser beam.

4. A vibration displacement calculation method as claimed in claim 1, further comprising:

calculating a displacement amount for an interval between displacement reversal point and a next displacement reversal point, according to a number of chopping waves in said beat wave signal.

5. A vibration displacement calculation method as claimed in claim 1, further comprising:

calculating a ratio of said predetermined amplitude to an amplitude of an S-shaped beat wave signal which is devoid of both a chopping wave and one-half of a chopping wave.

6. A vibration displacement calculation apparatus comprising:

a light detection unit for applying a laser beam to an object and detecting a reflected laser beam;

a beat wave detection unit for analyzing a wave signal output from said light detection unit and detecting a beat wave signal;

an S-shaped state identification unit for identifying an S-shaped waveform in said beat wave signal generated at a displacement reversal point of said object, said displacement reversal point representing a point at which a displacement direction is reversed;

a ratio calculation unit for calculating a ratio of an amplitude of said S-shaped waveform, to a predetermined reference amplitude; and a displacement calculation unit for calculating a displacement of said object, corresponding to said S-shaped waveform, according to said ratio and a wavelength of said laser beam.

7. A vibration displacement calculation apparatus as claimed in claim 6, further comprising:

a reference amplitude setting unit for setting said reference amplitude according to an amplitude of a chopping wave generated when said object has moved by $\lambda/2$, wherein $\lambda$ represents a wavelength of said laser beam.

8. A vibration displacement calculation apparatus as claimed in claim 7, wherein said reference amplitude setting unit comprises:

a ratio calculating unit for calculating a ratio of ascending time from a bottom to a top of a chopping wave, to a descending time from a top to a bottom of a chopping wave;

an amplitude correction unit for correcting an amplitude of said beat wave for a shorter of said ascending time and said descending time with a waveform inclination of a longer of said ascending time or said descending time; and a reference amplitude setting unit for setting a corrected amplitude as said reference amplitude for a displacement which is one half of a wavelength of said laser beam.

9. A vibration displacement calculation apparatus comprising:

means for outputting a beat wave signal resulting from a self-mixing of an oscillated laser beam directed to an object and a laser beam reflected from said;

means for calculating a ratio of an amplitude of an S-shaped waveform in said beat wave signal corresponding to a displacement reversal point of said object to a predetermined reference amplitude; and mean s for calculating a displacement of said object, according to a number of chopping waves in said beat wave signal and said ratio.

10. A program product for calculating a displacement of an object, using a vibration displacement calculation apparatus, said apparatus comprising:

a light detection unit for detecting a laser beam reflected from said object;

a beat wave detection unit for analyzing a waveform signal output from said light detection unit and detecting a beat wave signal; and a calculation unit for processing said beat wave signal, wherein said calculation unit calculates a ratio of an amplitude of a waveform at a displacement reversal point of said object to a predetermined reference amplitude, and calculates a displacement amount of said displacement reversal point of said object according to said ratio and a wavelength of said laser beam.

11. A vibration measurement method comprising:

applying an oscillated laser beam from a laser-resonator to an object, a vibration of which is to be measured;

receiving a laser beam reflected by said object;

converting into an electric signal, a self-mixed laser beam comprising a reflected laser beam and said oscillated laser beam, to generate a beat wave signal;

analyzing a frequency of s aid beat wave signal;

extracting a frequency appearing as a peak from said beat wave signal frequencies, as a basic vibration frequency of said object.

12. A vibration measurement method as claimed in claim 11, further comprising:

calculating as a value representing a feature of said object, a ratio of a basic vibration frequency, to a peak of a frequency of a higher harmonic component of said basic vibration frequency.

13. A vibration measurement method as claimed in claim 11, further comprising:

identifying a maximum frequency among frequencies extracted as peaks, as a Doppler frequency of a highest displacement speed of a object to be measured.

14. A vibration measurement method as claimed in claim 13, further comprising:

calculating a vibration speed or acceleration of said object according to a Doppler frequency at a highest displacement speed of said object.

15. A vibration measurement method as claimed in claim 11, further comprising:

using a filter to pass only a predetermined frequency band component of said beat wave signal;

dividing a filtered beat wave signal into predetermined intervals for frequency analysis; and analyzing a frequency of said beat wave signal for each of said intervals.

16. A vibration displacement calculation apparatus comprising:

a light detection unit for applying a laser beam to an object and detecting a reflected laser beam;

a beat wave detection unit for analyzing a waveform signal from said light detection unit and detecting a beat wave signal;

a filter for passing only a predetermined frequency band component of said beat wave signal;

a frequency analysis unit for performing a frequency analysis on said component of said beat wave signal which has passed through said filter; and a vibration analysis unit for identifying as a basic vibration frequency of said object, a lowest peak frequency among peaks of a frequency spectrum output from said frequency analysis unit.

17. A program for using a vibration measurement apparatus to calculate a displacement of an object, said vibration measurement apparatus comprising:

a light detection unit for applying a laser beam to said object and detecting a laser beam reflected;

a beat wave detection unit for analyzing a waveform signal from said light detection unit and detecting a beat wave signal; and a calculation unit for signal processing of a detected beat wave signal, wherein said calculation unit analyzes a frequency of said beat wave signal, extracts peak frequencies from beat wave signal frequencies, and identifies a lowest frequency of said peak frequencies extracted, as a basic vibration frequency of said object.

18. A vibration measurement method comprising:

applying a laser beam oscillated in a laser resonator to an object;

detecting a reflected laser beam;

converting into an electric signal, a self-mixed laser beam comprising said reflected laser beam and said laser beam oscillated in said laser resonator, and outputting a beat wave signal;

using a filter to pass only a predetermined frequency band component of said beat wave signal; and converting frequency changes of said beat wave signal which has passed through said filter, into a signal intensity;

wherein an amplitude change of a converted signal waveform corresponds to a speed change in a half cycle of a vibration of said object.

19. A vibration measurement method as claimed in claim 16, further comprising:

converting two cycles of a beat wave signal waveform into a single cycle so as to generate a vibration waveform; and calculating a vibration state of said object, according to said vibration waveform.

20. A vibration displacement calculation apparatus comprising:

a light detection unit for applying a laser beam to an object and detecting a laser beam reflected by said object;

a beat wave detection unit for analyzing a waveform signal output from said light detection unit and detecting a beat wave signal;

a filter for passing only a predetermined frequency band component of said beat wave signal; and a conversion unit for converting frequency changes of said beat wave signal which has passed through said filter, into a signal intensity, wherein an amplitude change of a converted signal waveform corresponds to a speed change in a half cycle of a vibration of said object.

21. A vibration displacement calculation apparatus comprising:

means for applying a laser beam to an object and detecting a laser beam reflected by said object;

means for analyzing a waveform signal and detecting a beat wave signal;

means for passing only a predetermined frequency band component of said beat wave signal; and means for converting frequency changes of said beat wave signal into a signal intensity, so as to output a speed change signal.

22. A program product for using a vibration measurement apparatus to calculate a displacement of an object, said vibration measurement apparatus comprising:

a light detection unit for applying a laser beam to an object and detecting a laser beam reflected by said object;

a beat wave detection unit for analyzing a waveform signal from said light detection unit and detecting a beat wave signal;

a calculation unit for signal processing of a detected beat wave signal, wherein said calculation unit passes only a predetermined frequency band component of said beat wave signal, converts frequency changes of said beat wave signal into a signal intensity and wherein a converted signal waveform corresponds to a half cycle speed change of a vibrating object.

23. A vibration measurement method comprising:

applying a laser beam oscillated in a laser resonator, to an object;

detecting a laser beam reflected by said object;

converting into an electric signal, a self-mixture of a reflected laser beam and said laser beam oscillated in said resonator, and outputting a beat wave signal; and extracting a chopping wave from said beat wave signal, wherein if any chopping wave is extracted, an amplitude of said object in an extraction range is equal to or greater than half of a wavelength of said laser beam oscillated in said resonator; and wherein if no chopping wave is extracted, an amplitude of said object in an extraction range is smaller than half of a wavelength of said laser beam applied to said object.

24. A vibration measurement method as claimed in claim 23, wherein said extracting a chopping wave comprises:

identifying a turning point of said beat wave signal;

detecting an extreme of the said beat wave signal;

confirming whether any chopping wave is present according to a number of extremes contained in an interval from a displacement reversal point to a next displacement reversal point.

25. A vibration measurement method as claimed in claim 23, wherein said extracting a chopping wave comprises:

detecting extremes of said beat wave signal and counting a number of said extremes;

extracting symmetric waveform extremes which are symmetric with respect to an extreme, and counting a number of symmetric waveform extremes; and confirming a presence or absence of a chopping wave in said beat wave signal.

26. A vibration measurement method comprising:

applying a laser beam oscillated in a laser resonator, to an object;

detecting a laser beam reflected by said object;

converting into an electric signal, a self-mixture of said laser beam reflected and said laser beam oscillated in said resonator, and outputting a beat wave signal;

identifying a displacement reversal point of said object, according to said beat wave signal; and detecting an extreme value of said beat wave signal, wherein said beat wave signal is in an S-shaped state representing a vibration of said object if a number of extremes contained in a displacement period comprising an interval from a displacement reversal point to a next displacement reversal point, is equal to or smaller than 1.

27. A vibration measurement method as claimed in claim 26, wherein a beat wave signal is in a first M-shaped state having a chopping wave if a number of extremes in said displacement period exceeds 2, and wherein a beat wave signal is in a second M-shaped state where a portion of a chopping wave is mirror-symmetric if a number of extremes in said displacement period is at least 1 and no greater than 2.

28. A vibration measurement method comprising:

applying a laser beam oscillated in a laser resonator, to an object;

detecting a laser beam reflected by said object;

converting into an electronic signal, a self-mixture of said laser beam reflected by said object and said laser beam oscillated in said resonator, and outputting a beat wave signal;

detecting extremes of said beat wave signal;

detecting in said beat wave signal a symmetric waveform extreme preceded and followed by a waveform of symmetric inclinations; and comparing a number of symmetric waveform extremes to a total number of extremes, wherein if said total number of extremes is greater than a predetermined ratio, said beat wave signal is in a first M-shaped state having chopping waves.

29. A vibration measurement method as claimed in claim 28, wherein said beat wave signal is in an S-shaped state representing a vibration of said object if a number of symmetric waveform extremes is approximately equal to said total number of extremes, and wherein said beat wave signal is in a second M-shaped state having a mirror-symmetric chopping wave, if a number of symmetric waveform extremes is not approximately equal to said total number of extremes.

30. A vibration measurement apparatus comprising:

means for detecting a laser beam reflected by an object;

means for analyzing a waveform signal formed by mixing an oscillated laser beam and said laser beam reflected by said object, and detecting a beat wave signal;

means for identifying a waveform state of said beat wave signal; and means for calculating a displacement amount of said object, according to said waveform state, wherein said means for calculating a displacement amount of said object calculates a ratio of an amplitude of a waveform at a displacement reversal point of said object to a predetermined reference amplitude, and calculates a displacement amount of said displacement reversal point of said object according to said ratio and a wavelength of said laser beam.

31. A vibration measurement method comprising:

applying a laser beam oscillated in a laser resonator, to an object;

detecting a laser beam reflected by said object;

converting into an electric signal the self-mixture of said laser beam reflected by said object and said laser beam oscillated in said resonator and outputting a beat wave signal;

analyzing a frequency of said beat wave signal;

identifying a distribution of peak frequencies in said beat wave signal to determine whether a chopping wave is present in said beat wave signal, wherein if a chopping wave is present, an amplitude of vibration of said object is equal to or greater than one-half of a wavelength of said oscillated laser beam, and wherein if no chopping wave is present, an amplitude of vibration of said object is shorter than one-half of a wavelength of said oscillated laser beam.

32. An inspection method for checking whether an object has a defect, said method comprising:
- applying a plurality of laser beams oscillated by a laser resonator, to a plurality of measurement points on said object;
- detecting laser beams reflected from said measurement points of said object;
- self-mixing said oscillated laser beams and said reflected laser beams;
- converting self-mixed laser beams into an electric signal so as to output a beat wave signal;
- identifying a waveform state of said beat wave signal to determine whether a vibration of said object is normal.

33. An inspection method as claimed in claim 32, further comprising:
- setting a beam application direction to a center of a curvature if a measurement point is on a curvature of said object.

34. An inspection method as claimed in claim 32, further comprising:
- setting a laser application position at a reflection changing measurement point where vibration of said object changes reflection angle, and a laser beam is reflected or not reflected;
- identifying a vibration cycle of said object, according to an extreme in said beat wave signal based on a laser beam reflected from said reflection changing measurement point to determine whether said vibration of said object is normal.

35. An inspection method as claimed in claim 32, said method further comprising:
- setting a laser application position at a moving measurement point moving according to a vibration of said object; and
- increasing a laser beam spot greater than a reference laser beam spot.

36. An inspection method as claimed in claim 32, further comprising:
- setting a laser beam application direction at a predetermined angle with respect to a vibration direction of said object.

37. An inspection method as claimed in claim 32, further comprising:
- calculating a vibration frequency of said object, according to said beat wave signal;
- comparing a calculated vibration frequency with a drive frequency of a drive means vibrating said object,
- wherein a defect exists if said vibration frequency does not match said drive frequency.

38. A junction inspection system for inspecting a junction between a wire and objects to be connected to one another by said wire, said system comprising:
- a wire bonding apparatus comprising:
  - an ultrasonic oscillator for generating an ultrasonic oscillation;
  - a horn for transmitting said ultrasonic oscillation to said objects; and
  - a capillary attached to a tip end of said horn, for applying a weight to said wire in contact with said objects;
- a laser resonator applying a laser beam to one of said capillary and said horn and detecting a laser beam reflected from an object to which a laser beam is applied;
- a photo-detector for detecting a self-mixed laser beam generated in said laser resonator;
- a beat wave output unit for detecting a beat wave signal from a signal output from the photo-detector; and
- a signal processing unit for determining whether a vibration of said object to which said laser beam is applied is normal, according to said beat wave signal.

39. A junction inspection system as claimed in claim 38, wherein said signal processing unit determines whether said vibration of said object is normal, according to an amplitude change of said beat wave signal.

40. A junction inspection system as claimed in claim 38, wherein said signal processing unit comprises:
- a reference beat wave storage device for storing as a reference beat wave signal, a beat wave signal obtained during a normal vibration of said object; and
- a vibration inspector for comparing said reference beat wave signal to a beat wave signal output from said beat wave output unit to determine whether a vibration of said object is normal.

41. A junction inspection system as claimed in claim 38, wherein said signal processing unit determines whether a vibration of said object is normal, according to a frequency change of said beat wave signal.

42. A junction inspection system as claimed in claim 41, wherein said signal processing unit comprises:
- a vibration cycle calculator for calculating a vibration cycle of said object according to a beat wave signal output from said beat wave output unit; and
- a drive cycle comparator for comparing an ultrasonic oscillator drive current cycle with said vibration cycle of said object to determine whether a vibration of said object is normal.

43. A junction inspection system for inspecting a junction between a wire and objects to be connected to one another by said wire, said system comprising:
- a wire bonding apparatus comprising:
  - an ultrasonic oscillator for generating an ultrasonic oscillation;
  - a horn for transmitting said ultrasonic oscillation to said objects to be connected; and
  - a capillary attached to a tip end of said horn, for applying a weight to said wire in contact with said objects to be connected;
- a capillary laser resonator for applying a laser beam to said capillary and detecting a laser beam reflected from said capillary;
- a laser beam application unit comprising a horn laser resonator for applying a laser beam to said horn and detecting a laser beam reflected from said horn, and a work laser resonator for applying a laser beam to said objects to be connected;
- a photo-detector for detecting a self-mixed laser beam generated in respective laser oscillators of said laser beam application unit;
- a beat wave output unit for detecting a beat wave signal from a signal output from said photo-detector; and
- a vibration defect detection unit for determining whether vibrations of said objects to be connected are normal, according to beat wave signals output from the beat wave output unit.

* * * * *